US009865594B2

(12) United States Patent
Siew et al.

(10) Patent No.: US 9,865,594 B2
(45) Date of Patent: Jan. 9, 2018

(54) SEMICONDUCTOR DEVICES

(71) Applicant: Samsung Electronics Co., Ltd., Suwon-si, Gyeonggi-do (KR)

(72) Inventors: Yong-Kong Siew, Suwon-si (KR); Sang-Hoon Ahn, Goyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/015,296

(22) Filed: Feb. 4, 2016

(65) Prior Publication Data
US 2016/0372415 A1 Dec. 22, 2016

(30) Foreign Application Priority Data
Jun. 16, 2015 (KR) .................. 10-2015-0084755

(51) Int. Cl.
| | |
|---|---|
| *H01L 29/40* | (2006.01) |
| *H01L 21/20* | (2006.01) |
| *H01L 27/088* | (2006.01) |
| *H01L 21/762* | (2006.01) |
| *H01L 23/482* | (2006.01) |
| *H01L 23/522* | (2006.01) |
| *H01L 23/532* | (2006.01) |

(52) U.S. Cl.
CPC .... *H01L 27/0886* (2013.01); *H01L 21/76264* (2013.01); *H01L 21/76289* (2013.01); *H01L 23/4821* (2013.01); *H01L 23/5222* (2013.01); *H01L 23/53295* (2013.01); *H01L 23/5329* (2013.01); *H01L 23/53223* (2013.01); *H01L 23/53238* (2013.01); *H01L 23/53266* (2013.01)

(58) Field of Classification Search
CPC ................................. H01L 21/76264
USPC ........ 257/751, 762, 774; 438/422, 653, 672, 438/687
See application file for complete search history.

(56) References Cited

U.S. PATENT DOCUMENTS

| | | | |
|---|---|---|---|
| 6,035,530 A | 3/2000 | Hong | |
| 6,207,556 B1 | 3/2001 | Hsu | |
| 6,380,578 B1 | 4/2002 | Kunikiyo | |
| 7,553,756 B2 | 6/2009 | Hayashi et al. | |
| 7,649,239 B2 | 1/2010 | Hussein et al. | |
| 7,772,706 B2 | 8/2010 | Balakrishnan et al. | |
| 7,790,601 B1 * | 9/2010 | Choi ................. | H01L 21/31144 257/E21.587 |
| 7,842,600 B2 | 11/2010 | Yun et al. | |
| 8,304,906 B2 | 11/2012 | Huang et al. | |
| 8,796,854 B2 | 8/2014 | Yang et al. | |
| 9,368,418 B2 * | 6/2016 | Ishizaka ............. | H01L 23/00 |
| 2008/0311739 A1 | 12/2008 | Besling et al. | |

(Continued)

FOREIGN PATENT DOCUMENTS

| | | |
|---|---|---|
| JP | 2001-068647 A | 3/2001 |
| JP | 5501596 B2 | 5/2014 |

(Continued)

*Primary Examiner* — Calvin Lee
(74) *Attorney, Agent, or Firm* — Harness, Dickey & Pierce, P.L.C.

(57) ABSTRACT

A semiconductor device may include a plurality of wiring structures spaced apart from each other, a protection pattern including a metal nitride on each of the wiring structures, a spacer on a sidewall of the protection pattern, and an insulating interlayer structure containing the wiring structures and having an air gap between the wiring structures.

20 Claims, 51 Drawing Sheets

(56) References Cited

U.S. PATENT DOCUMENTS

| | | |
|---|---|---|
| 2009/0093112 A1 | 4/2009 | Al-Bayati et al. |
| 2009/0298282 A1 | 12/2009 | Yun et al. |
| 2010/0007021 A1* | 1/2010 | Choo ................ H01L 21/76807 257/751 |
| 2014/0008804 A1 | 1/2014 | Purayath et al. |

FOREIGN PATENT DOCUMENTS

| | | |
|---|---|---|
| KR | 2008-0030292 A | 4/2008 |
| KR | 101382564 B1 | 4/2014 |

* cited by examiner

FIG. 26
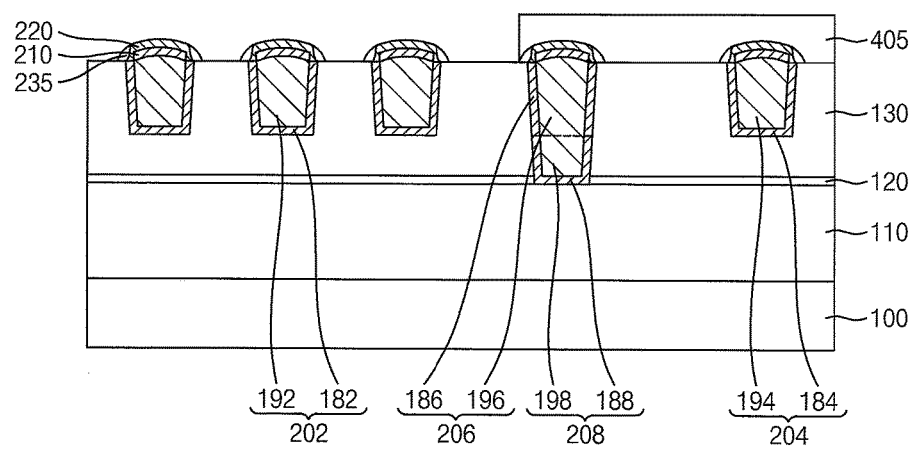
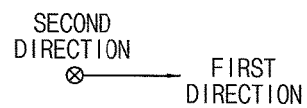

FIG. 47
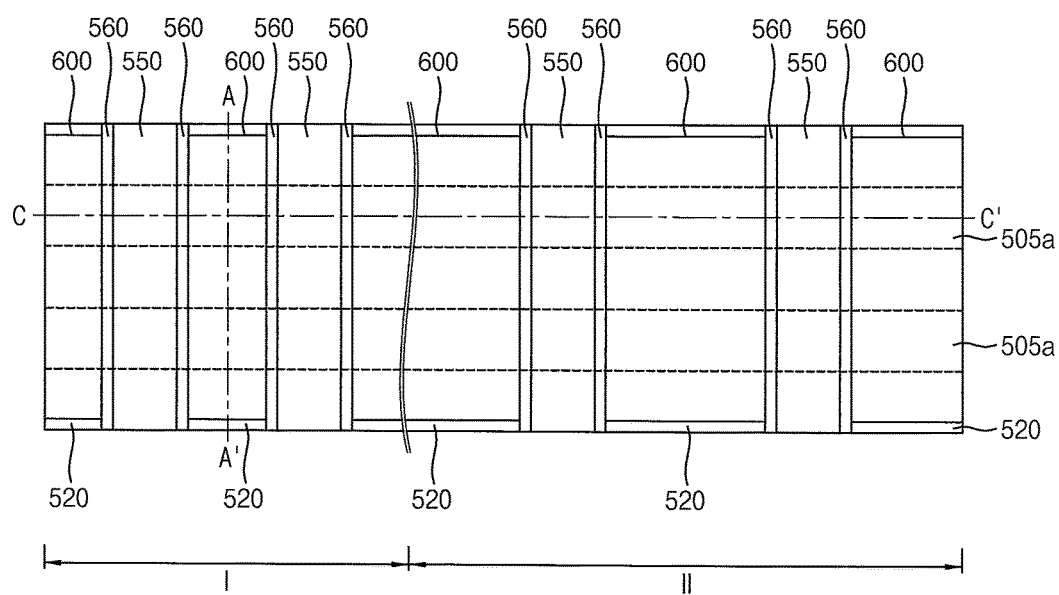
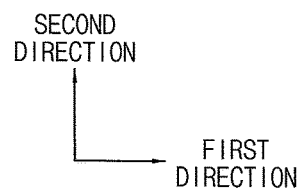

FIG. 56
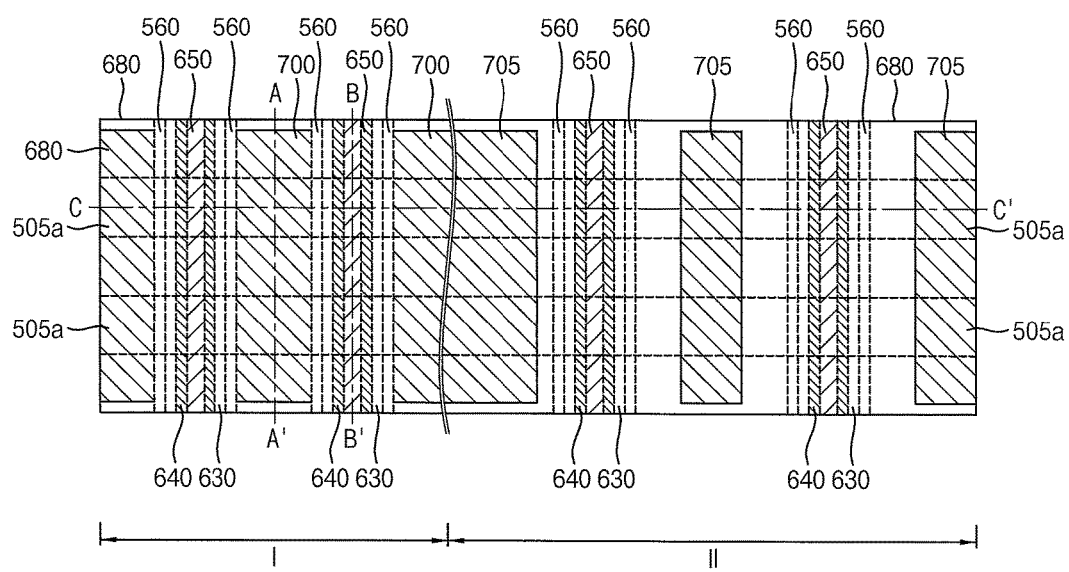
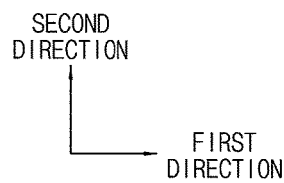

SEMICONDUCTOR DEVICES

CROSS-REFERENCE TO RELATED APPLICATION

This application claims priority under 35 USC §119 to Korean Patent Application No. 10-2015-0084755, filed on Jun. 16, 2015 in the Korean Intellectual Property Office (KIPO), the contents of which are herein incorporated by reference in their entirety.

BACKGROUND

1. Field

Example embodiments relate to semiconductor devices. More particularly, example embodiments relate to semiconductor devices having wiring structures.

2. Description of the Related Art

In order to reduce or prevent RC-delay and cross-talk, an air gap may be formed between wiring structures. When the air gap is formed by an etching process, an upper edge portion of the wiring structure may be removed. After forming the air gap, when a via hole for forming a landing via is formed to expose the wiring structure, the via hole may be in communication with the air gap due the mis-alignment.

SUMMARY

Some example embodiments provide a semiconductor device having good reliability.

According to some example embodiments, there is provided a semiconductor device. The semiconductor device may include a plurality of wiring structures spaced apart from each other, a protection pattern including a metal nitride on each of the wiring structures, a spacer on a sidewall of the protection pattern, and an insulating interlayer structure containing the wiring structures and having an air gap between the wiring structures.

In some example embodiments, the semiconductor device may further include a capping pattern on upper surfaces of each of the wiring structures. The capping pattern may prevent electromigration of a metal in each of the wiring structures. The protection pattern may cover an upper surface and a sidewall of the capping pattern.

In some example embodiments, the capping pattern may include cobalt (Co), ruthenium (Ru), tungsten (W) or cobalt tungsten phosphorus (CoWP).

In some example embodiments, each of the wiring structures may include a metal pattern and a conductive barrier pattern covering a bottom and a sidewall of the metal pattern. The capping pattern may be formed on an upper surface of the metal pattern.

In some example embodiments, the upper surface of the metal pattern and a top surface of the conductive barrier pattern may be substantially coplanar with each other, and the protection pattern may cover the top surface of the conductive barrier pattern.

In some example embodiments, a bottom of the spacer may be substantially coplanar with a bottom of the protection pattern.

In some example embodiments, the protection pattern may include aluminum nitride or nitride of a noble metal.

In some example embodiments, the spacer may include silicon nitride.

In some example embodiments, the semiconductor device may further include an insulating barrier layer covering an upper surface of the protection pattern and the spacer and surrounding sidewalls of the wiring structures.

In some example embodiments, the insulating barrier layer may define a bottom and a sidewall of the air gap.

In some example embodiments, the insulating barrier layer may silicon nitride, silicon carbonitride, silicon carboxide, or silicon oxycarbonitride.

In some example embodiments, the spacer may include silicon carbonitride, silicon carboxide, or silicon oxycarbonitride.

In some example embodiments, the insulating interlayer structure may include first and second insulating interlayers sequentially stacked, and the insulating barrier layer may be formed between the first and second insulating interlayers.

In some example embodiments, the first insulating interlayer may cover at least a sidewall of each of the wiring structures.

According to some example embodiments, there is provided a semiconductor device. The semiconductor device may include a plurality of lower wiring structures, a lower insulating interlayer structure, a protection pattern, a spacer and a landing via. The plurality of lower wiring structures may be formed on a substrate. The lower insulating interlayer structure may contain the lower wiring structures, and may have an air gap between the lower wiring structures. The protection pattern may be formed on each of the lower wiring structures, and may include a metal nitride. The spacer may be formed on a sidewall of the protection pattern. The landing via may be formed through a portion of the lower insulating interlayer structure, and may be electrically connected to a first lower wiring structure of the plurality of lower wiring structures. The landing via may penetrate through the protection pattern on the first lower wiring structure, and may contact an upper surface of the first lower wiring structure.

In some example embodiments, the landing via may contact the spacer adjacent the first lower wiring structure.

In some example embodiments, semiconductor device may further include a capping pattern on an upper surface of each of the lower wiring structures. The capping pattern may prevent electromigration of a metal in each of the lower wiring structures. The protection pattern may cover an upper surface and a sidewall of the capping pattern. The landing via may penetrate through the capping pattern on the first lower wiring structure.

In some example embodiments, the semiconductor device may further include an upper insulation layer on the lower insulating interlayer structure, and an upper wiring in the upper insulation layer. The landing via may contact a bottom of the upper wiring.

In some example embodiments, the protection pattern may include aluminum nitride or nitride of a noble metal, and the spacer may include silicon nitride.

According to some example embodiments, there is provided a semiconductor device. The semiconductor device may include an active fin, a plurality of gate structures, a plurality of source/drain layers, a plurality of contact plugs, a plurality of wiring structures, a protection pattern, a spacer, and an insulating interlayer structure. The active fin may be defined by an isolation pattern on a substrate. The plurality of gate structures may be formed on the active fin, and may be spaced apart from each other. The plurality of source/drain layers may be formed on portions of the active fin adjacent the gate structures, respectively. The plurality of contact plugs may be formed on at least one of the source/drain layers. The plurality of wiring structures may be electrically connected to at least one of the plurality of contact plugs, and may be spaced apart from each other. The protection pattern may be formed on each of the wiring structures, and may include a metal nitride. The spacer may be formed on a sidewall of the protection pattern. The insulating interlayer structure may contain the wiring structures, and may have an air gap between the wiring structures.

In the semiconductor device in accordance with some example embodiments, the air gaps may be formed between the lower wirings, and thus the RC delay and/or cross-talk may be prevented in the lower wirings. The protection pattern may be formed on each of the lower wirings, and thus, when recesses for forming the air gaps are formed, the lower wirings and/or the capping pattern may be protected. Further, the spacer may be formed on the sidewall of the protection, and thus, when the via hole for forming the landing via is formed on the upper surface of the lower wiring, the portion of the insulating interlayer adjacent the lower wiring may not be etched, and the via hole may not be in communication with the air gap adjacent the insulating interlayer.

BRIEF DESCRIPTION OF THE DRAWINGS

Some example embodiments will be more clearly understood from the following detailed description taken in conjunction with the accompanying drawings.

FIGS. 1 to 3 are cross-sectional views illustrating a semiconductor device in accordance with some example embodiments;

FIGS. 25 to 28 are cross-sectional views illustrating stages of a method of manufacturing a semiconductor device in accordance with some example embodiments;

FIGS. 36 to 60 are plan views and cross-sectional views illustrating stages of a method of manufacturing a semiconductor device in accordance with some example embodiments.

DESCRIPTION OF EMBODIMENTS

Figure 1:
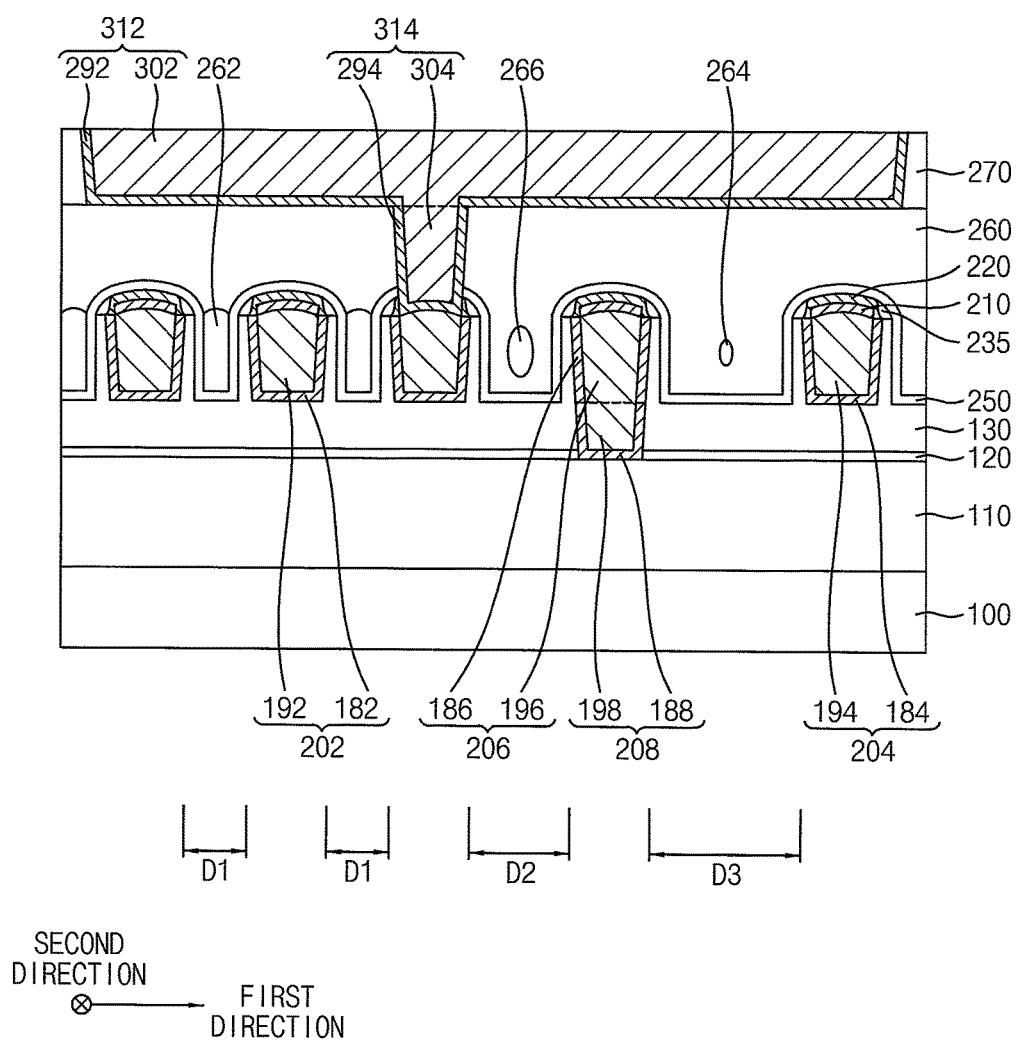
FIGS. 1 to 60 represent non-limiting, example embodiments as described herein.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
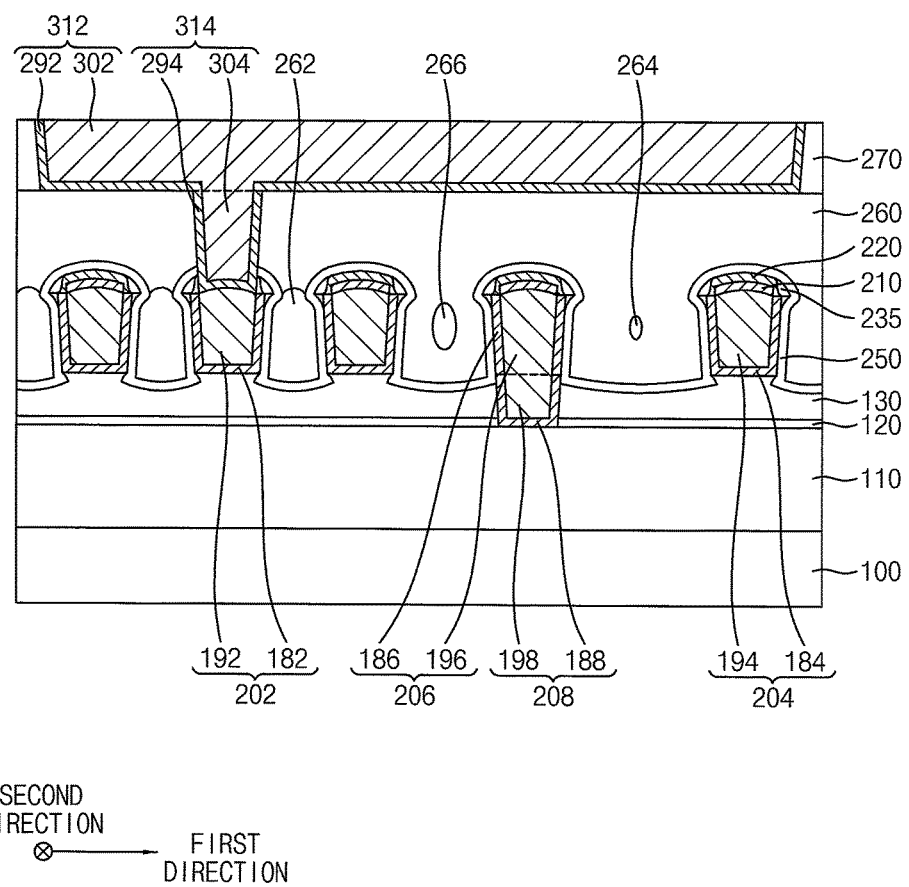
Figure 3:
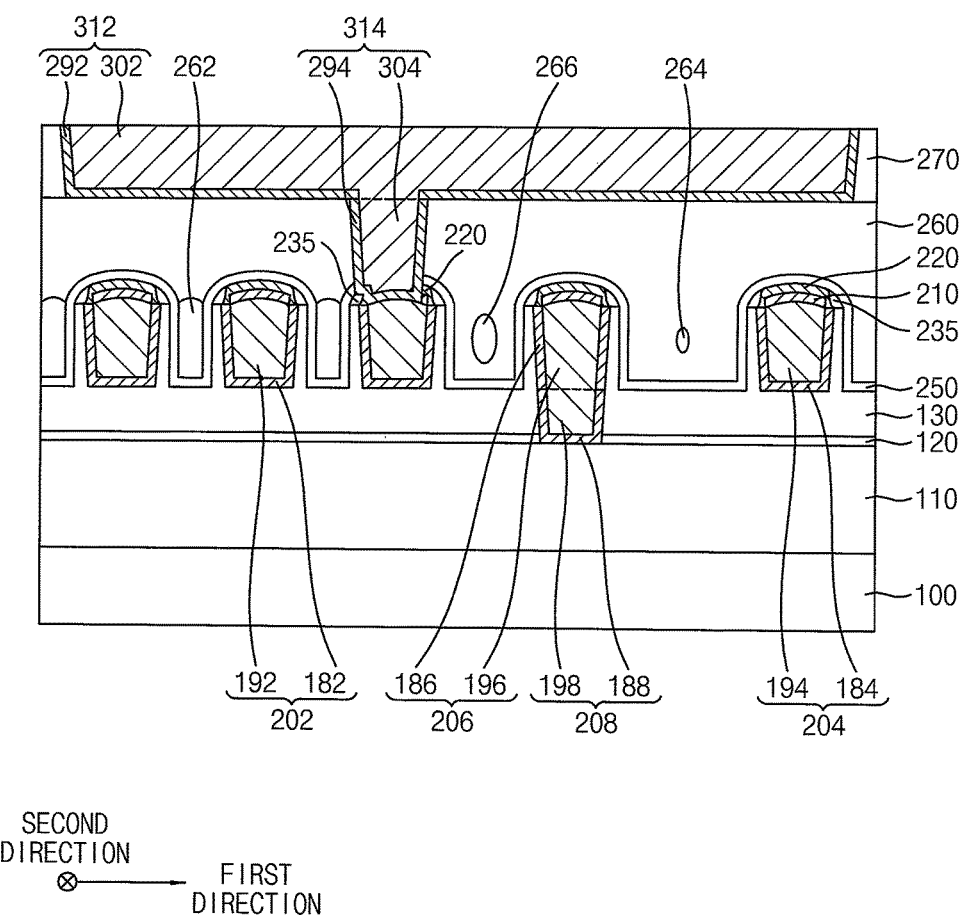

FIGS. 1 to 3 are cross-sectional views illustrating a semiconductor device in accordance with some example embodiments.

Referring to FIG. 1, the semiconductor device may include first, second and third lower wirings 202, 204 and 206, a lower via 208, a protection pattern 220, a spacer 235, and second and third insulating interlayers 130 and 260 on a substrate 100. The semiconductor device may further include a first insulating interlayer 110, an etch stop layer 120, a capping pattern 210, an insulating barrier layer 250, an upper wiring 312, an upper via 314, and a fourth insulating interlayer 270.

The substrate 100 may include a semiconductor material, e.g., silicon, germanium, silicon-germanium, or III-V semiconductor compounds, e.g., GaP, GaAs, GaSb, etc. In an example embodiment, the substrate 100 may be a silicon-on-insulator (SOI) substrate or a germanium-on-insulator (GOI) substrate.

Various types of elements, e.g., a gate structure, a gate spacer, a source/drain layer, a contact plug, etc. may be formed on the substrate 100, and may be covered by the first insulating interlayer 110.

The etch stop layer 120, and the second, third and fourth insulating interlayers 130, 260 and 270 may be sequentially stacked on the first insulating interlayer 110. In some cases, the etch stop layer 120 may not be formed.

The first insulating interlayer 110 may include an oxide, e.g., silicon oxide, the etch stop layer 120 may include a nitride, e.g., silicon nitride, and each of the second to fourth insulating interlayers 130, 260 and 270 may include a low-k dielectric material, e.g., silicon oxide doped with carbon (SiCOH) or silicon oxide doped with fluorine (F—SiO$_2$), a porous silicon oxide, spin on organic polymer, or an inorganic polymer, e.g., hydrogen silsesquioxane (HSSQ) methyl silsesquioxane (MSSQ), etc. The second to fourth insulating interlayers 130, 260 and 270 may include substantially the same material or different materials. The second and third insulating interlayers 130 and 260 may define a lower insulating interlayer structure.

The first to third lower wirings 202, 204 and 206 may penetrate through an upper portion of the second insulating interlayer 130. The lower via 208 may penetrate through a lower portion of the second insulating interlayer 130 and the etch stop layer 120, and may contact a top surface of the first insulating interlayer 110. The lower via 208 may be electrically connected to a contact plug (not shown) on the substrate 100. The lower via 208 and the third lower wiring 206 may be sequentially stacked and contact each other.

In some embodiments, a plurality of first lower wirings 202, a plurality of second lower wirings 204, and/or a plurality of third lower wirings 206 may be formed, and further, a plurality of lower vias 208 may be formed. The lower wirings 202 may be spaced apart from each other in a first direction substantially parallel to a top surface of the substrate 100 by a first distance D1, the first and third lower wirings 202 and 206 may be spaced apart from each other in the first direction by a second distance D2 greater than the first distance D1, and the second and third lower wirings 204 and 206 may be spaced apart from each other in the first direction by a third distance D3 greater than the second distance D2.

In an example embodiment, each of the first to third lower wirings 202, 204 and 206 may extend in a second direction that may be substantially parallel to the top surface of the substrate 100 and may cross the first direction. The lower via 208 may have a width in the first direction that may be substantially the same as a width of the third lower wiring 206 in the first direction, and may have a width in the second direction that may be smaller than a width of the third lower wiring 206 in the second direction. In some example embodiments, the first and second directions may cross each other at a right angle, i.e., may be substantially perpendicular to each other.

The first lower wiring 202 may include a first lower conductive barrier pattern 182 and a first lower metal pattern 192 sequentially stacked, the second lower wiring 204 may include a second lower conductive barrier pattern 184 and a second lower metal pattern 194 sequentially stacked, the third lower wiring 206 may include a third lower conductive barrier pattern 186 and a third lower metal pattern 196 sequentially stacked, and the lower via 208 may include a fourth lower conductive barrier pattern 188 and a fourth lower metal pattern 198 sequentially stacked. Each of the first, second and fourth lower conductive barrier patterns 182, 184 and 188 may cover a bottom and a sidewall of each of the first, second and fourth lower metal patterns 192, 194 and 196, and the third lower conductive barrier pattern 186 may cover a portion of a bottom and a sidewall of the third lower metal pattern 196. The third and fourth lower metal patterns 196 and 198 may contact each other, and the third and fourth lower conductive barrier patterns 186 and 188 may contact each other.

The first to fourth lower metal patterns 192, 194, 196 and 198 may include a metal, e.g., copper, aluminum, tungsten, etc., and the first to fourth lower conductive barrier patterns 182, 184, 186 and 188 may include a metal nitride, e.g., tantalum nitride, titanium nitride, etc., and/or a metal, e.g., tantalum, titanium, etc. In some example embodiments, the first to fourth lower metal patterns 192, 194, 196 and 198 may include substantially the same material, and the first to fourth lower conductive barrier patterns 182, 184, 186 and 188 may include substantially the same material.

In an example embodiment, each of the first to fourth lower metal patterns 192, 194, 196 and 198 may have an upper surface in which a central portion may be higher than an edge portion. Thus, the edge portions of the upper surfaces of the first to fourth lower metal patterns 192, 194, 196 and 198 may be substantially coplanar with a top surface of the second insulating interlayer 130, however, the central portions of the upper surfaces of the first to fourth lower metal patterns 192, 194, 196 and 198 may be higher than the top surface of the second insulating interlayer 130. Top surfaces of the first to third lower conductive barrier patterns 182, 184 and 186 may be substantially coplanar with the top surface of the second insulating interlayer 130.

However, the inventive concepts may not be limited thereto, and the first to third lower wirings 202, 204 and 206 may have various sizes, positions and distances from each other.

A liner (not shown) including a metal, e.g., cobalt, ruthenium, etc. may be further formed between each of the first to fourth lower conductive barrier patterns 182, 184, 186 and 188 and each of the first to fourth lower metal patterns 192, 194, 196 and 198.

The capping pattern 210 may be formed on an upper surface of each of the first to third lower wirings 202, 204 and 206. In some example embodiments, the capping pattern 210 may be formed on the upper surface of each of the first to third metal patterns 192, 194 and 196 in each of the first to third lower wirings 202, 204 and 206. The capping pattern 210 may include, e.g., cobalt (Co), ruthenium (Ru), tungsten (W), cobalt tungsten phosphorus (CoWP), etc.

The protection pattern 220 may cover an upper surface and a sidewall of the capping pattern 210 on each of the first to third lower metal patterns 192, 194 and 196, and may cover the top surface of each of the first to third lower conductive barrier patterns 182, 184 and 186. Thus, the protection pattern 220 may be formed on each of the first to third lower wirings 202, 204 and 206. For example, the protection pattern 220 may include aluminum nitride, or a nitride of a noble metal, e.g., gold, silver, platinum, etc.

The spacer 235 may be formed on a sidewall of the protection pattern 220 on the second insulating interlayer 130. Thus, the top surface of each of the first to third lower conductive barrier patterns 182, 184 and 186, which may be substantially coplanar with the top surface of the second insulating interlayer 130, may be substantially coplanar with a bottom of the spacer 235.

Even though the upper via 314 is formed to be mis-aligned with the first lower wiring 202, the spacer 235 may cover a portion of the second insulating interlayer 130 adjacent the first lower wiring 202 so as to prevent the portion of the second insulating interlayer 130 from being etched. The spacer 235 on the sidewall of the protection pattern 220 may have a thickness varying according to the mis-alignment margin of the upper via 314.

The spacer 235 may include a nitride, e.g., silicon nitride.

The insulating barrier layer 250 may cover the protection pattern 220 and the spacer 235, and may surround sidewalls of the first to third lower wirings 202, 204 and 206.

As shown in FIG. 1, a portion of the insulating barrier layer 250 surrounding a sidewall of each of the first to third lower wirings 202, 204 and 206 may have a given slope with respect to the top surface of the substrate 100, e.g., 90 degrees, and the second insulating interlayer 130 may be formed between the sidewall of each of the first to third lower wirings 202, 204 and 206 and the portion of the insulating barrier layer 250.

Alternatively, as shown in FIG. 2, the insulating barrier layer 250 may contact at least partially the sidewall of each of the first to third lower wirings 202, 204 and 206, and in this case, the second insulating interlayer 130 may partially contact the sidewall of each of the first to third lower wirings 202, 204 and 206.

FIG. 1 shows that a bottom of the insulating barrier layer 250 is substantially coplanar with a bottom of each of the first to third lower wirings 202, 204 and 206, however, the inventive concepts may not be limited thereto, and the bottom of the insulating barrier layer 250 may be higher or lower than the bottom of each of the first to third lower wirings 202, 204 and 206.

The insulating barrier layer 250 may include a nitride, e.g., silicon nitride, silicon carbonitride, silicon carboxide, silicon oxycarbonitride, etc. When the spacer 235 includes silicon nitride, the insulating barrier layer 250 may include a material different from that of the spacer 235, e.g., silicon carbonitride, silicon carboxide or silicon oxycarbonitride, and thus a given etching gas or etching solution may have an etching selectivity between the spacer 235 and the insulating barrier layer 250.

The third insulating interlayer 260 may be formed on the insulating barrier layer 250, and first, second and third air gaps 262, 264 and 266 may be formed between the third insulating interlayer 260 and the insulating barrier layer 250 or in the third insulating interlayer 260.

Particularly, between the first lower wirings 202 spaced apart from each other by a relatively small distance, the first air gap 262 having a relatively large size may be formed between the third insulating interlayer 260 and the insulating barrier layer 250. Between the second and third lower wirings 204 and 206 spaced apart from each other by a relatively large distance, the second air gap 264 having a relatively small size may be formed in the third insulating interlayer 260. Between the first and third lower wirings 202 and 206 spaced apart from each other by a middle distance, the third air gap 266 having a middle size may be formed in the third insulating interlayer 260.

Thus, a top of the first air gap 262 may be defined by the third insulating interlayer 260, and a sidewall and a bottom of the first air gap 262 may be defined by the insulating barrier layer 250. A boundary of each of the second and third air gaps 264 and 266 may be defined by the third insulating interlayer 260. In some cases, the second and third air gaps 264 and 266 may not be formed.

The top of the first air gap 262 may be higher than a top surface of the first lower wiring 202, and a bottom of each of the second and third air gaps 264 and 266 may be higher than bottoms of the first to third lower wirings 202, 204 and 206, however, the inventive concepts may not be limited thereto. That is, the first to third air gaps 262, 264 and 266 may have various shapes and sizes.

The upper wiring 312 may penetrate through the fourth insulating interlayer 270. The upper via 314 may penetrate through the third insulating interlayer 260, the insulating barrier layer 250, the protection pattern 220 and the capping pattern 210, and may contact the upper surface of the first lower metal pattern 192 of the first lower wiring 202. The upper via 314 and the upper wiring 312 may be sequentially stacked and contact each other. In an example embodiment, the upper wiring 312 may extend in the first direction, and the upper via 314 may have a width in the first direction smaller than a width of the upper wiring 312 in the first direction.

Referring to FIG. 3, the upper via 314 is mis-aligned with the first lower metal pattern 192.

However, in some example embodiments, the mis-aligned upper via 314 may contact the spacer 235 on the sidewall of the protection pattern 220, and may not contact a portion of the second insulating interlayer 130 adjacent the sidewall of the first lower wiring 202 under the spacer 235. Thus, even though the upper via 314 may be formed to be mis-aligned with the first lower metal pattern 192, the upper via 314 may not be in communication with the first air gap 262 adjacent the second insulating interlayer 130.

FIGS. 1 to 3 show that the upper via 314 serving as a landing via contacts the upper surface of the first lower wiring 202, however, the inventive concepts may not be limited thereto, and the upper via 314 may contact the upper surface of the second lower wiring 204 or the third lower wiring 206. In some example embodiments, a plurality of upper vias 314 may be formed.

The upper wiring 312 may include a first upper conductive barrier pattern 292 and a first upper metal pattern 302 sequentially stacked, and the upper via 314 may include a second upper conductive barrier pattern 294 and a second upper metal pattern 304 sequentially stacked. The first upper conductive barrier pattern 292 may cover a portion of a bottom and a sidewall of the first upper metal pattern 302, and the second upper conductive barrier pattern 294 may cover a bottom and a sidewall of the second upper metal pattern 304. The second and first upper conductive barrier patterns 294 and 292 may be sequentially stacked and contact each other.

The upper via 314 and the upper wiring 312 sequentially stacked may define an upper wiring structure. The upper via 314 may contact the upper surface of the first lower wiring 202, and thus may be referred to as a landing via.

The first and second upper metal patterns 302 and 304 may include a metal, e.g., copper, aluminum, tungsten, etc., and the first and second upper conductive barrier patterns 292 and 294 may include a metal nitride, e.g., tantalum nitride, titanium nitride, etc., and/or a metal, e.g., tantalum, titanium, etc.

In the semiconductor device, the air gaps 262, 264 and 266 may be formed between the lower wirings 202, 204 and 206, and thus the RC delay may be prevented in the lower wirings 202, 204 and 206. The protection pattern 220 may be formed on each of the lower wirings 202, 204 and 206, and thus, when second to fourth recesses 242, 244 and 246 (refer to FIGS. 18 and 19) for forming the air gaps 262, 264 and 266 are formed, the lower wirings 202, 204 and 206 and/or the capping pattern 210 may be protected. Further, the spacer 235 may be formed on the sidewall of the protection pattern 220, and thus, when the upper via 314 is formed on the upper surface of the first lower wiring 202, the portion of the second insulating interlayer 130 adjacent the first lower wiring 202 may not be etched, and the upper via 314 may not be in communication with the first air gap 262 adjacent the second insulating interlayer 130.

FIGS. 4 to 23 are cross-sectional views illustrating stages of a method of manufacturing a semiconductor device in accordance with some example embodiments. This method may be used for manufacturing the semiconductor device in FIGS. 1 to 3, however, may not be limited thereto. FIGS. 5, 7, 9 and 12 are cross-sectional views taken along lines L-L' of FIGS. 4, 6, 8 and 11, respectively.

Figure 4:
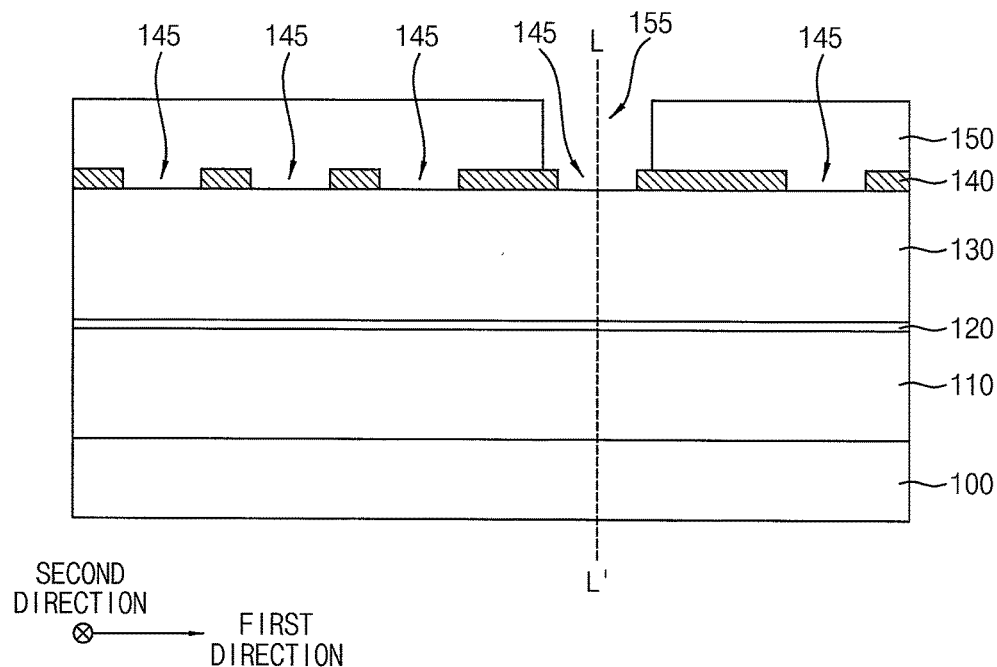
FIGS. 4 to 23 are cross-sectional views illustrating stages of a method of manufacturing a semiconductor device in accordance with some example embodiments.
Figure 5:
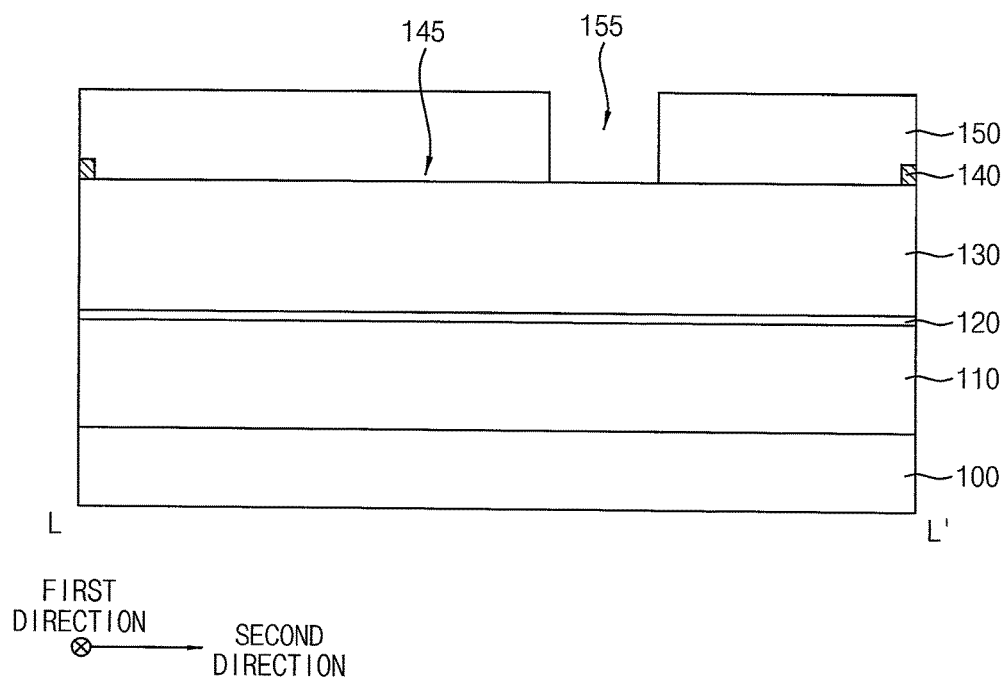

Referring to FIGS. 4 and 5, after sequentially forming a first insulating interlayer 110, an etch stop layer 120 and a second insulating interlayer 130 on a substrate 100, first and second masks 140 and 150 may be formed on the second insulating interlayer 130.

The substrate 100 may include a semiconductor material, e.g., silicon, germanium, silicon-germanium, or III-V semiconductor compounds, e.g., GaP, GaAs, GaSb, etc. In an example embodiment, the substrate 100 may be an SOI substrate or a GOI substrate.

Various types of elements, e.g., a gate structure, a gate spacer, a source/drain layer, a contact plug, etc. may be formed on the substrate 100, and may be covered by the first insulating interlayer 110.

The first insulating interlayer 110 may include an oxide, e.g., silicon oxide, the etch stop layer 120 may include a nitride, e.g., silicon nitride, and the second insulating interlayer 130 may include a low-k dielectric material, e.g., silicon oxide doped with carbon (SiCOH) or silicon oxide doped with fluorine (F—$SiO_2$), a porous silicon oxide, spin on organic polymer, or an inorganic polymer, e.g., hydrogen silsesquioxane (HSSQ), methyl silsesquioxane (MSSQ), etc. In some cases, the etch stop layer 120 may not be formed.

In some example embodiments, the first mask 140 may include a plurality of openings 145 spaced apart from each other in a first direction substantially parallel to a top surface of the substrate 100 each of which may extend in a second direction substantially parallel to a top surface of the substrate 100 and may cross the first direction. In some example embodiments, the first and second directions may cross each other at a right angle, i.e., may be substantially perpendicular to each other. The first mask 140 may include a metal nitride, e.g., titanium nitride, tantalum nitride, etc.

In some example embodiments, the second mask 150 may include a second opening 155 in communication with one of the plurality of first openings 145. In an example embodiment, the second opening 155 may have a width in the first direction greater than a width of the first opening 145 in communication with the second opening 155 in the first direction, and may have a width in the second direction smaller than a width of the first opening 145 in communication with the second opening 155 in the second direction. The second mask 150 may include, e.g., spin-on-hardmask (SOH).

The sizes or positions of the first and second openings 145 and 155 may not be limited to those shown in FIGS. 4 and 5, and may be varied according to the sizes or positions of first to third trenches 172, 174 and 176 and a first via hole 178 (refer to FIGS. 8 and 9) subsequently formed.

Figure 6:
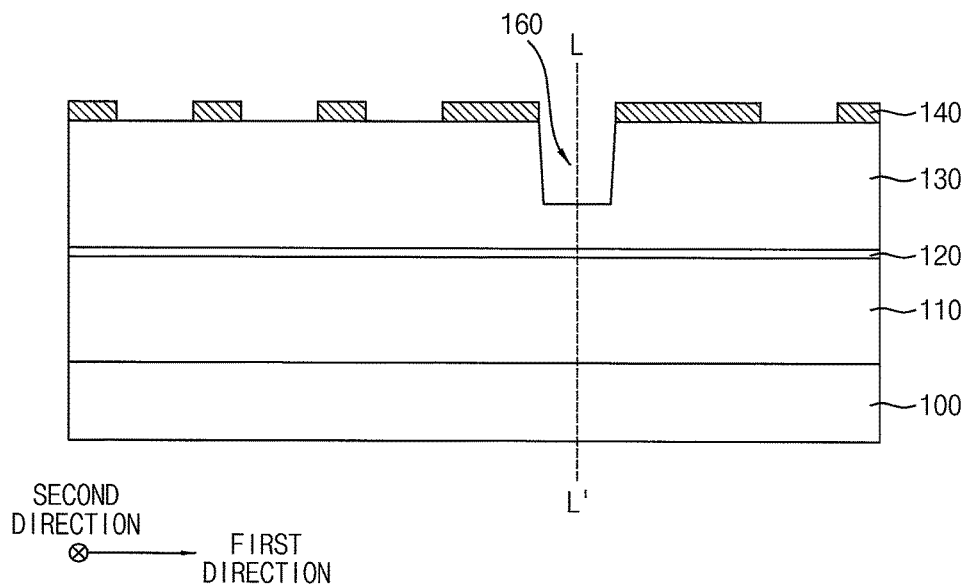
Figure 7:
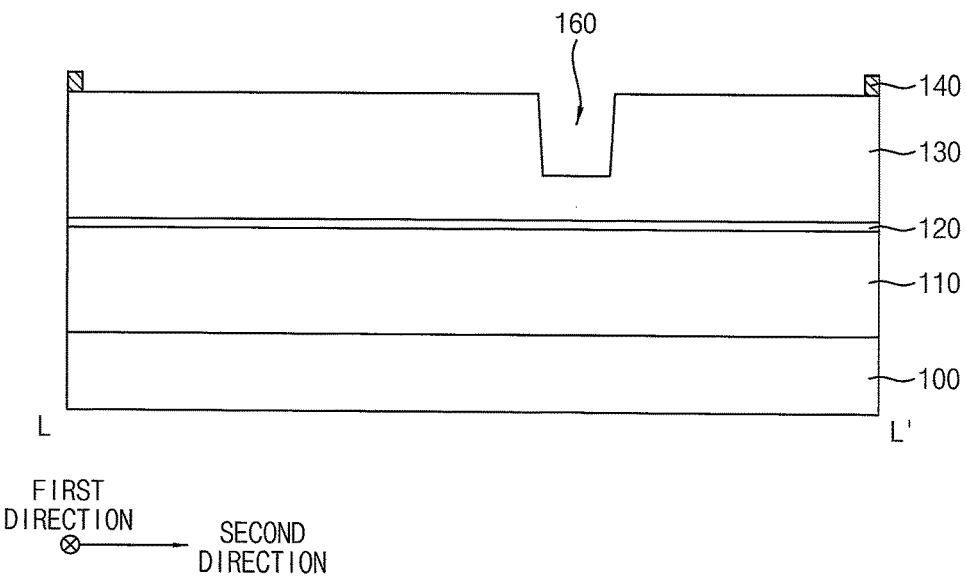

Referring to FIGS. 6 and 7, the second insulating interlayer 130 may be etched using the first and second masks 140 and 150 as an etching mask to form a first recess 160.

In some example embodiments, the first recess 160 may be formed partially through the second insulating interlayer 130. The first recess 160 may be formed by etching a portion of the second insulating interlayer 130 commonly exposed by the first and second openings 145 and 155 in the first and second masks 140 and 150, respectively.

Figure 8:
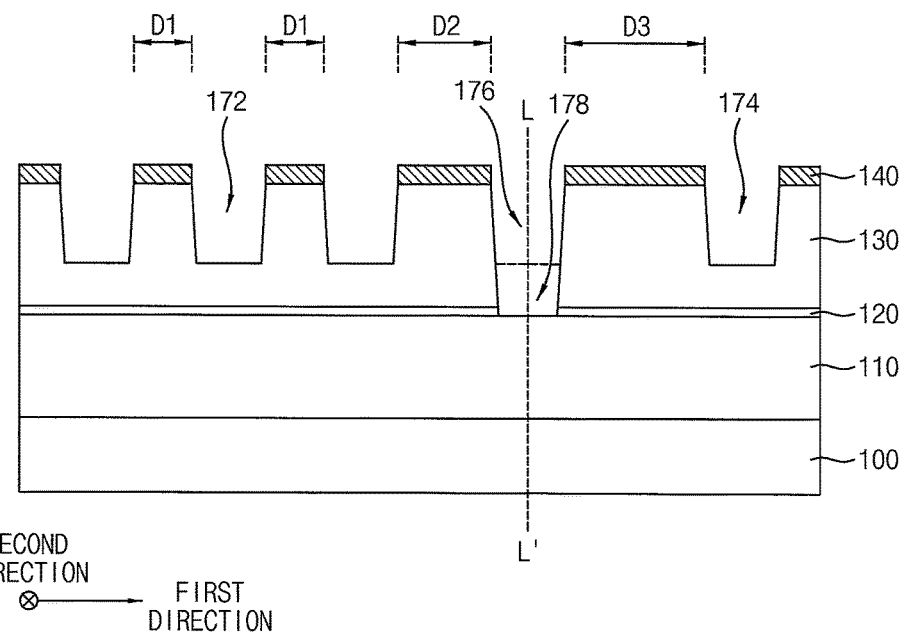
Figure 9:
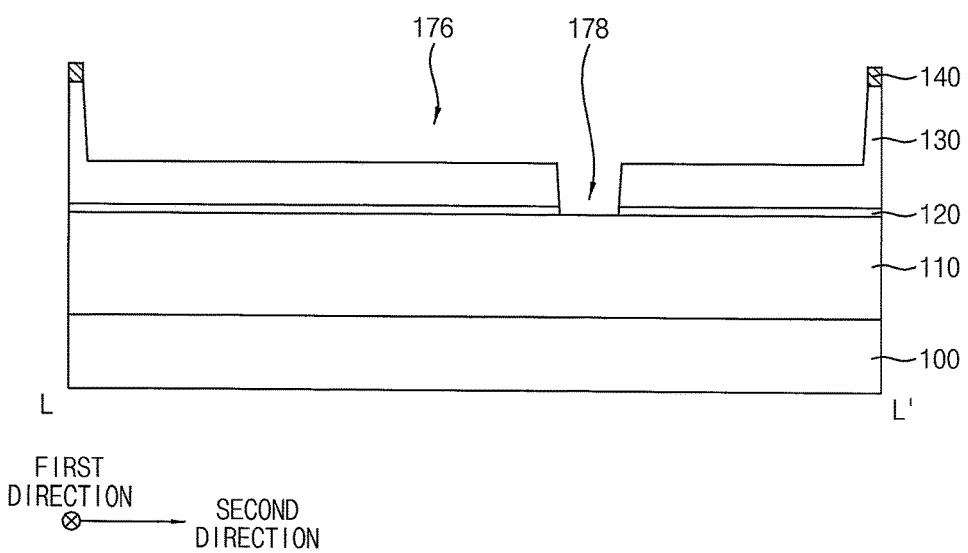

Referring to FIGS. 8 and 9, after removing the second mask 150, the second insulating interlayer 130 may be removed using the first mask 140 as an etching mask to form the first to third trenches 172, 174 and 176 and the first via hole 178.

Each of the first to third trenches 172, 174 and 176 may be formed partially through the second insulating interlayer 130, and the first via hole 178 may be formed to be in communication with the third trench 176 and expose a top surface of the etch stop layer 120.

After removing the exposed portion of the etch stop layer 120, the first via hole 178 may be formed to expose a top surface of the first insulating interlayer 110.

In some embodiments, a plurality of first trenches 172, a plurality of second trenches 174 and/or a plurality of third trenches 176 may be formed, and further a plurality of first via holes 178 may be formed. In an example embodiment, the first trenches 172 may be formed to be spaced apart from each other in the first direction by a first distance D1, the first and third trenches 172 and 176 may be formed to be spaced apart from each other in the first direction by a second distance D2 greater than the first distance D1, and the second and third trenches 174 and 176 may be formed to be spaced apart from each other in the first direction by a third distance D3 greater than the second distance D2. However, the inventive concepts may not be limited thereto, and the first to third trenches 172, 174 and 176 may be formed by various distances from each other according to positions of first to third lower wirings 202, 204 and 206 (refer to FIGS. 11 and 12) subsequently formed.

Figure 10:
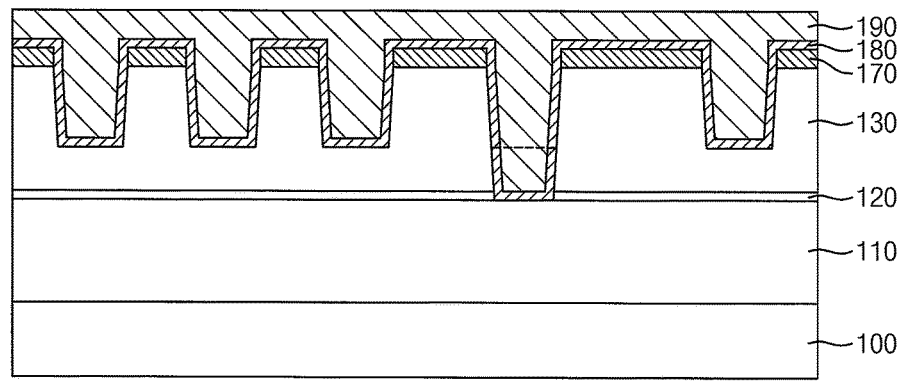

Referring to FIG. 10, after removing the first mask 140, a lower conductive barrier layer 180 may be formed on inner walls of the first to third trenches 172, 174 and 176 and the first via hole 178, and the exposed top surface of the first insulating interlayer 110, and a lower metal layer 190 may be formed on the lower conductive barrier layer 180 to fill remaining portions of the first to third trenches 172, 174 and 176 and the first via hole 178.

The lower conductive barrier layer 180 may be formed of a metal nitride, e.g., tantalum nitride, titanium nitride, etc., or a metal, e.g., tantalum, titanium, etc. The lower metal layer 190 may be formed of a metal, e.g., copper, aluminum, tungsten, etc.

In some example embodiments, the lower conductive barrier layer 180 may be formed by a chemical vapor deposition (CVD) process, an atomic layer deposition (ALD) process, a physical vapor deposition (PVD) process, etc. Thus, the lower conductive barrier layer 180 may be conformally formed on the inner walls of the first to third trenches 172, 174 and 176 and the first via hole 178, and the exposed top surface of the first insulating interlayer 110 to a given thickness. The lower metal layer 190 may be formed by forming a seed layer (not shown) on the lower conductive barrier layer 180, and performing electroplating.

Before forming the lower metal layer 190, a line (not shown) may be further formed on the lower conductive barrier layer. The liner may be formed of, e.g., cobalt, ruthenium, etc.

Figure 11:
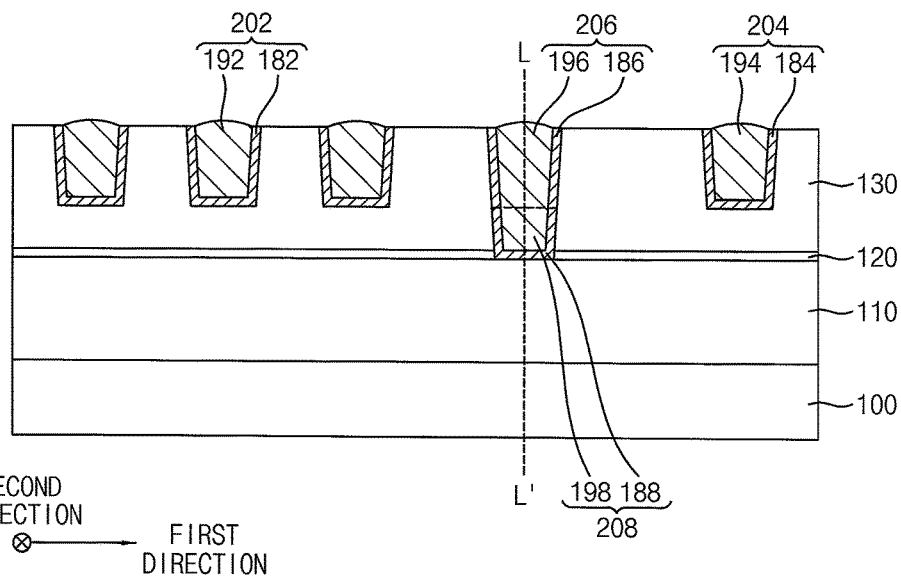
Figure 12:
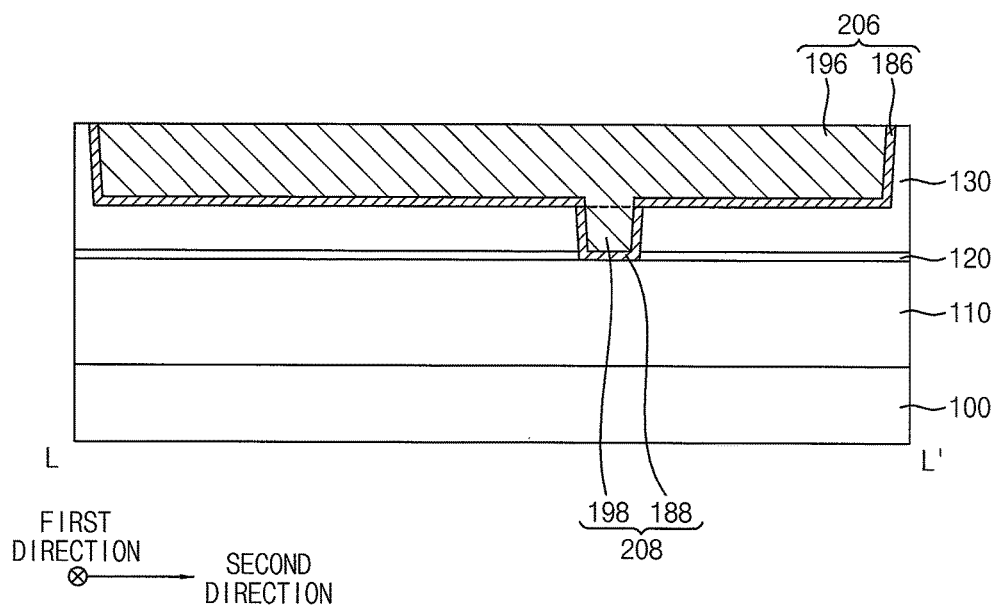

Referring to FIGS. 11 and 12, the lower metal layer 190 and the lower conductive barrier layer 180 may be planarized until a top surface of the second insulating interlayer 130 may be exposed to form first to fourth lower metal patterns 192, 194, 196 and 198 and first to fourth lower conductive barrier patterns 182, 184, 186 and 188 in the first to third trenches 172, 174 and 176 and the first via hole 178, respectively.

Particularly, the first lower metal pattern 192 and the first lower conductive barrier pattern 182 covering a bottom and a sidewall of the first lower metal pattern 192 may be formed in the first trench 172, and the second lower metal pattern 194 and the second lower conductive barrier pattern 184 covering a bottom and a sidewall of the second lower metal pattern 194 may be formed in the second trench 174. The third lower metal pattern 196 and the third lower conductive barrier pattern 186 covering a bottom and a sidewall of the third lower metal pattern 196 may be formed in the third trench 176, and the fourth lower metal pattern 198 and the fourth lower conductive barrier pattern 188 covering a bottom and a sidewall of the fourth lower metal pattern 198 may be formed in the first via hole 178. The fourth and third lower metal patterns 198 and 196 may be sequentially stacked and contact each other, and the fourth and third lower conductive barrier patterns 188 and 186 may be sequentially stacked and contact each other.

The first lower conductive barrier pattern 182 and the first lower metal pattern 192 may define a first lower wiring 202, the second lower conductive barrier pattern 184 and the second lower metal pattern 194 may define a second lower wiring 204, the third lower conductive barrier pattern 186 and the third lower metal pattern 196 may define a third lower wiring 206, and the fourth lower conductive barrier pattern 188 and the fourth lower metal pattern 198 may define a lower via 208. The lower via 208 and the third lower wiring 206 sequentially stacked may define a lower wiring structure.

In some example embodiments, the planarization process may be performed by a chemical mechanical polishing (CMP) process and/or an etch back process.

In an example embodiment, an upper surface of each of the first to fourth lower metal patterns 192, 194, 196 and 198 that may be formed by the planarization process may have a curved shape in which a central portion may be higher than an edge portion. That is, the edge portions of the upper surfaces of the first to fourth lower metal patterns 192, 194, 196 and 198 may be substantially coplanar with the top surface of the second insulating interlayer 130, however, the central portions of the upper surfaces of the first to fourth lower metal patterns 192, 194, 196 and 198 may be higher than the top surface of the second insulating interlayer 130. Top surfaces of the first to third lower conductive barrier patterns 182, 184 and 186 may be substantially coplanar with the top surface of the second insulating interlayer 130.

Figure 13:
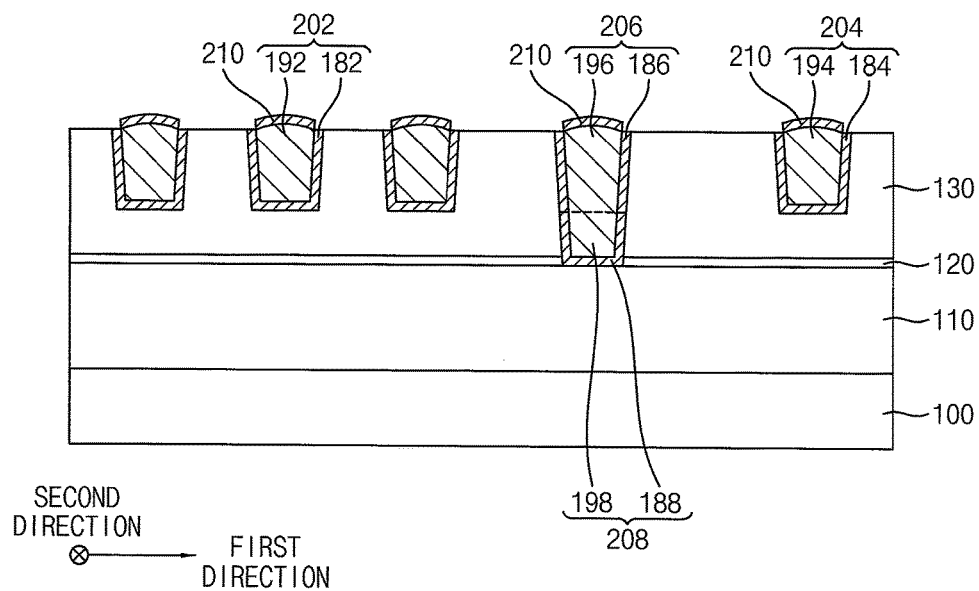

Referring to FIG. 13, a capping pattern 210 may be formed on each of the first to third lower wirings 202, 204 and 206.

In some example embodiments, the capping pattern 210 may be conformally formed on each of the first to third lower wirings 202, 204 and 206 by a selective chemical vapor deposition (CVD) process or electroless plating, and may not be formed on the second insulating interlayer 130. In some example embodiments, the capping pattern 210 may be formed on each of the first to third metal patterns 192, 194 and 196 in each of the first to third lower wirings 202, 204 and 206.

The capping pattern 210 may be formed of, e.g., cobalt (Co), ruthenium (Ru), tungsten (W), cobalt tungsten phosphorus (CoWP), etc.

Figure 14:
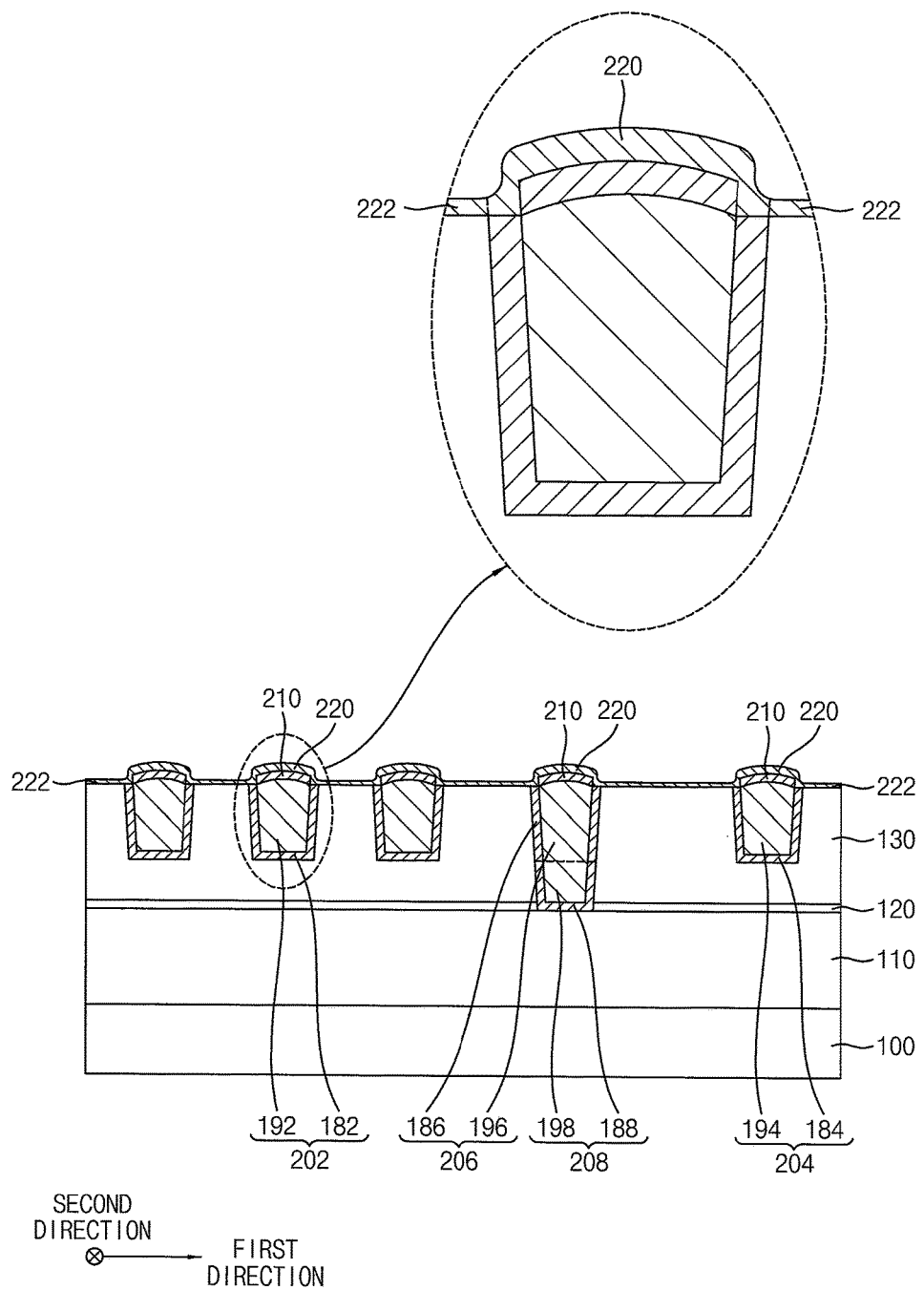

Referring to FIG. 14, a metal nitride layer 220 may be formed on the capping pattern 210, and the first to third lower conductive barrier patterns 182, 184 and 186, and a metal oxynitride layer 222 may be formed on the second insulating interlayer 130.

In some example embodiments, an ALD process or a CVD process may be performed on the capping pattern 210, the first to third lower conductive barrier patterns 182, 184 and 186, and the second insulating interlayer 130 using a metal nitride to form the metal nitride layer 220 on the capping pattern 210, and the first to third lower conductive barrier patterns 182, 184 and 186, and the metal oxynitride layer 222 on the second insulating interlayer 130. The metal oxynitride layer 222 may be formed to have a thickness smaller than a thickness of the metal nitride layer 220.

The metal component of the metal nitride may include aluminum, or a noble metal, e.g., gold, silver, platinum, etc.

Figure 15:
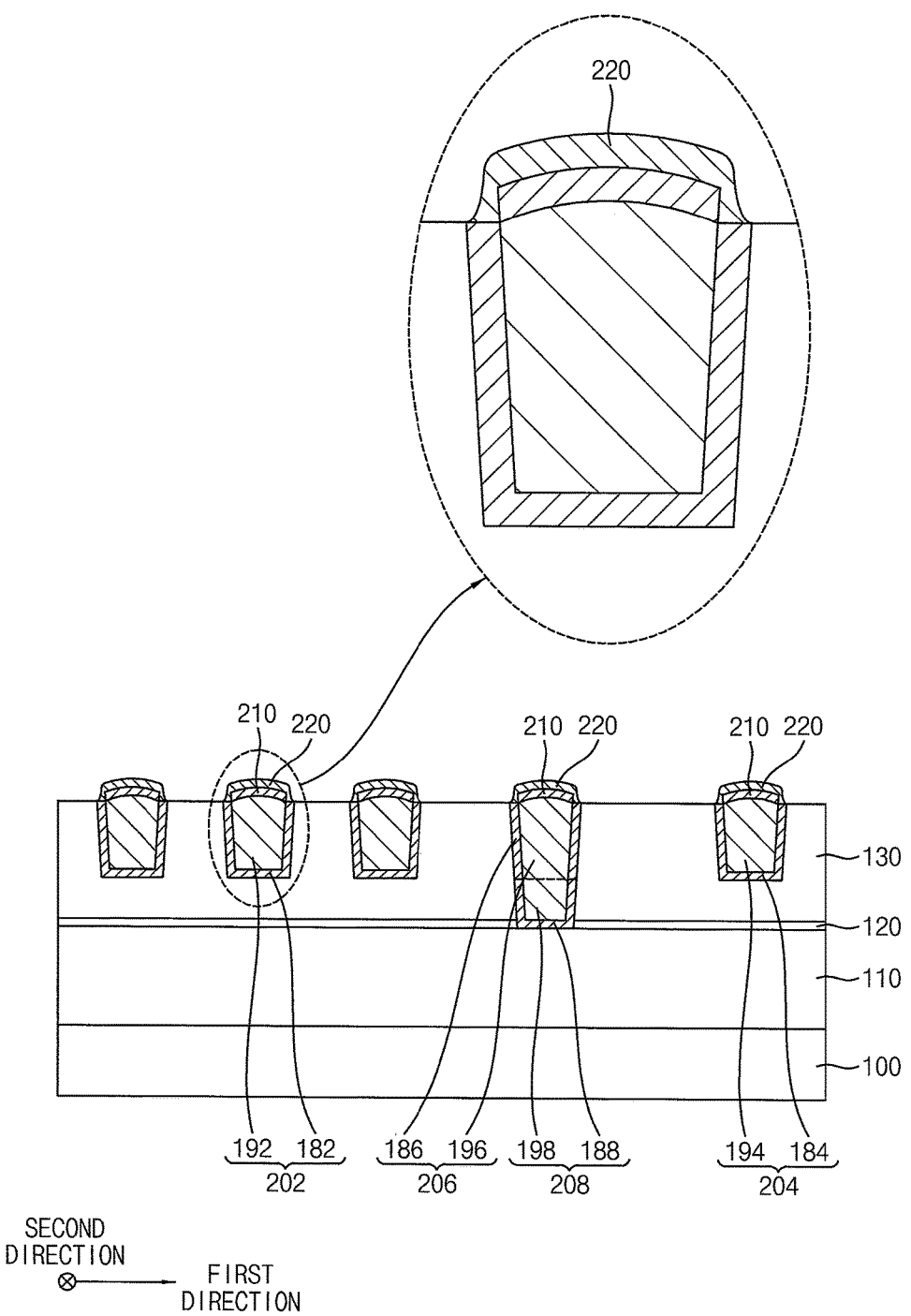

Referring to FIG. 15, the metal oxynitride layer 222 on the second insulating interlayer 130 may be removed.

Thus, the metal nitride layer 220 may remain on the capping pattern 210, and the first to third lower conductive barrier patterns 182, 184 and 186, and hereinafter, the metal nitride layer 220 may be referred to as a protection pattern 220.

In some example embodiments, the metal oxynitride layer 222 may be removed by a wet etching process using hydrofluoric acid (HF) as an etchant. In the wet etching process, the metal nitride layer 220 may be partially removed, however, the metal nitride layer 220 may have a thickness greater than a thickness of the metal oxynitride layer 222, and the etchant may have an etching selectivity between the metal nitride layer 220 and the metal oxynitride layer 222. Accordingly, the metal nitride layer 220 may remain on the capping pattern 210, and the first to third lower conductive barrier patterns 182, 184 and 186.

The protection pattern 220 may cover an upper surface and a sidewall of the capping pattern 210 on each of the first to third lower metal patterns 192, 194 and 196, and may also cover a top surface of each of the first to third lower conductive barrier patterns 182, 184 and 186. Thus, the protection pattern 120 may be formed on each of the first to third lower wirings 202, 204 and 206.

Figure 16:
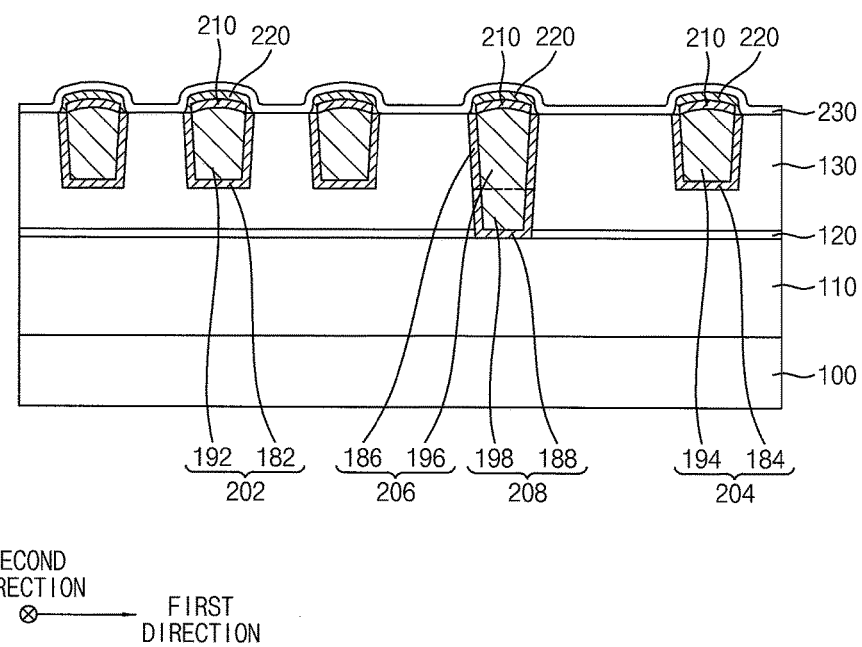

Referring to FIG. 16, a spacer layer 230 may be formed on the protection pattern 220 and the second insulating interlayer 130.

In some example embodiments, the spacer layer 230 may be conformally formed on the protection pattern 220 and the second insulating interlayer 130 by a CVD process or an ALD process using a nitride, e.g., silicon nitride.

Figure 17:
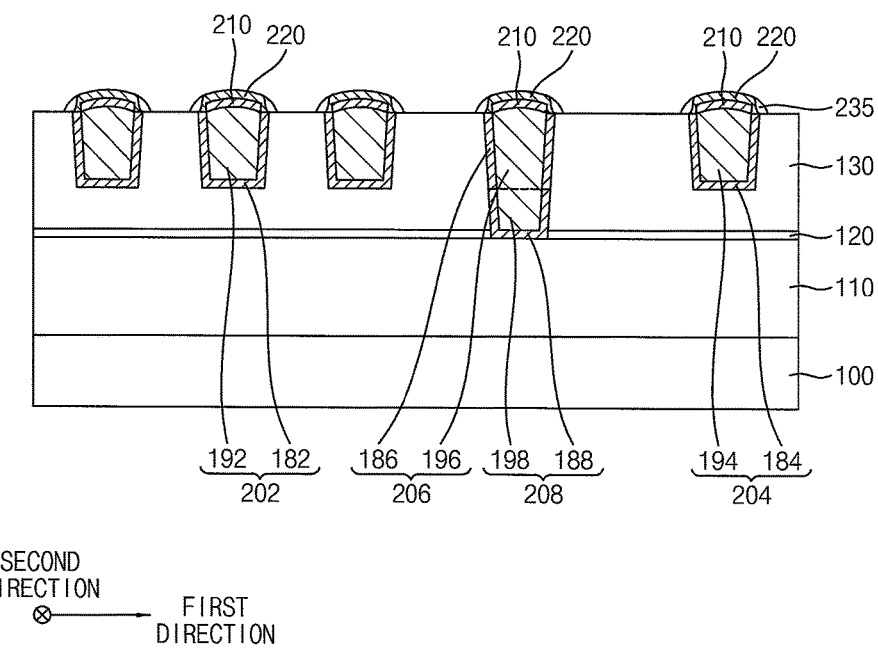

Referring to FIG. 17, the spacer layer 230 may be anisotropically etched to form a spacer 235 on the sidewall of the protection pattern 220.

The spacer 235 may be formed on the second insulating interlayer 130, and thus a bottom of the spacer 235 may be substantially coplanar with the top surfaces of the first to third lower conductive barrier patterns 182, 184 and 186.

A thickness of the spacer 235 on the sidewall of the protection pattern 220 may be controlled according to the mis-alignment margin of a second via hole 288 (refer to FIGS. 22 and 23) subsequently formed.

Figure 18:
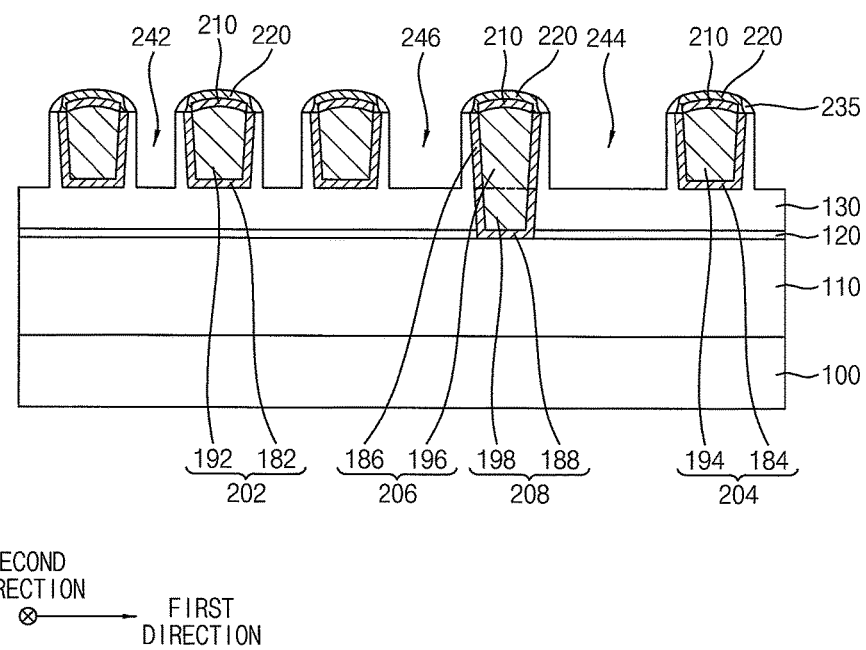
Figure 19:
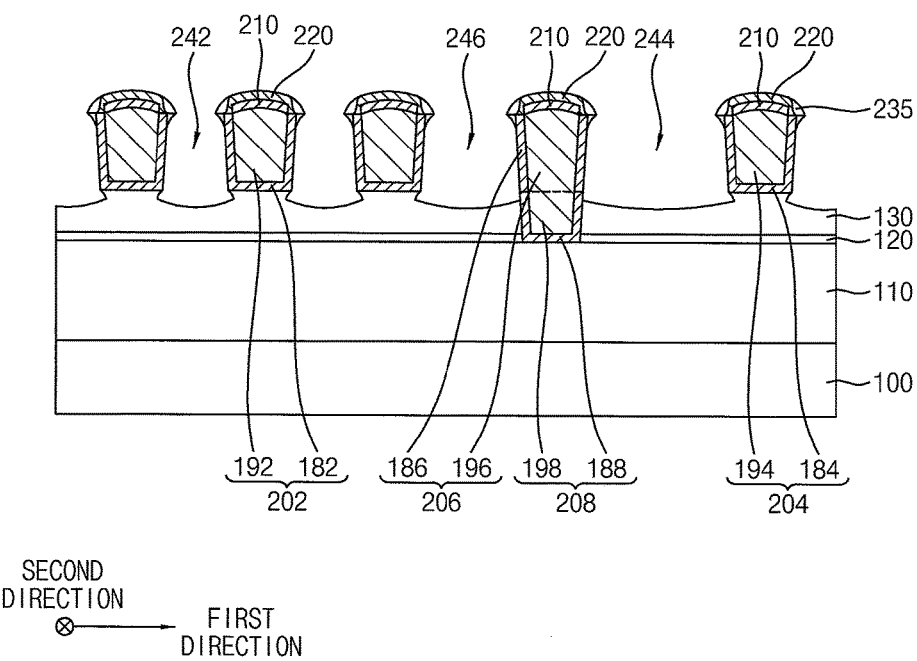

Referring to FIGS. 18 and 19, the second insulating interlayer 130 may be partially etched using the protection pattern 220 and the spacer 235 as an etching mask to form second to fourth recesses 242, 244 and 246. When the second to fourth recesses 242, 244 and 246 are formed, upper surfaces of the first to third lower wirings 202, 204 and 206, and the capping pattern 210 may be protected by the protection pattern 220, and thus may not be etched.

In some example embodiments, the second and fourth recesses 242, 244 and 246 may be formed by applying plasma a portion of the second insulating interlayer 130 not covered by the protection pattern 220 and the spacer 235 to damage the portion, and removing the damaged portion of the second insulating interlayer 130.

In some example embodiments, the plasma may be generated by ammonia ($NH_3$) gas and/or fluorine gas, and the damaged portion of the second insulating interlayer 130 may be removed by a dry etching process or a wet etching process.

FIG. 18 shows that the damaged portion of the second insulating interlayer 130 is removed by a dry etching process, and FIG. 19 shows that the damaged portion of the second insulating interlayer 130 is removed by a wet etching process. Alternatively, the damaged portion of the second insulating interlayer 130 may be removed by a dry etching process together with a wet etching process.

As shown in FIG. 18, when the dry etching process is performed, a portion of the second insulating interlayer 130 under the spacer 235 may not be removed, and each of the second to fourth recesses 242, 244 and 246 may have a vertical sidewall or have a width gradually decreasing from a top toward a bottom thereof. Thus, the sidewalls of the first to third lower wirings 202, 204 and 206 may be covered by the second insulating interlayer 130.

Alternatively, as shown in FIG. 19, when the wet etching process is performed, a portion of the second insulating interlayer 130 under the spacer 235 may be also removed due to the isotropic characteristics thereof, and thus sidewalls of the first to third lower wirings 202, 204 and 206 may be exposed by the second to fourth recesses 242, 244 and 246, respectively.

Hereinafter, only the second to fourth recesses 242, 244 and 246 having the shapes shown in FIG. 18 will be illustrated for the convenience of explanation.

FIG. 18 shows that bottoms of the second to fourth recesses 242, 244 and 246 are substantially coplanar with bottoms of the first to third lower wirings 202, 204 and 206, respectively, however, the inventive concepts may not be limited thereto, and the bottoms of the second to fourth recesses 242, 244 and 246 may be higher or lower than the bottoms of the first to third lower wirings 202, 204 and 206, respectively.

Figure 20:
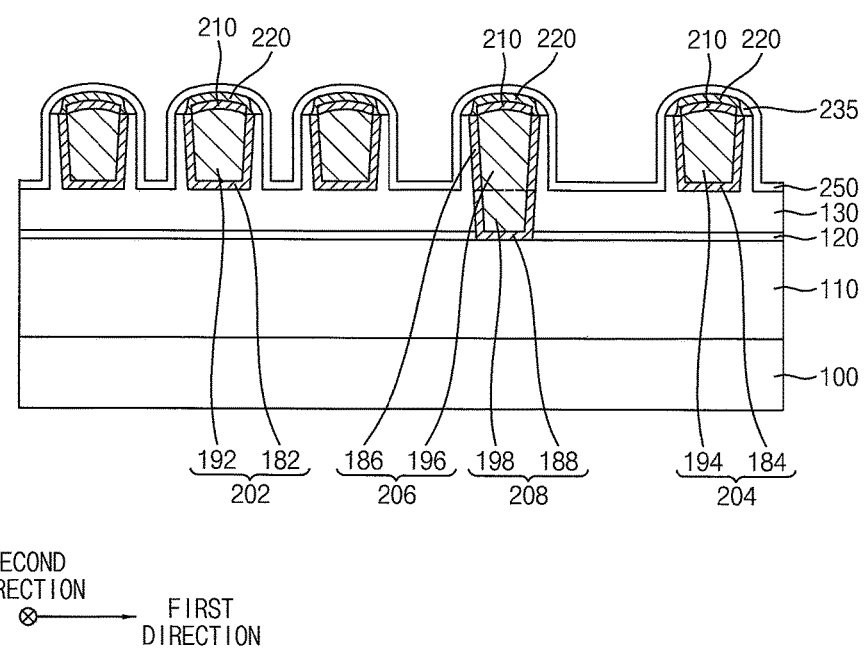

Referring to FIG. 20, an insulating barrier layer 250 may be formed on the protection pattern 220, the spacer 235 and the second to fourth recesses 242, 244 and 246.

In some example embodiments, the insulating barrier layer 250 may be formed by a CVD process, an ALD process or a PVD process to have a constant or varying thickness. For example, the insulating barrier layer 250 may be formed of a nitride, e.g., silicon nitride, silicon carbonitride, silicon carboxide, silicon oxycarbonitride, etc. When the spacer 235 includes silicon nitride, the insulating barrier layer 250 may be formed of a material different from that of the spacer 235, e.g., silicon carbonitride, silicon carboxide or silicon oxycarbonitride, and thus a given etching gas or etching solution may have an etching selectivity between the spacer 235 and the insulating barrier layer 250.

Figure 21:
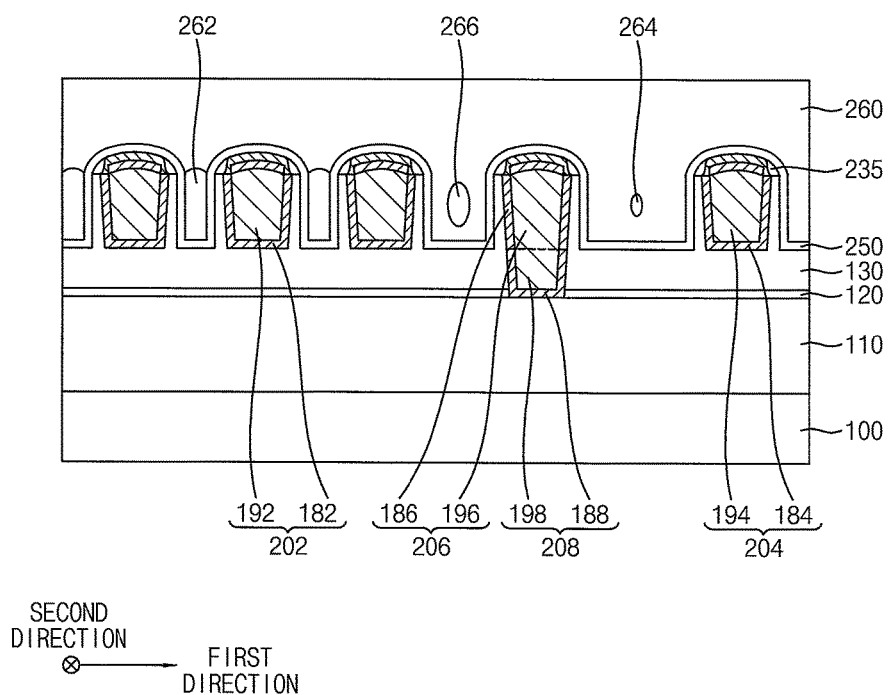

Referring to FIG. 21, a third insulating interlayer 260 may be formed under process conditions having low gap-filling characteristics to form first to third air gaps 262, 264 and 266 between the first to third lower wirings 202, 204 and 206.

Particularly, between the first lower wirings 202 spaced apart from each other by a relatively small distance, the first air gap 262 having a relatively large size may be formed, between the second and third lower wirings 204 and 206 spaced apart from each other by a relatively large distance, the second air gap 264 having a relatively small size may be formed, and between the first and third lower wirings 202 and 206 spaced apart from each other by a middle distance, the third air gap 266 having a middle size may be formed.

In some example embodiments, a top of the first air gap 262 may be defined by the third insulating interlayer 260, and a sidewall and a bottom of the first air gap 262 may be defined by the insulating barrier layer 250. A boundary of each of the second and third air gaps 264 and 266 may be defined by the third insulating interlayer 260. In some cases, the second and third air gaps 264 and 266 may not be formed.

The top of the first air gap 262 may be higher than a top surface of the first lower wiring 202, and a bottom of each of the second and third air gaps 264 and 266 may be higher than bottoms of the first to third lower wirings 202, 204 and 206, however, the inventive concepts may not be limited thereto. That is, the first to third air gaps 262, 264 and 266 may have various shapes and sizes.

The third insulating interlayer 260 may be formed of a low-k dielectric material, e.g., silicon oxide doped with carbon (SiCOH) or silicon oxide doped with fluorine (F—$SiO_2$), a porous silicon oxide, spin on organic polymer, or an inorganic polymer, e.g., hydrogen silsesquioxane (HSSQ), methyl silsesquioxane (MSSQ), etc. In some example embodiments, the third insulating interlayer 260 may be formed of a material substantially the same as a material of the second insulating interlayer 130. The second and third insulating interlayers 130 and 260 may define a lower insulating interlayer structure.

Figure 22:
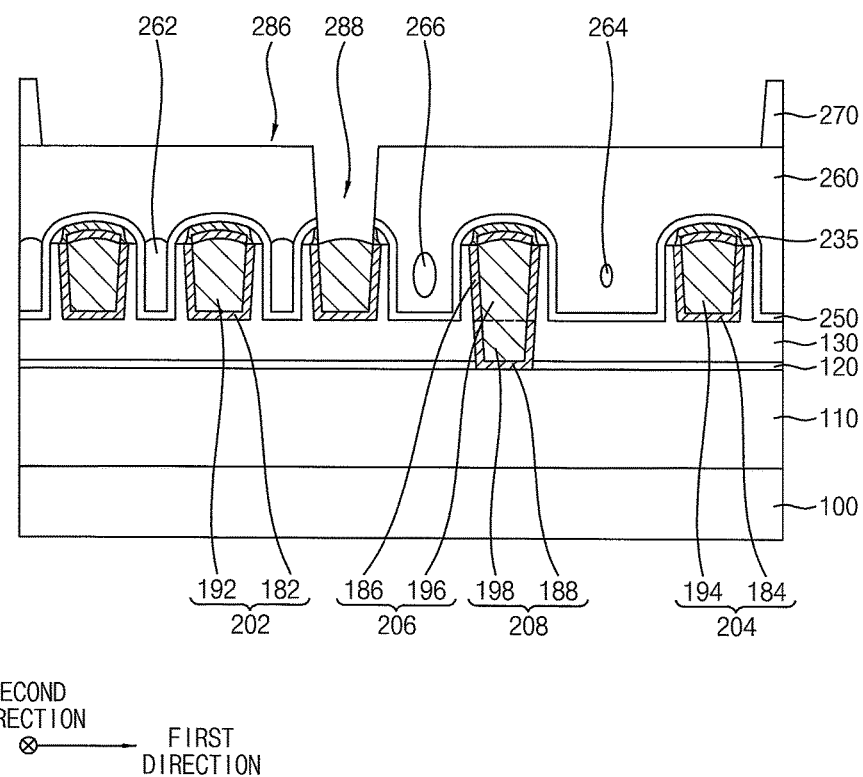

Referring to FIG. 22, after forming a fourth insulating interlayer 270 on the third insulating interlayer 260, processes substantially the same as or similar to those illustrated with reference to FIGS. 4 to 9 may be performed.

Thus, a fourth trench 286 may be formed through the fourth insulating interlayer 270, and a second via hole 288 may be formed partially through the third insulating interlayer 260 to be in communication with the fourth trench 286.

The fourth insulating interlayer 270 may be formed of a low-k dielectric material, e.g., silicon oxide doped with carbon (SiCOH) or silicon oxide doped with fluorine (F—SiO$_2$), a porous silicon oxide, spin on organic polymer, or an inorganic polymer, e.g., hydrogen silsesquioxane (HSSQ), methyl silsesquioxane (MSSQ), etc. In some example embodiments, the fourth insulating interlayer 270 may be formed of a material substantially the same as a material of the second and third insulating interlayers 130 and 260.

In some example embodiments, the fourth trench 286 may extend in the first direction. In some example embodiments, the second via hole 288 may be formed through the third insulating interlayer 260, the insulating barrier layer 250, the protection pattern 220 and the capping pattern 210 to expose the upper surface of the first lower metal pattern 192 of the first lower wiring 202.

Figure 23:
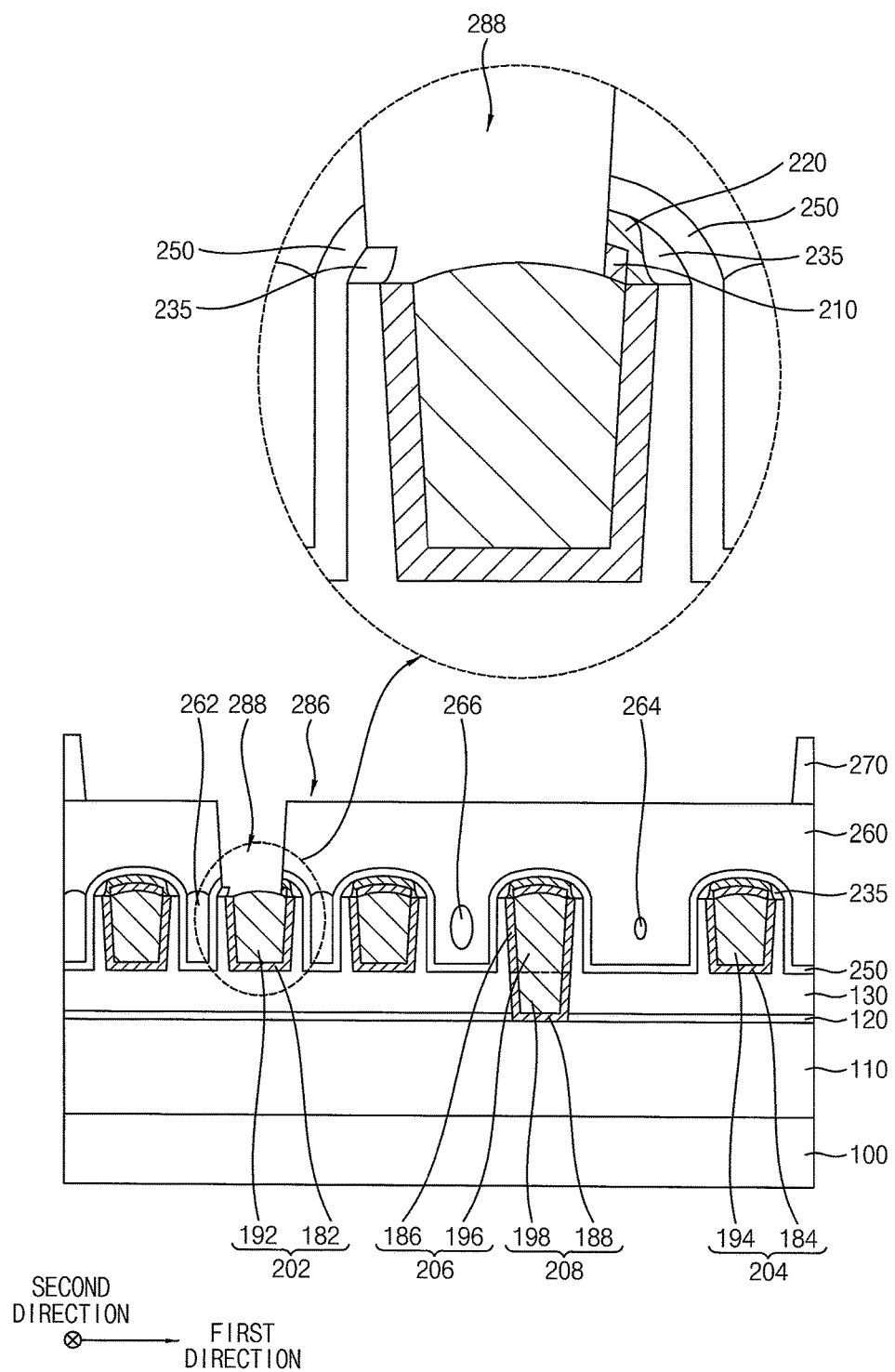

Referring to FIG. 23, the second via hole 288 may be formed to be mis-aligned with the first lower metal pattern 192.

However, in some example embodiments, a portion of the second insulating interlayer 130 adjacent a sidewall of the first lower wiring 202 may be protected by the spacer 235 on the sidewall of the protection pattern 220, and thus may not be etched. In the etching process for forming the second via hole 288, the insulating barrier layer 250 may be removed by an etching gas or an etching solution, while the spacer 235 having an etching selectivity with respect to the insulating barrier layer 250 may be partially removed but may not be completely removed. Thus, even though the second via hole 288 may be formed to be mis-aligned, the second via hole 288 may not be in communication with the first air gap 262 adjacent the second insulating interlayer 130 due to the spacer 235.

Referring to FIGS. 1 to 3 again, processes substantially the same as or similar to those illustrated with reference to FIGS. 10 to 12 may be performed to form first and second upper metal patterns 302 and 304 and first and second upper conductive barrier patterns 292 and 294 in the fourth trench 286 and the second via hole 288.

Particularly, after an upper conductive barrier layer may be formed on inner walls of the fourth trench 286 and the second via hole 288, and the exposed upper surface of the first lower wiring 202, an upper metal layer may be formed on the upper conductive barrier layer to fill remaining portions of the fourth trench 286 and the second via hole 288, and the upper metal layer and the upper conductive barrier layer may be planarized until a top surface of the fourth insulating interlayer 270 may be exposed.

Thus, the first upper metal pattern 302 and the first upper conductive barrier pattern 292 covering a portion of a bottom and a sidewall of the first upper metal pattern 302 may be formed in the fourth trench 286, and the second upper metal pattern 304 and the second upper conductive barrier pattern 294 covering a bottom and a sidewall of the second upper metal pattern 304 may be formed in the second via hole 288. The second and first upper metal patterns 304 and 302 may be sequentially stacked and contact each other, and the second and first upper conductive barrier patterns 294 and 292 may be sequentially stacked and contact each other.

The first upper conductive barrier pattern 292 and the first upper metal pattern 302 may define a first upper wiring 312, and the second upper conductive barrier pattern 294 and the second upper metal pattern 304 may define an upper via 314. The upper via 314 may contact the upper surface of the first lower wiring 202, and thus may be referred to as a landing via. The upper via 314 and the upper wiring 312 may define an upper wiring structure.

The upper conductive barrier layer may be formed of a metal nitride, e.g., tantalum nitride, titanium nitride, etc., and/or a metal, e.g., tantalum, titanium, etc. The upper metal layer may be formed of a metal, e.g., copper, aluminum, tungsten, etc.

The semiconductor device shown in FIGS. 1 to 3 may be manufactured by the above processes.

Figure 24:
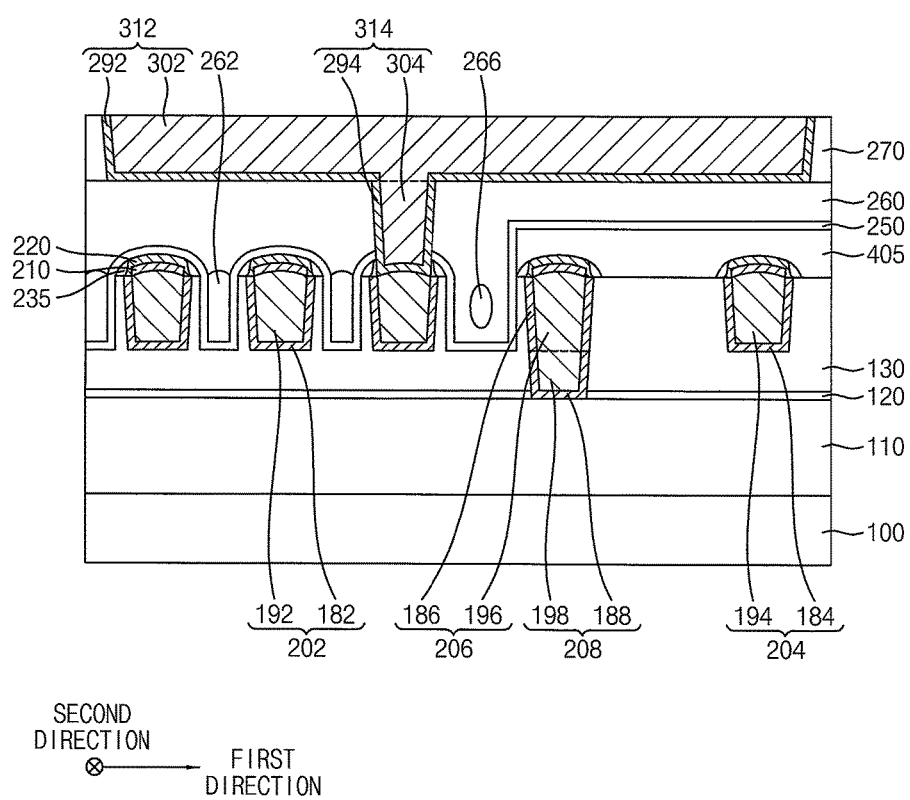
FIG. 24 is a cross-sectional view illustrating a semiconductor device in accordance with some example embodiments.

FIG. 24 is a cross-sectional view illustrating a semiconductor device in accordance with some example embodiments. The semiconductor device of FIG. 24 may be substantially the same as or similar to that of FIG. 1, except for the mask and the air gap. Thus, like reference numerals refer to like elements, and detailed descriptions thereon may be omitted below in the interest of brevity.

Referring to FIG. 24, the semiconductor device may include the first, second and third lower wirings 202, 204 and 206, the lower via 208, the protection pattern 220, the spacer 235, a third mask 405, and the second and third insulating interlayers 130 and 260 on the substrate 100. The semiconductor device may further include the first insulating interlayer 110, the etch stop layer 120, the capping pattern 210, the insulating barrier layer 250, the upper wiring 312, the upper via 314, and the fourth insulating interlayer 270.

The third mask 405 may cover the second and third lower wirings 204 and 206, the capping pattern 210 and the protection pattern 220 on the second and third lower wirings 204 and 206, the spacer 235 adjacent the second and third lower wirings 204 and 206, and a portion of the second insulating interlayer 130 between the second and third lower wirings 204 and 206. The third mask 405 may include SOH, silicon nitride, etc.

The insulating barrier layer 250 may cover the protection pattern 220 and the spacer 235 on the first lower wiring 202, and may surround sidewalls of the first to third lower wirings 202, 204 and 206. The insulating barrier layer 250 may be further formed on a sidewall and a top surface of the third mask 405.

The third insulating interlayer 260 may be formed on the insulating barrier layer 250, and the first and third air gaps 262 and 266 may be formed between the third insulating interlayer 260 and the insulating barrier layer 250 or in the third insulating interlayer 260.

Particularly, between the first lower wirings 202 spaced apart from each other by a relatively small distance, the first air gap 262 having a relatively large size may be formed between the third insulating interlayer 260 and the insulating barrier layer 250. Between the first and third lower wirings 202 and 206 spaced apart from each other by a relatively large distance, the third air gap 266 having a middle size may be formed in the third insulating interlayer 260.

FIGS. 25 to 28 are cross-sectional views illustrating stages of a method of manufacturing a semiconductor device in accordance with some example embodiments. This method may be used for manufacturing the semiconductor device in FIG. 24, however, may not be limited thereto. This method may include processes substantially the same as or similar to those illustrated with reference to FIGS. 4 to 23 and FIGS. 1 to 3, which may not be explained in detail.

First, processes substantially the same as or similar to those illustrated with reference to FIGS. 4 to 17 may be performed.

Figure 25:
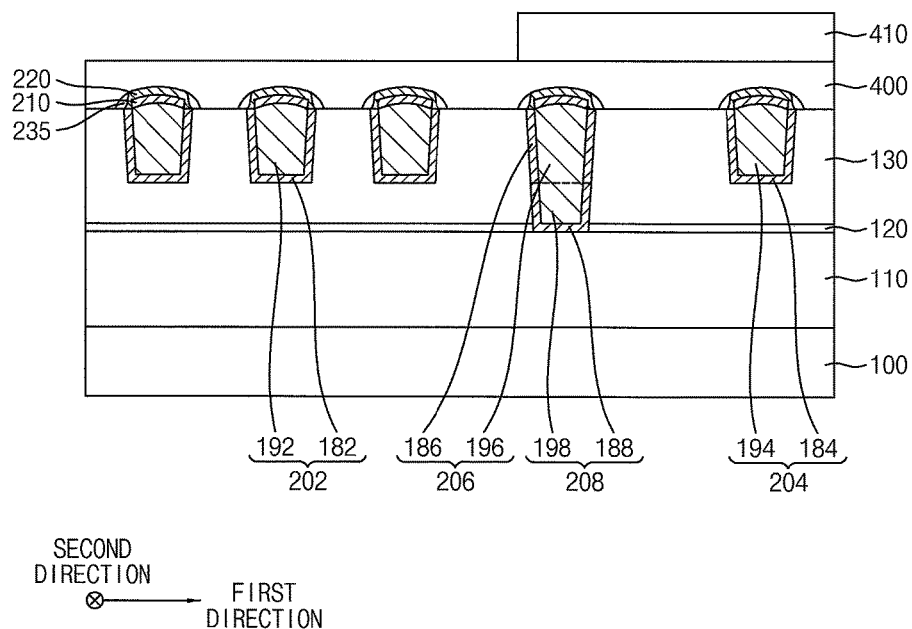

Referring to FIG. 25, a third mask layer 400 may be formed on the second insulating interlayer 130, the protection pattern 220 and the spacer 235, and a photoresist pattern 410 may be formed on the third mask layer 400.

The third mask layer 400 may be formed of, e.g., SOH, silicon nitride, etc.

In some example embodiments, the photoresist pattern 410 may be formed to overlap the second and third lower wirings 204 and 206, and a portion of the second insulating interlayer 130 between the second and third lower wirings 204 and 206.

Referring to FIG. 26, the third mask layer 400 may be etched using the photoresist pattern 410 as an etching mask to form a third mask 405.

The third mask 405 may cover the second and third lower wirings 204 and 206, the capping pattern 210 and the protection pattern 220 on the second and third lower wirings 204 and 206, the spacer 235 adjacent the second and third lower wirings 204 and 206, and the portion of the second insulating interlayer 130 between the second and third lower wirings 204 and 206.

The photoresist pattern 410 may be removed by, e.g., an ashing process and/or a stripping process.

Figure 27:
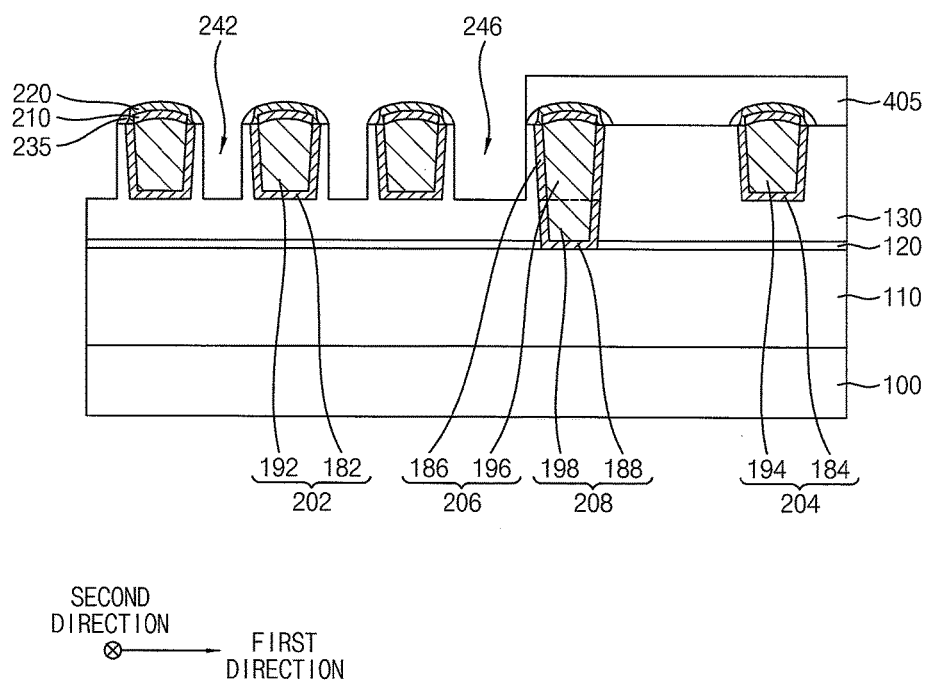

Referring to FIG. 27, processes substantially the same as or similar to those illustrated with reference to FIGS. 18 to 19 may be performed.

However, the second and third lower wirings 204 and 206, and the portion of the second insulating interlayer 130 therebetween may be covered by the third mask 405, and thus only second and fourth recesses 242 and 246 may be formed on the second insulating interlayer 130.

Figure 28:
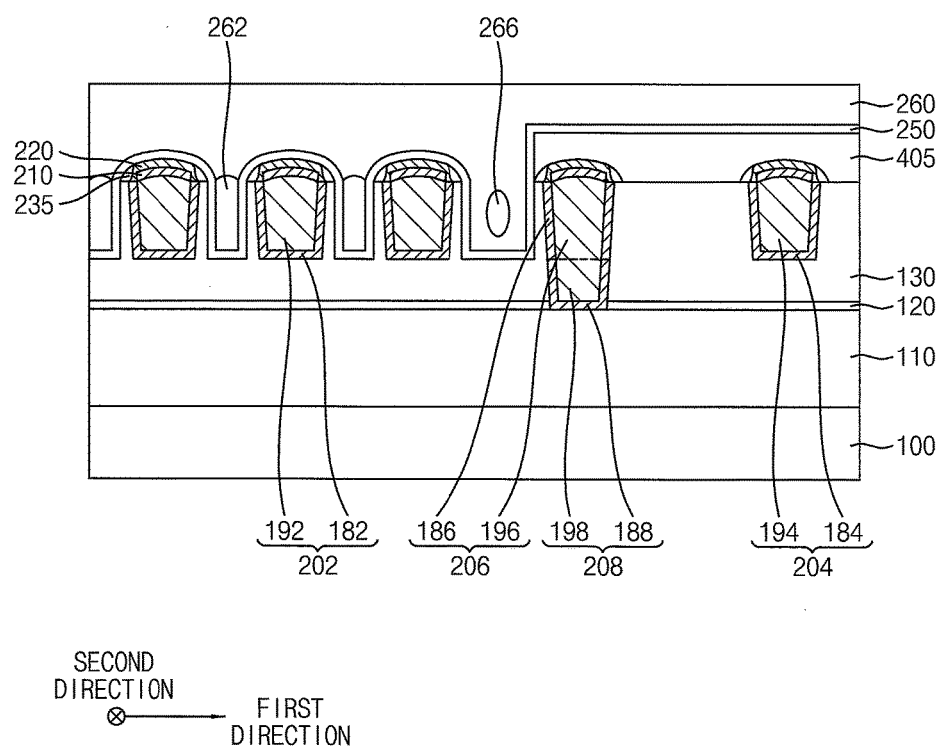

Referring to FIG. 28, processes substantially the same as or similar to those illustrated with reference to FIGS. 20 to 21 may be performed.

Thus, an insulating barrier layer 250 may be formed on the protection pattern 220, the spacer 235, the third mask 405, and the second and fourth recesses 242 and 246, and a third insulating interlayer 260 may be formed under process conditions having low gap-filling characteristics to form first and third air gaps 262 and 266 between the first and third lower wirings 202 and 206.

Particularly, between the first lower wirings 202 spaced apart from each other by a relatively small distance, the first air gap 262 having a relatively large size may be formed, and between the first and third lower wirings 202 and 206 spaced apart from each other by a relatively large distance, the third air gap 266 having a middle size may be formed.

Referring to FIG. 24 again, processes substantially the same as or similar to those illustrated with reference to FIGS. 22 to 23 and FIGS. 1 to 3 may be performed to complete the semiconductor device.

Figure 29:
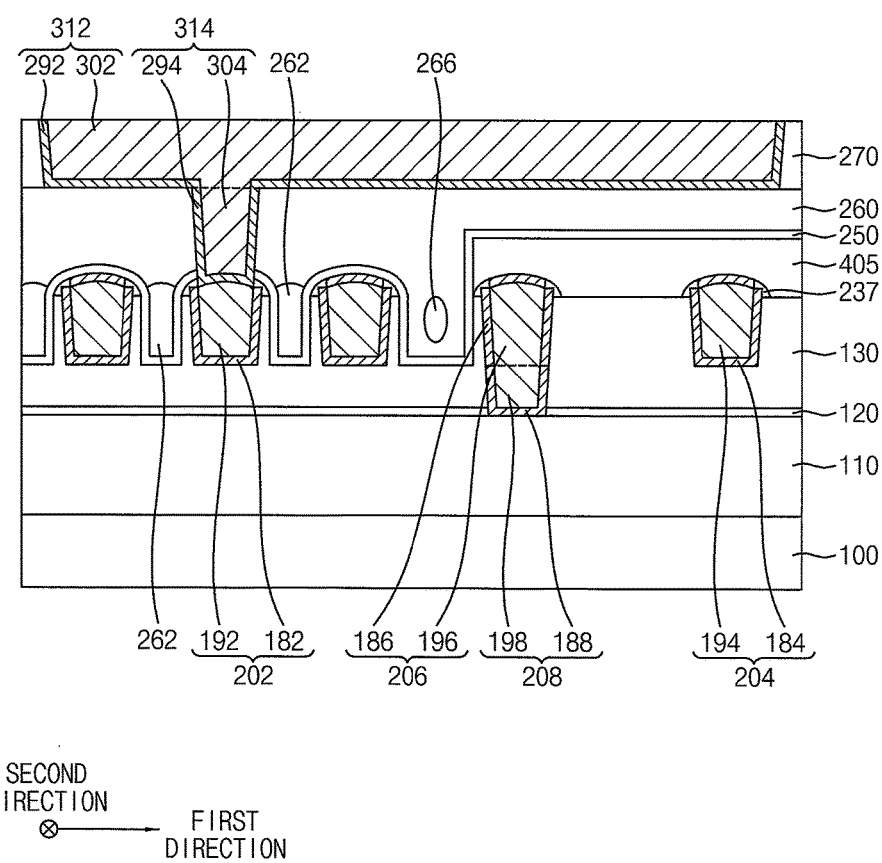
FIG. 29 is a cross-sectional view illustrating a semiconductor device in accordance with some example embodiments.

FIG. 29 is a cross-sectional view illustrating a semiconductor device in accordance with some example embodiments. The semiconductor device of FIG. 24 may be substantially the same as or similar to that of FIG. 24, except for the second insulating interlayer, the protection pattern and the spacer. Thus, like reference numerals refer to like elements, and detailed descriptions thereon may be omitted below in the interest of brevity.

Referring to FIG. 29, the semiconductor device may include the first, second and third lower wirings 202, 204 and 206, the lower via 208, a spacer 237, the third mask 405, and the second and third insulating interlayers 130 and 260 on the substrate 100. The semiconductor device may further include the first insulating interlayer 110, the etch stop layer 120, the capping pattern 210, the insulating barrier layer 250, the upper wiring 312, the upper via 314, and the fourth insulating interlayer 270.

A top surface of the second insulating interlayer 130 may be lower than upper surfaces of the first to third lower wirings 202, 204 and 206.

The spacer 237 may be formed on the second insulating interlayer 130, and may cover a sidewall of the capping pattern 210, and an upper surface and an upper sidewall of each of the first to third lower conductive barrier patterns 182, 184 and 186. Thus, a bottom of the spacer 237 may be lower than upper surfaces of the first to third lower conductive barrier patterns 182, 184 and 186 that may be higher than the top surface of the second insulating interlayer 130.

The insulating barrier layer 250 may cover upper surfaces of the capping pattern 210 and the spacer 237 on the first and third lower wirings 202 and 206, and may surround sidewalls of the first to third lower wirings 202, 204 and 206. The insulating barrier layer 250 may be further formed on a sidewall and a top surface of the third mask 405.

Figure 30:
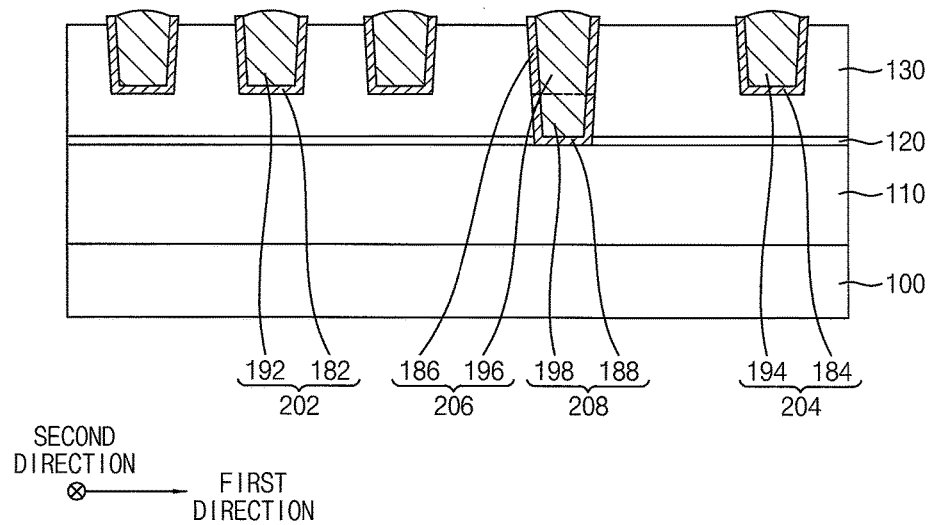
FIGS. 30 to 31 are cross-sectional views illustrating stages of a method of manufacturing a semiconductor device in accordance with some example embodiments.
Figure 31:
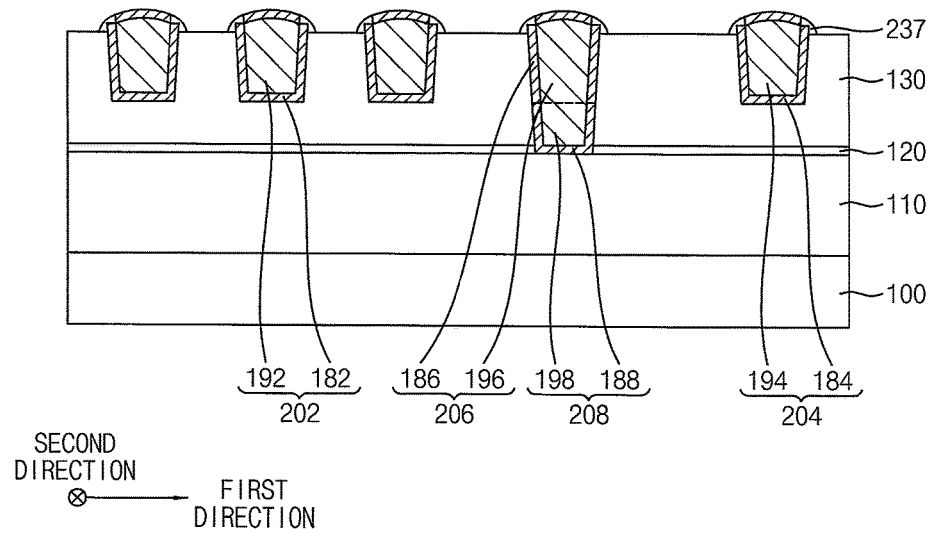

FIGS. 30 to 31 are cross-sectional views illustrating stages of a method of manufacturing a semiconductor device in accordance with some example embodiments. This method may be used for manufacturing the semiconductor device in FIG. 29, however, may not be limited thereto. This method may include processes substantially the same as or similar to those illustrated with reference to FIGS. 4 to 23 and FIGS. 1 to 3 or processes substantially the same as or similar to those illustrated with reference to FIGS. 25 to 28 and FIG. 24, which may not be explained in detail.

First, processes substantially the same as or similar to those illustrated with reference to FIGS. 3 to 12 may be performed.

Referring to FIG. 30, an upper portion of the second insulating interlayer 130 may be removed to expose upper sidewalls of the first to third lower wirings 202, 204 and 206.

In some example embodiments, the upper portion of the second insulating interlayer 130 may be removed by a CMP process and/or an etch back process.

Referring to FIG. 31, a process substantially the same as or similar to that illustrated with reference to FIG. 13 may be performed to form a capping pattern 210 on each of the first to third lower conductive metal patterns 192, 194 and 196 in each of the first to third lower wirings 202, 204 and 206.

Then, processes substantially the same as or similar to those illustrated with reference to FIGS. 16 and 17 may be performed.

Thus, a spacer 237 may be formed on the second insulating interlayer 130 to cover a sidewall of the capping pattern 210, and an upper surface and an upper sidewall of each of the first to third lower conductive barrier patterns 182, 184 and 186.

In the present embodiment, the protection pattern 220 (refer to FIGS. 14 and 15) may not be formed, but the upper portion of the second insulating interlayer 130 may be removed so that the spacer 237 may be formed to have a proper thickness by an anisotropic etching process.

Referring to FIG. 29 again, processes substantially the same as or similar to those illustrated with reference to FIGS. 25 to 28 and FIG. 24 may be performed to complete the semiconductor device.

When a process substantially the same as or similar to that illustrated with reference to FIG. 27 is performed, even though no protection pattern is formed, the first to third lower wirings 202, 204 and 206 may be covered by the capping pattern 210 and the spacer 237, and thus may not be etched.

Figure 32:
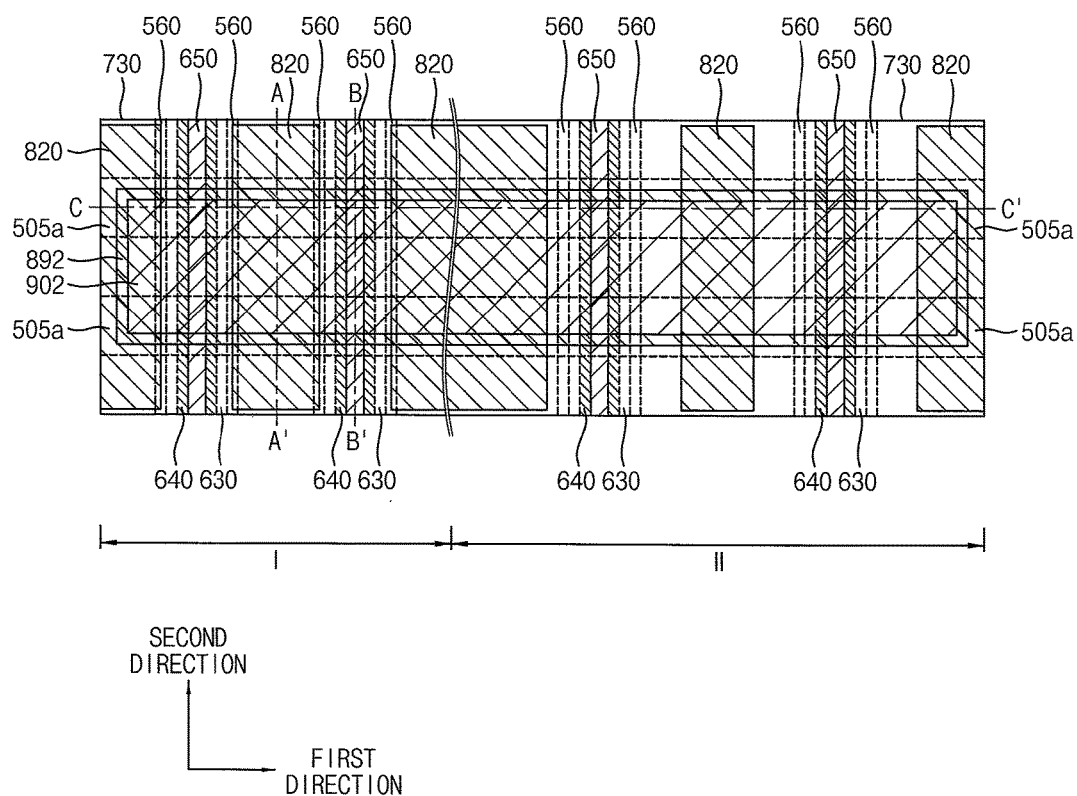
FIGS. 32 to 35 are a plan view and cross-sectional views illustrating a semiconductor device in accordance with some example embodiments.
Figure 33:
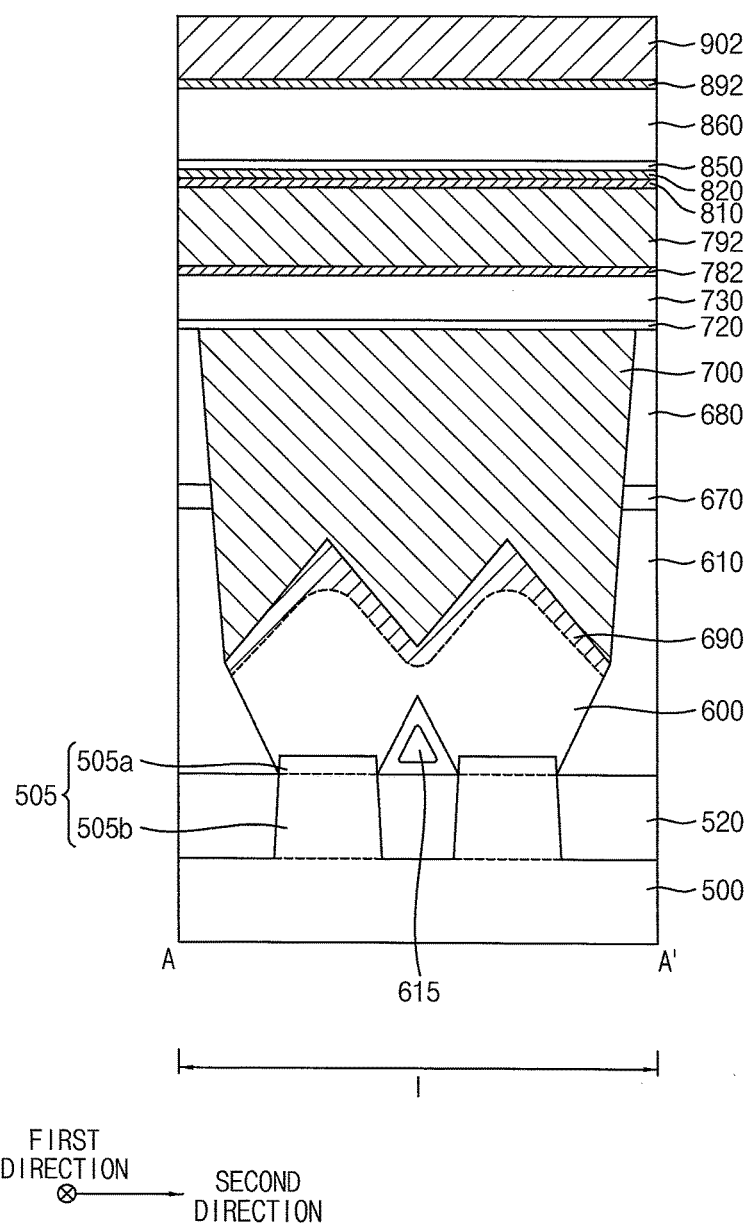
Figure 34:
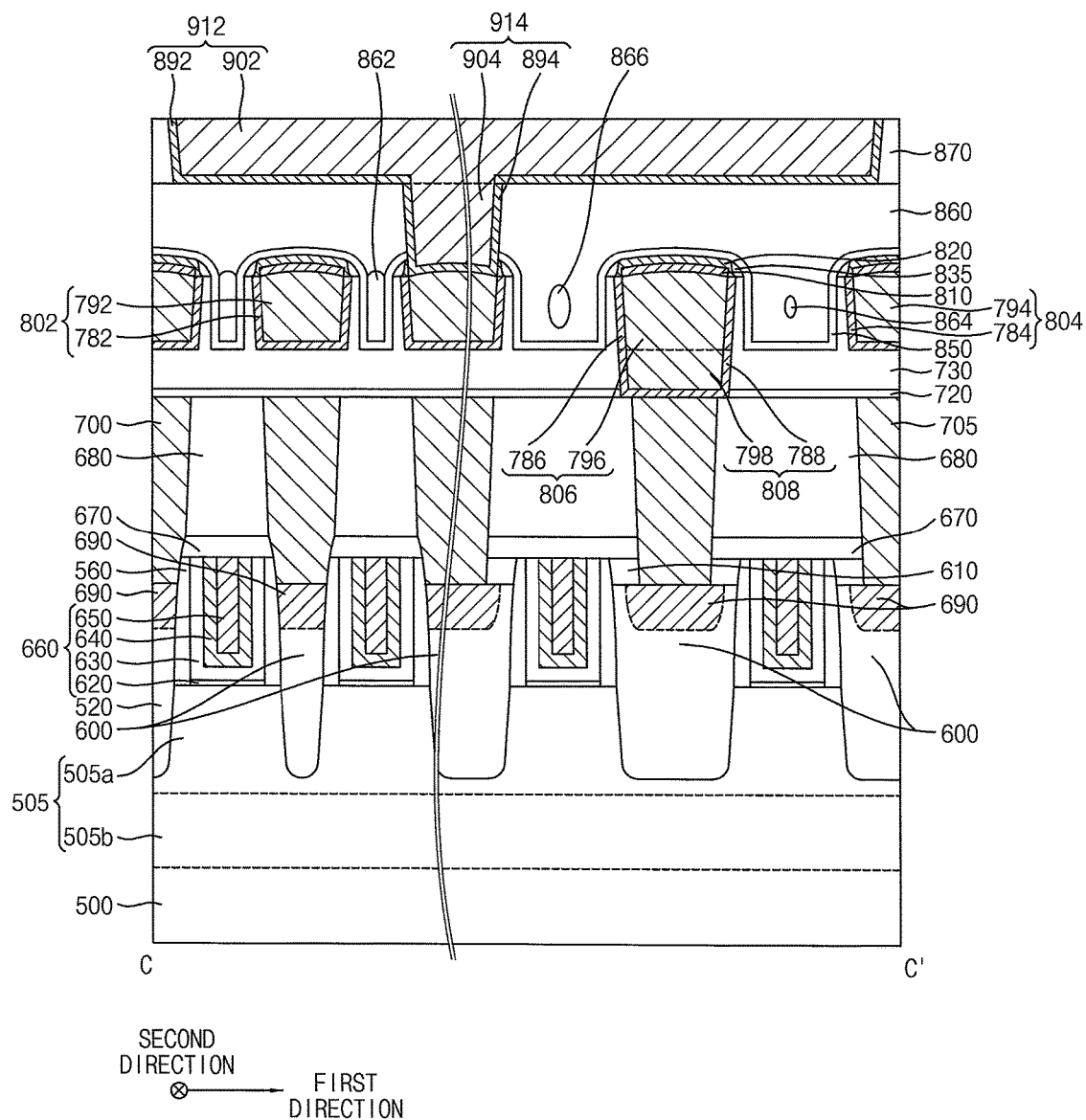
Figure 35:
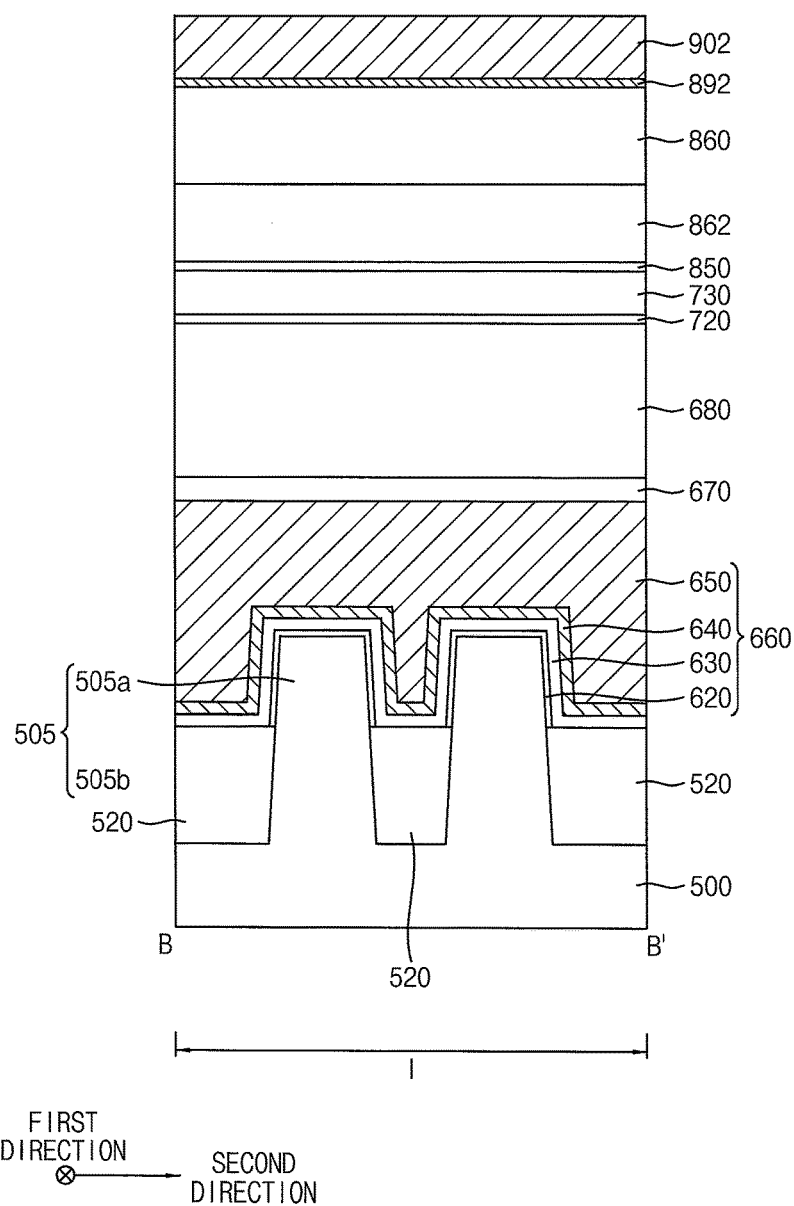

FIGS. 32 to 35 are a plan view and cross-sectional views illustrating a semiconductor device in accordance with some example embodiments. Particularly, FIG. 32 is a plan view of the semiconductor device, and FIGS. 33 to 35 are cross-sectional views of the semiconductor device. FIG. 33 is a cross-sectional view taken along a line A-A' of FIG. 32, FIG. 34 is a cross-sectional view taken along a line B-B' of FIG. 32, and FIG. 35 is a cross-sectional view taken along a line C-C' of FIG. 32.

The semiconductor device may include elements substantially the same as or similar to those of the semiconductor device of FIGS. 1 to 3, which may not be explained in detail.

Referring to FIGS. 32 to 35, the semiconductor device may include a transistor, insulating interlayers 680, 730, 860 and 870, lower wirings 802, 804 and 806, a lower via 808, an upper wiring 912, an upper via 914, a protection pattern 820 and a spacer 835 on a substrate 500. The semiconductor device may further include an insulation layer 610, a lower capping layer 670, a metal silicide pattern 690, contact plugs 700 and 705, and an insulating barrier layer 850.

The substrate 500 may include a semiconductor material, e.g., silicon, germanium, silicon-germanium, or III-V semiconductor compounds, e.g., GaP, GaAs, GaSb, etc. In an example embodiment, the substrate 100 may be an SOI substrate or a GOI substrate.

The substrate 500 may include first and second regions I and II. The first region I may be a region in which the first lower wiring 802 disposed at a relatively short distance from each other may be formed, and the second region II may be a region in which the second and third lower wirings 804 and 806 disposed at a relatively wide distance from each other may be formed.

An isolation pattern 520 may be formed on the substrate 500, and thus a field region having a top surface covered by the isolation pattern 520 and an active region having a top surface not covered by the isolation pattern 520 may be defined in the substrate 500. The active region may have a fin-like shape protruding from the substrate 500, and thus may be referred to as an active fin 505. The isolation pattern 520 may include an oxide, e.g., silicon oxide.

In some example embodiments, the active fin 505 may extend in a first direction substantially parallel to a top surface of the substrate 500, and a plurality of active fins 505 may be disposed in a second direction substantially parallel to the top surface of the substrate 500 and substantially perpendicular to the first direction. In some example embodiments, the active fin 505 may include a lower active pattern 505b of which a sidewall may be covered by the isolation pattern 520, and an upper active pattern 505a protruding from a top surface of the isolation pattern 520. In some example embodiments, the upper active pattern 505a may have a width in the second direction slightly smaller than a width of the lower active pattern 505b in the second direction.

The transistor may include a gate structure 660 and a source/drain layer 600 on the substrate 500.

In some example embodiments, the gate structure 660 may extend in the second direction on the active fins 505 of the substrate 500 and the isolation pattern 520, and a plurality of gate structures 660 may be formed in the first direction. Ones of the gate structures 660 in the first region I may be disposed at a distance from each other smaller than a distance between ones of the gate structures 660 disposed in the second region II.

The gate structure 660 may include an interface pattern 620, a gate insulation pattern 630, a work function control pattern 640, and a gate electrode 650 sequentially stacked. Gate spacers 560 may be further formed on sidewalls of the gate structure 660 opposite to each other in the first direction. The interface pattern 620 may be formed on the active fin 505, the gate insulation pattern 630 may be formed on the interface pattern 620 and inner sidewalls of the gate spacers 560, the work function control pattern 640 may be formed on the gate insulation pattern 630, and the gate electrode 650 may be formed on the work function control pattern 640. Thus, a bottom and a sidewall of the gate electrode 650 may be covered by the work function control pattern 640. In some embodiments, the interface pattern 620 may not be formed.

The interface pattern 620 may include an oxide, e.g., silicon oxide, the gate insulation pattern 630 may include a metal oxide having a high dielectric constant, e.g., hafnium oxide, tantalum oxide, zirconium oxide, or the like. The work function control pattern 640 may include a metal nitride or a metal alloy, e.g., titanium nitride, titanium aluminum, titanium aluminum nitride, tantalum nitride, tantalum aluminum nitride, etc., and the gate electrode 650 may include a material having a low resistance, e.g., a metal such as aluminum, copper, tantalum, etc., or a metal nitride thereof. The gate spacer 560 may include a nitride, e.g., silicon nitride, silicon oxycarbonitride, etc.

The source/drain layer 600 may be formed on the active fins 505 at sides of the gate structure 660 opposite to each other in the first direction. The source/drain layer 600 together with the gate structure 660 may form a negative-channel metal oxide semiconductor (NMOS) transistor or a positive-channel metal oxide semiconductor (PMOS) transistor according to the conductivity type of impurities doped thereinto. When the source/drain layer 600 forms the NMOS transistor, the source/drain layer 600 may be a single crystalline silicon carbide layer doped with n-type impurities or a single crystalline silicon layer doped with n-type impurities. When the source/drain layer 600 forms the PMOS transistor, the source/drain layer 600 may be a single crystalline silicon-germanium layer doped with p-type impurities.

The source/drain layer 600 may grow both in the vertical and horizontal directions. The source/drain layer 600 may fill a recess (not shown) on the active fin 505, and may contact a portion of the gate spacer 560 at sides of the gate structure 660 opposite to each other in the first direction. A cross-section of the source/drain layer 600 may have a shape of pentagon or hexagon, and when the active fins 505 adjacent to each other in the second direction are spaced apart from each other at a small distance, the source/drain layers 600 adjacent to each other in the second direction may be connected to each other to form a single layer.

The metal silicide pattern 690 may be formed at upper portions of the source/drain layer 600 contacting the contact plugs 700 and 705. The metal silicide pattern 690 may include a metal silicide, e.g., cobalt silicide, nickel silicide, titanium silicide, etc.

The insulation layer 610 may be formed on the substrate 500 and the isolation pattern 520. The insulation layer 610 may surround the gate spacers 560 on the sidewalls of the gate structure 660, and may cover the source/drain layers 600 and the metal silicide pattern 690. The insulation layer 610 may include an oxide, e.g., silicon oxide.

The lower capping layer 670 may be formed on the gate structure 660, the gate spacer 560 and the insulation layer 610, and may include a nitride, e.g., silicon nitride.

The first insulating interlayer 680 may be formed on the lower capping layer 670, and may include an oxide, e.g., silicon oxide. The first insulating interlayer 680 may include a material substantially the same as or different from a material of the insulation layer 610.

Each of the first and second contact plugs 700 and 705 may penetrate through the insulation layer 610 and the first insulating interlayer 680, and contact top surfaces of the source/drain layers 600. The first and second contact plugs 700 and 705 may contact the top surfaces of the source/drain layers 600 in the first and second regions I and II, respectively. In some example embodiments, each of the first contact plugs 700 may be self-aligned with the gate spacers 560 on the sidewalls of the gate structure 660, while each of the second contact plugs 705 may not be self-aligned with the gate spacers 560. However, the inventive concepts may not be limited thereto. The first contact plugs 700 may be disposed in the first region I at a distance from each other smaller than a distance between the second contact plugs 705 disposed in the second region II.

The first and second contact plugs 700 and 705 may include a metal, a metal nitride, and/or doped polysilicon.

The etch stop layer 720 may be formed on the first insulating interlayer 680, and the first and second contact plugs 700 and 705. The etch stop layer 720 may include a nitride, e.g., silicon nitride.

The second to fourth insulating interlayers 730, 860 and 870 sequentially stacked may include a low-k dielectric material, e.g., silicon oxide doped with carbon (SiCOH) or silicon oxide doped with fluorine (F—SiO$_2$), a porous silicon oxide, spin on organic polymer, or an inorganic polymer, e.g., hydrogen silsesquioxane (HSSQ), methyl silsesquioxane (MSSQ), etc. The second to fourth insulating interlayers 730, 860 and 870 may include substantially the same material or different materials. The second and third insulating interlayers 730 and 860 may define a lower insulating interlayer structure.

The first to third wirings 802, 804 and 806 may penetrate through an upper portion of the second insulating interlayer 730. The lower via 808 may penetrate through a lower portion of the second insulating interlayer 730 and the etch stop layer 720, and may contact the second contact plug 705. The lower via 808 and the third lower wiring 806 may be sequentially stacked and contact each other.

In an example embodiment, each of the first to third lower wirings 802, 804 and 806 may extend in the second direction. The lower via 808 may have a width in the first direction substantially the same as a width of the third lower wiring 806 in the first direction, and may have a width in the second direction smaller than a width of the third lower wiring 806 in the second direction.

However, the inventive concepts may not be limited thereto, and the first to third lower wirings 802, 804 and 806 and the lower via 808 may have various sizes, positions and distances from each other.

The first lower wiring 802 may include a first lower conductive barrier pattern 782 and a first lower metal pattern 792 sequentially stacked, the second lower wiring 804 may include a second lower conductive barrier pattern 784 and a second lower metal pattern 794 sequentially stacked, the third lower wiring 806 may include a third lower conductive barrier pattern 786 and a third lower metal pattern 796 sequentially stacked, and the lower via 808 may include a fourth lower conductive barrier pattern 788 and a fourth lower metal pattern 798 sequentially stacked. Each of the first, second and fourth lower conductive barrier patterns 782, 784 and 788 may cover a bottom and a sidewall of each of the first, second and fourth lower metal patterns 792, 794 and 798, and the third lower conductive barrier pattern 786 may cover a portion of a bottom and a sidewall of the third lower metal pattern 796. The third and fourth lower metal patterns 796 and 798 may contact each other, and the third and fourth lower conductive barrier patterns 786 and 788 may contact each other.

The first to fourth lower metal patterns 792, 794, 796 and 798 may include a metal, e.g., copper, aluminum, tungsten, etc., and the first to fourth lower conductive barrier patterns 782, 784, 786 and 788 may include a metal nitride, e.g., tantalum nitride, titanium nitride, etc., and/or a metal, e.g., tantalum, titanium, etc. In some example embodiments, the first to fourth lower metal patterns 792, 794, 796 and 798 may include substantially the same material.

The capping pattern 810 may be formed on an upper surface of each of the first to third lower wirings 802, 804 and 806. In some example embodiments, the capping pattern 810 may be formed on each of the first to third lower metal patterns 792, 794 and 796 in each of the first to third lower wirings 802, 804 and 806. The capping pattern 810 may include cobalt (Co), ruthenium (Ru), tungsten (W), cobalt tungsten phosphorus (CoWP), etc.

The protection pattern 820 may cover an upper surface and a sidewall of the capping pattern 810 on each of the first to third lower metal patterns 792, 794 and 796, and may cover a top surface of each of the first to third lower conductive barrier patterns 782, 784 and 786. Thus, the protection pattern 820 may be formed on each of the first to third lower wirings 802, 804 and 806. The protection pattern 820 may include a metal nitride. For example, the protection pattern 820 may include aluminum nitride, or a nitride of a noble metal, e.g., gold, silver, platinum, etc.

The spacer 835 may be formed on a sidewall of the protection pattern 820 on the second insulating interlayer 730. The spacer 835 on the sidewall of the protection pattern 820 may have a thickness varying according to the misalignment margin of the upper via 914. The spacer 835 may include a nitride, e.g., silicon nitride.

The insulating barrier layer 850 may cover upper surfaces of the protection pattern 820 and the spacer 835, and may surround sidewalls of the first to third lower wirings 802, 804 and 806.

The insulating barrier layer 850 may include a nitride, e.g., silicon nitride, silicon carbonitride, silicon carboxide, silicon oxycarbonitride, etc. When the spacer 835 includes silicon nitride, the insulating barrier layer 850 may include a material different from that of the spacer 235, e.g., silicon carbonitride, silicon carboxide or silicon oxycarbonitride.

The third insulating interlayer 860 may be formed on the insulating barrier layer 850, and first, second and third air gaps 862, 864 and 866 may be formed between the third insulating interlayer 860 and the insulating barrier layer 850 or in the third insulating interlayer 860.

The upper wiring 912 may penetrate through the fourth insulating interlayer 870. The upper via 914 may penetrate through the third insulating interlayer 860, the insulating barrier layer 850, the protection pattern 820 and the capping pattern 810, and may contact the upper surface of the first lower metal pattern 792 of the first lower wiring 802. The upper via 914 and the upper wiring 912 may be sequentially stacked and contact each other. In an example embodiment, the upper wiring 912 may extend in the first direction, and the upper via 914 may have a width in the first direction smaller than a width of the upper wiring 912 in the first direction.

FIGS. 32 to 35 show that the upper via 914 serving as a landing via contacts the upper surface of the first lower wiring 802, however, the inventive concepts may not be limited thereto, and the upper via 914 may contact the upper surface of the second lower wiring 804 or the third lower wiring 806. In some example embodiments, a plurality of upper vias 914 may be formed.

The upper wiring 912 may include a first upper conductive barrier pattern 892 and a first upper metal pattern 902 sequentially stacked, and the upper via 914 may include a second upper conductive barrier pattern 894 and a second upper metal pattern 904 sequentially stacked. The first upper conductive barrier pattern 892 may cover a portion of a bottom and a sidewall of the first upper metal pattern 902, and the second upper conductive barrier pattern 894 may cover a bottom and a sidewall of the second upper metal pattern 904. The second and first upper conductive barrier patterns 894 and 892 may be sequentially stacked and contact each other.

The upper via 914 and the upper wiring 912 sequentially stacked may define an upper wiring structure. The upper via 914 may contact the upper surface of the first lower wiring 802, and thus may be referred to as a landing via.

The first and second upper metal patterns 902 and 904 may include a metal, e.g., copper, aluminum, tungsten, etc., and the first and second upper conductive barrier patterns 892 and 894 may include a metal nitride, e.g., tantalum nitride, titanium nitride, etc., and/or a metal, e.g., tantalum, titanium, etc.

FIGS. 36 to 60 are plan views and cross-sectional views illustrating stages of a method of manufacturing a semiconductor device in accordance with some example embodiments. Particularly, FIGS. 36, 38, 41, 44, 47, 50, 53, 56 and 59 are plan views, and FIGS. 37, 39-40, 42-43, 45-46, 48-49, 51-52, 54-55, 57-58 and 60 are cross-sectional views.

Figure 39:
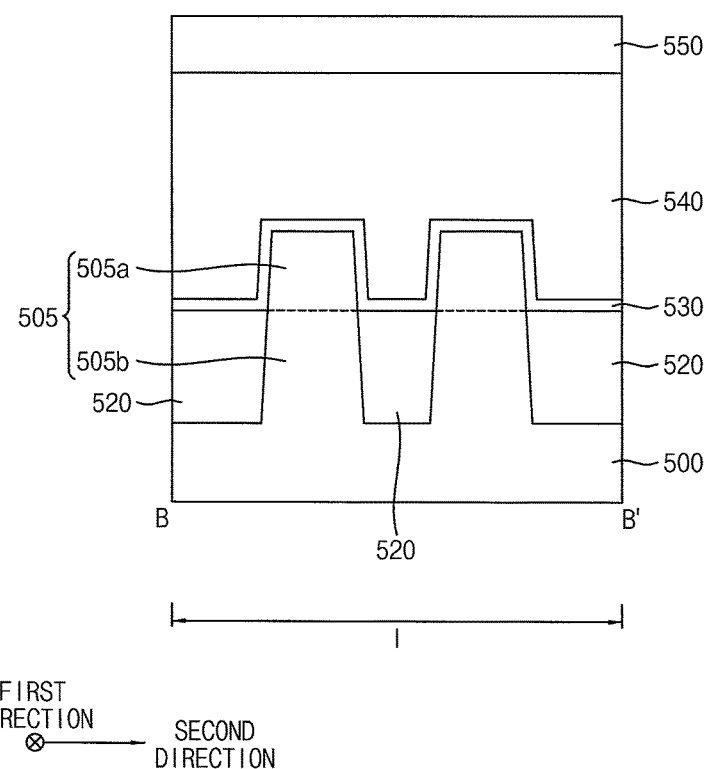
Figure 54:
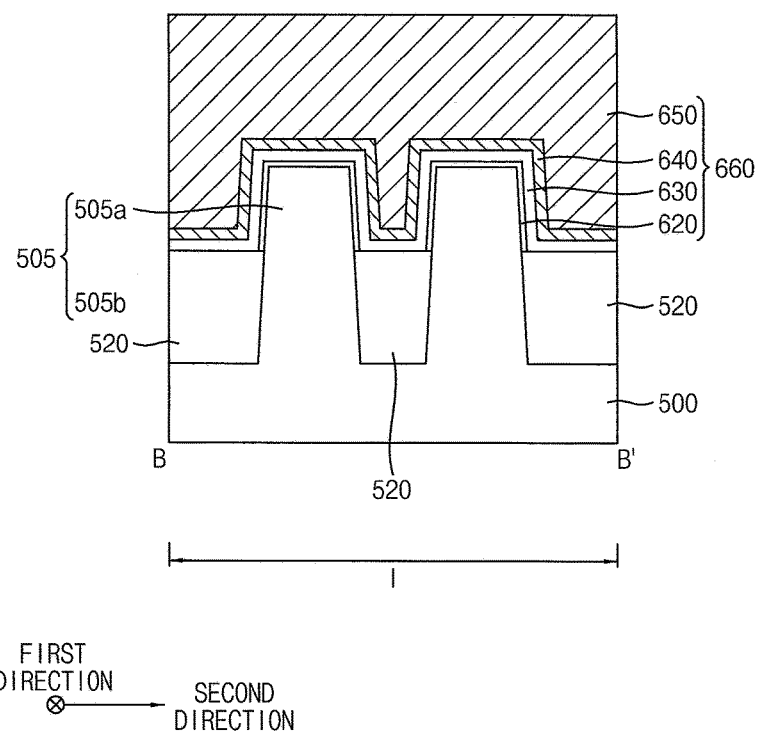

FIGS. 37, 42, 45, 48, 51 and 57 are cross-sectional views taken along lines A-A' of corresponding plan views, FIGS. 39 and 54 are cross-sectional views taken along lines B-B' of corresponding plan views, and FIGS. 40, 43, 46, 49, 52, 55, 58 and 60 are cross-sectional views taken along lines C-C' of corresponding plan views.

Figure 36:
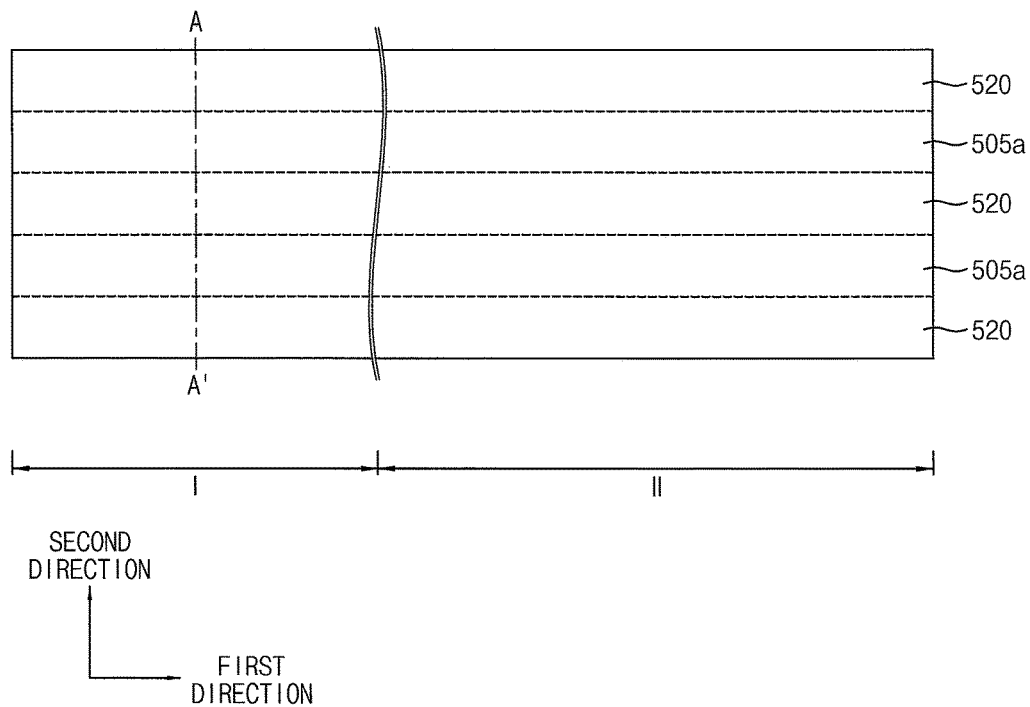
Figure 37:
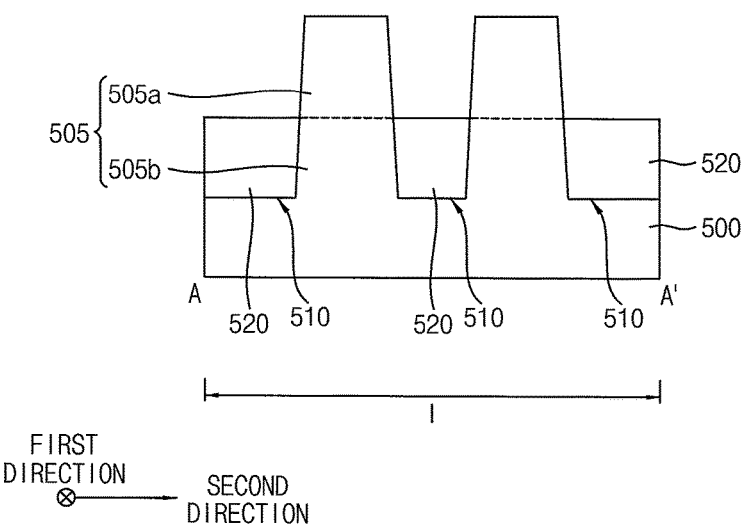

Referring to FIGS. 36 and 37, an upper portion of a substrate 500 may be partially removed to form fifth recesses 510, and an isolation pattern 520 may be formed to fill a lower portion of each of the fifth recesses 510.

The substrate 500 may include a semiconductor material, e.g., silicon, germanium, silicon-germanium, etc., or III-V semiconductor compounds, e.g., GaP, GaAs, GaSb, etc. In an example embodiment, the substrate 500 may be an SOI substrate or a GOI substrate. The substrate 500 may include first and second regions I and II.

In some example embodiments, the isolation pattern 520 may be formed by forming an isolation layer on the substrate 500 to sufficiently fill the fifth recesses 510, planarizing the isolation layer until a top surface of the substrate 500 may be exposed, and removing an upper portion of the isolation layer to expose upper portions of the fifth recesses 510. The isolation layer may be formed of an oxide, e.g., silicon oxide.

As the isolation pattern 520 may be formed on the substrate 500, a field region having a top surface covered by the isolation pattern 520 and an active region having a top surface not covered by the isolation pattern 520 may be defined in the substrate 500. The active region may have a fin-like shape protruding from the substrate 500, and thus may be referred to as an active fin 505.

In some example embodiments, the active fin 505 may be formed to extend in a first direction substantially parallel to the top surface of the substrate 500, and a plurality of active fins 505 may be formed in a second direction substantially parallel to the top surface of the substrate 500 and substantially perpendicular to the first direction.

In some example embodiments, the active fin 505 may include a lower active pattern 505b of which a sidewall may be covered by the isolation pattern 520, and an upper active pattern 505a protruding from a top surface of the isolation pattern 520. In some example embodiments, the upper active pattern 505a may have a width in the second direction slightly smaller than a width of the lower active pattern 505b in the second direction.

Figure 38:
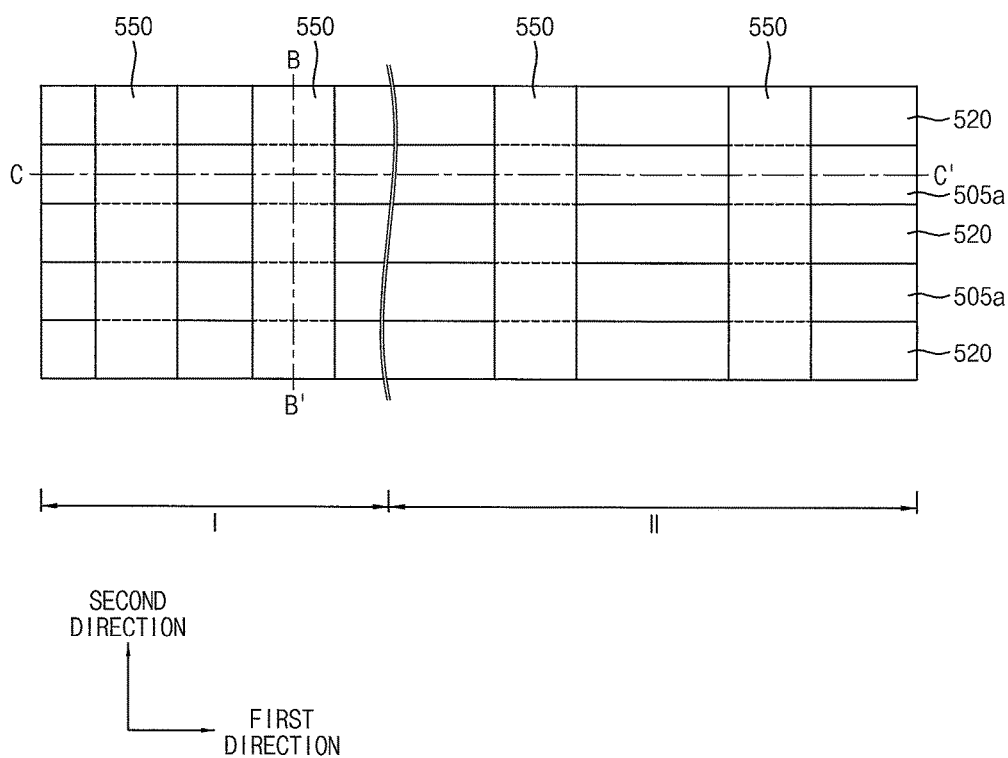
Figure 40:
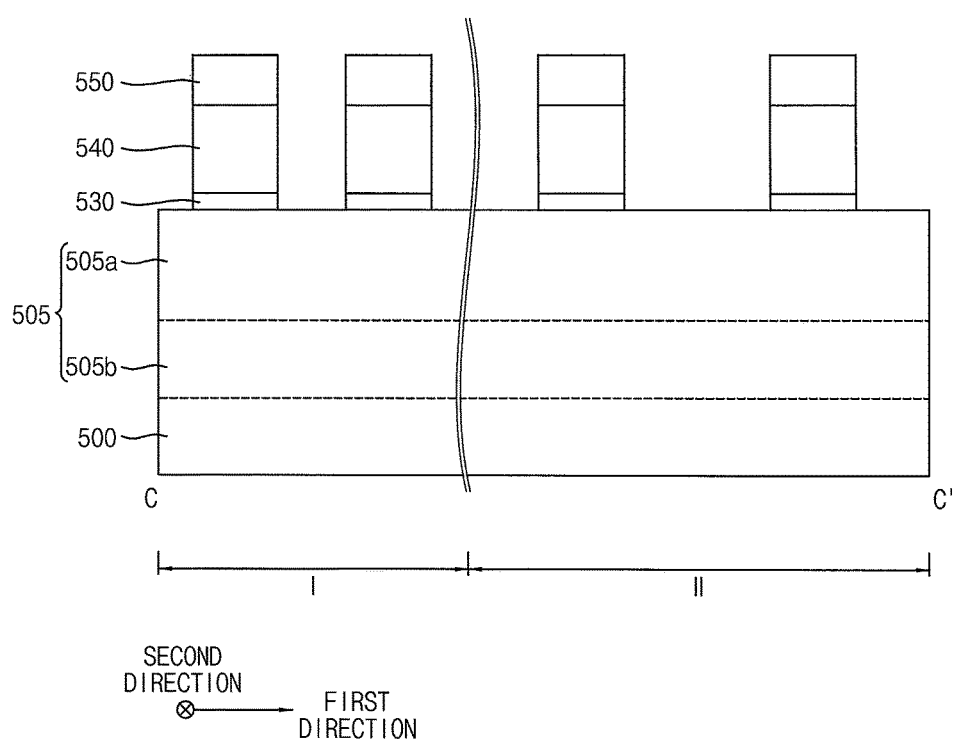

Referring to FIGS. 38 to 40, a dummy gate layer structure may be formed on the substrate 500.

The dummy gate structure may be formed by sequentially forming a dummy gate insulation layer, a dummy gate electrode layer, and a dummy gate mask layer on the active fin 505 of the substrate 500 and the isolation pattern 520, patterning the dummy gate mask layer by a photolithography process using a photoresist pattern (not shown) to form a dummy gate mask 550, and sequentially etching the dummy gate electrode layer and the dummy gate insulation layer using the dummy gate mask 550 as an etching mask. Thus, the dummy gate structure may be formed to include a dummy gate insulation pattern 530, a dummy gate electrode 540 and the dummy gate mask 550 sequentially stacked on the active fin 505 of the substrate 500 and a portion of the isolation pattern 520 adjacent to the active fin 505 in the second direction.

The dummy gate insulation layer may be formed of an oxide, e.g., silicon oxide, the dummy gate electrode layer may be formed of, e.g., polysilicon, and the dummy gate mask layer may be formed of a nitride, e.g., silicon nitride. The dummy gate insulation layer may be formed by a CVD process, an ALD process, or the like. Alternatively, the dummy gate insulation layer may be formed by a thermal oxidation process on an upper portion of the substrate 500, and in this case, the dummy gate insulation layer may not be formed on the isolation pattern 520 but may be formed only on the active fin 505. The dummy gate electrode layer, and the dummy gate mask layer may be also formed by a CVD process, an ALD process, etc.

In some example embodiments, the dummy gate structure may be formed to extend in the second direction on the active fins 505 of the substrate 500 and the isolation pattern 520, and a plurality of dummy gate structures may be formed in the first direction. In some example embodiments, ones of the dummy gate structures in the first region I may be spaced apart from each other by a distance smaller than a distance between ones of the dummy gate structures spaced apart from each other in the second direction II.

An ion implantation process may be further performed to form an impurity region (not shown) at an upper portion of the active fin 505 adjacent the dummy gate structure.

Figure 41:
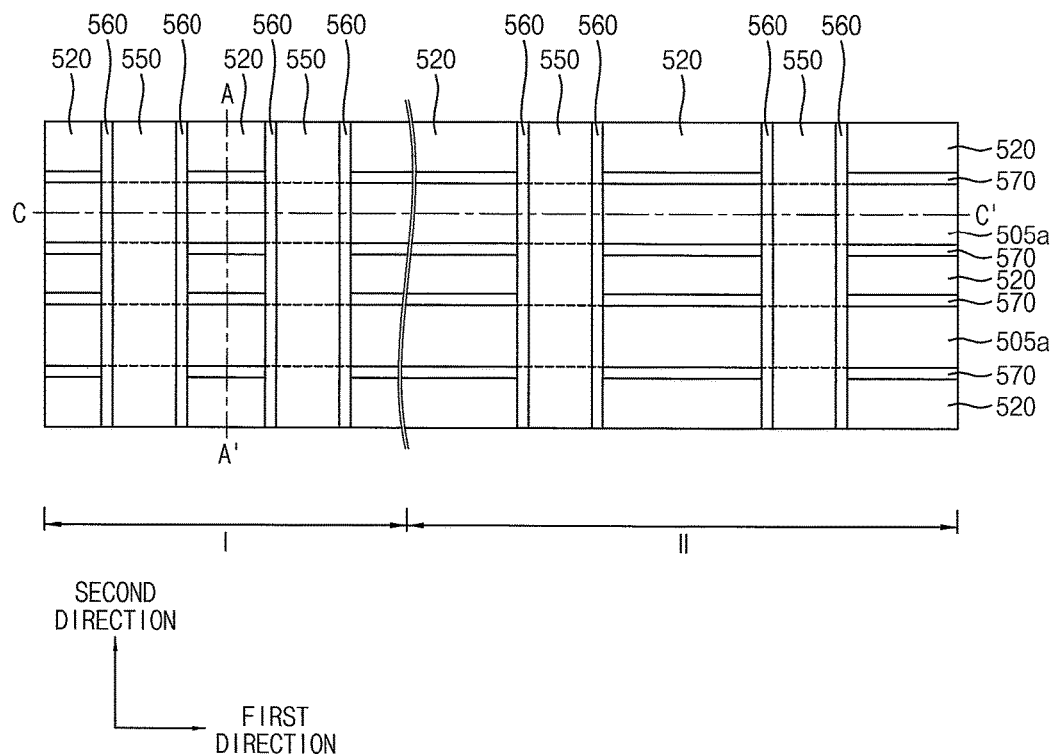
Figure 42:
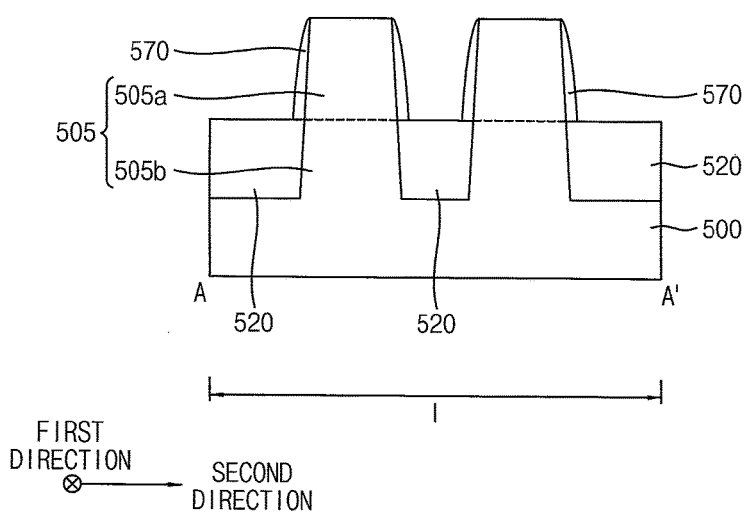
Figure 43:
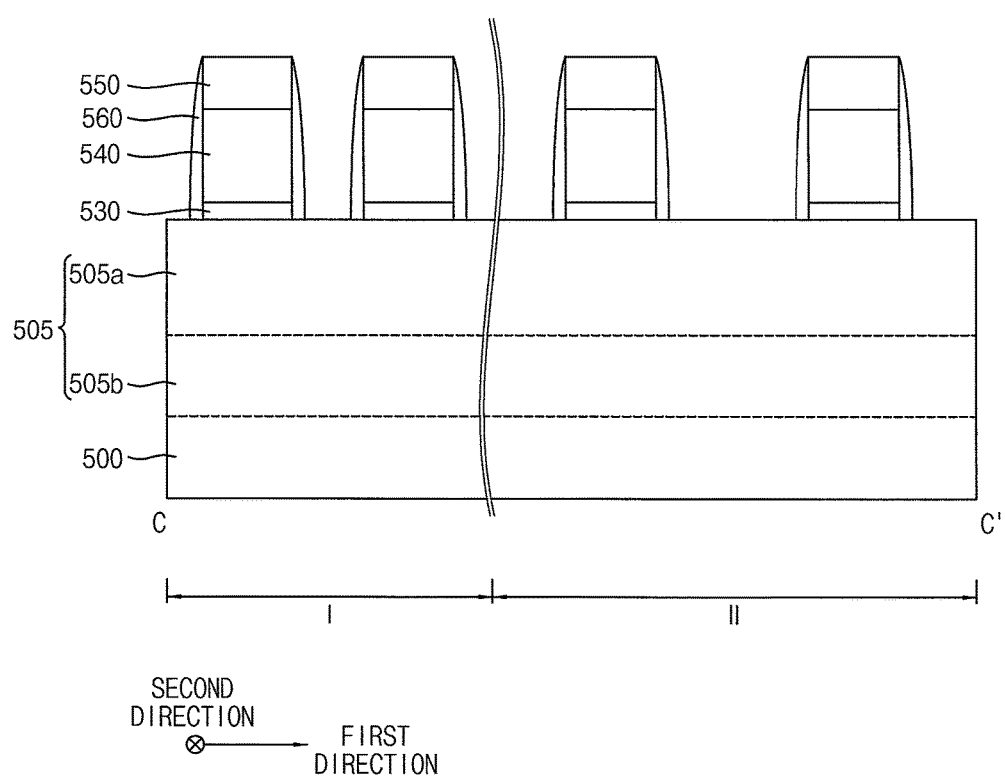

Referring to FIGS. 41 to 43, a gate spacer 560 and a fin spacer 570 may be formed on sidewalls of the dummy gate structure and sidewalls of the active fin 505, respectively.

In some example embodiments, the gate spacer 560 and the fin spacer 570 may be formed by forming a spacer layer on the dummy gate structure, the active fin 505 and the isolation pattern 520, and anisotropically etching the spacer layer. The spacer layer may be formed of a nitride, e.g., silicon nitride, silicon carbonitride, etc.

The gate spacer 560 may be formed on the sidewalls of the dummy gate structure opposite to each other in the first direction, and the fin spacer 570 may be formed on the sidewalls of the active fin 505 opposite to each other in the second direction.

Figure 44:
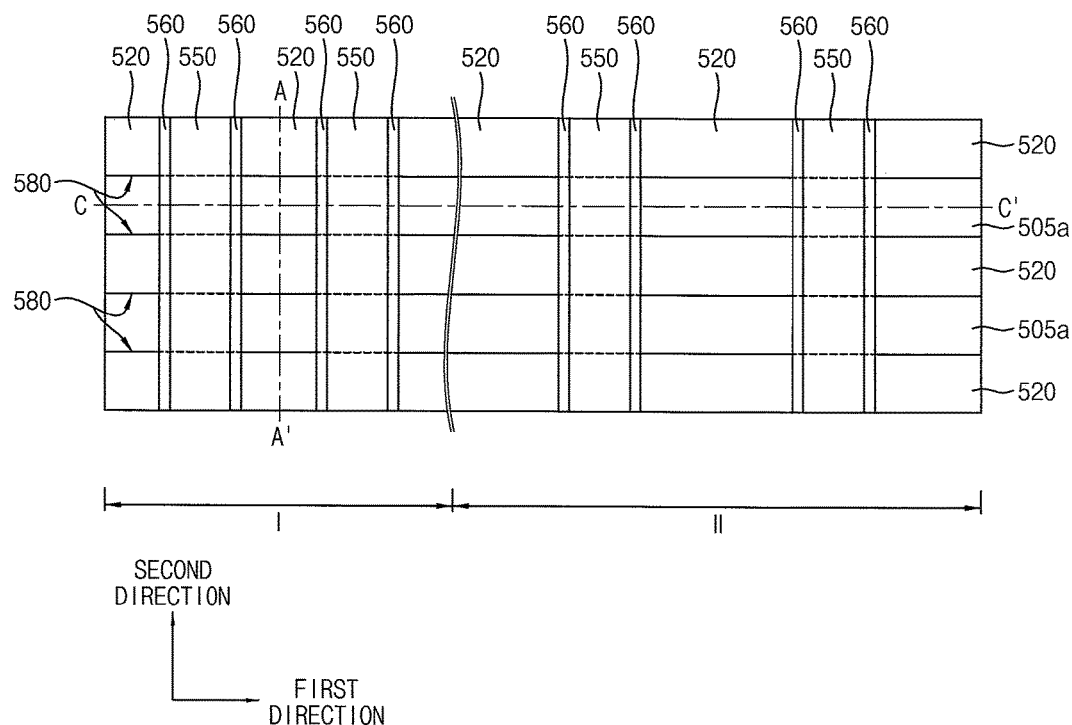
Figure 45:
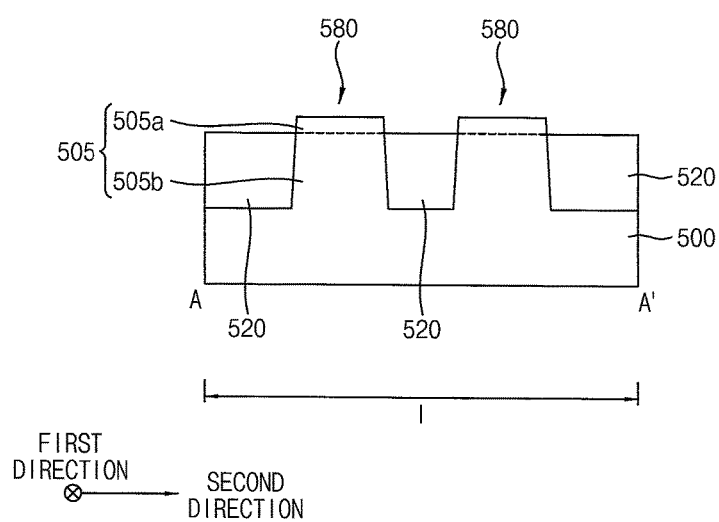
Figure 46:
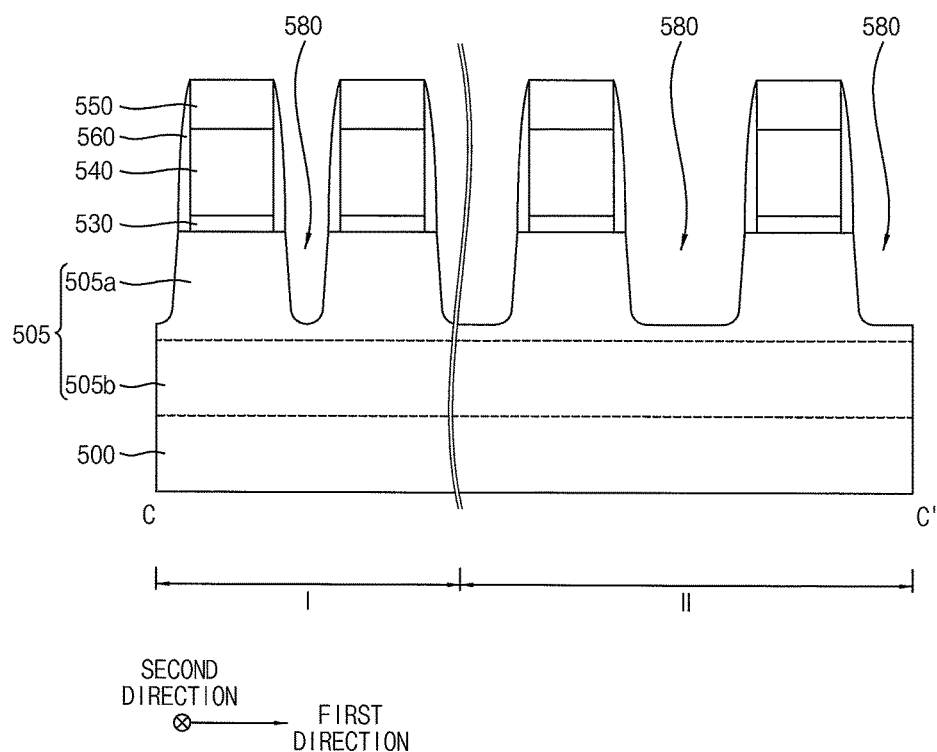

Referring to FIGS. 44 to 46, an upper portion of the active fin 505 adjacent the dummy gate structure may be etched to form a sixth recess 580.

Particularly, the upper portion of the active fin 505 may be etched using the dummy gate structure and the gate spacer 560 as an etching mask to form the sixth recess 580. In the etching process, the fin spacer 570 may be also removed. FIGS. 44 to 46 show that the upper active pattern 505a in the active fin 505 is partially etched to form the sixth recess 580, however, the inventive concepts may not be limited thereto. For example, the sixth recess 580 may be formed by partially removing the upper active pattern 505a to expose the lower active pattern 505b, and further, a portion of the lower active pattern 505b may be removed when the sixth recess 580 is formed.

As ones of the dummy gate structures may be formed to be spaced apart from each other in the first region I by a distance smaller than a distance between ones of the dummy gate structures spaced apart from each other in the second region II, the sixth recess 580 in the first region I may be formed to have a width in the first direction smaller than a width in the first direction of the sixth recess 580 in the second region II.

Figure 48:
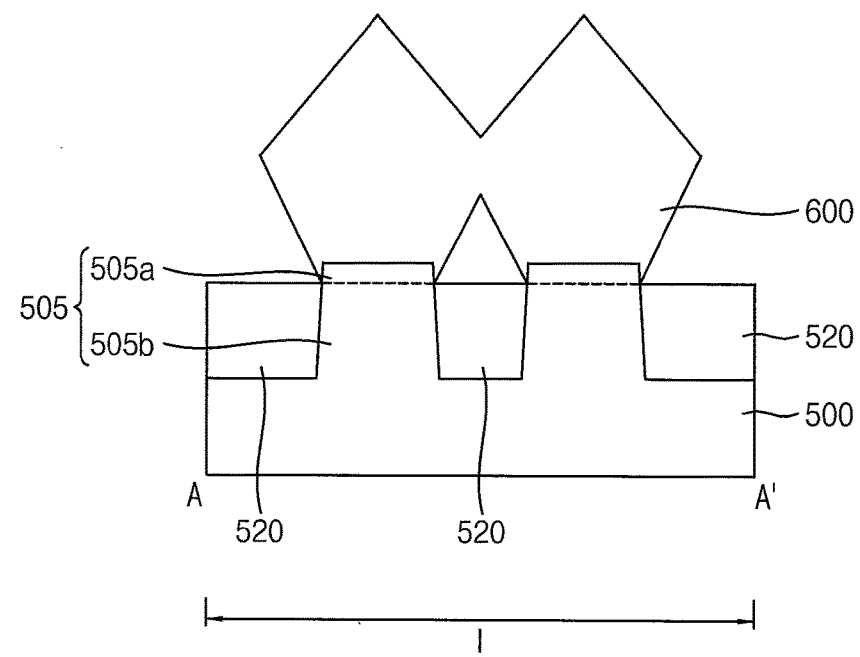
Figure 49:
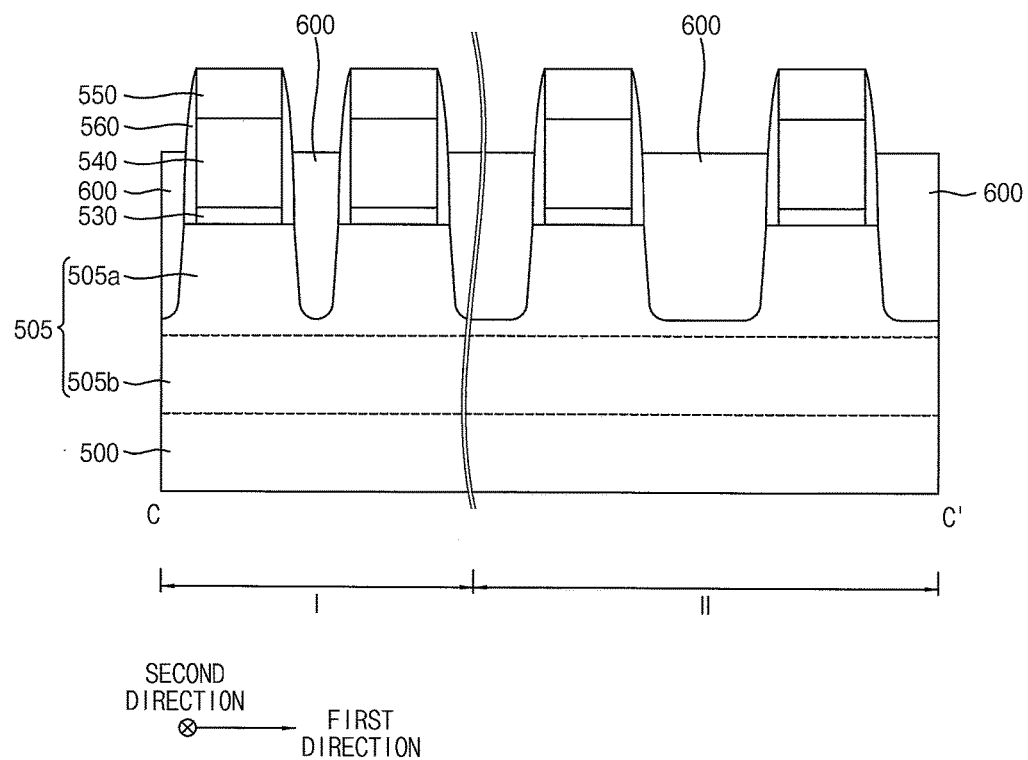

Referring to FIGS. 47 to 49, a source/drain layer 600 may be formed on the active fin 505 to fill the sixth recess 580.

In some example embodiments, the source/drain layer 600 may be formed by a selective epitaxial growth (SEG) process using a top surface of the active fin 505 exposed by the sixth recess 580 as a seed.

In some example embodiments, the SEG process may be performed using a silicon source gas, e.g., disilane (Si2H6) gas and a carbon source gas, e.g., monomethylsilane (SiH3CH3) gas to form a single crystalline silicon carbide layer. Alternatively, the SEG process may be performed using only a silicon source gas, e.g., disilane (Si2H6) gas to form a single crystalline silicon layer. An n-type impurity source gas, e.g., phosphine (PH3) gas may be also used to form a single crystalline silicon carbide layer doped with n-type impurities or a single crystalline silicon layer doped with n-type impurities. Accordingly, the source/drain layer 600 may serve as a source/drain region of an NMOS transistor.

Alternatively, the SEG process may be performed using a silicon source gas, e.g., dichlorosilane ($SiH_2Cl_2$) gas, and a germanium source gas, e.g., germane ($GeH_4$) gas to form a single crystalline silicon-germanium layer. A p-type impurity source gas, e.g., diborane ($B_2H_6$) gas may be also used to form a single crystalline silicon-germanium layer doped with p-type impurities. Accordingly, the source/drain layer 600 may serve as a source/drain region of a PMOS transistor.

The source/drain layer 600 may grow both in vertical and horizontal directions, and thus may not only fill the sixth recess 580 but also contact a portion of the gate spacer 560. An upper portion of the source/drain layer 600 may have a cross-section taken along the second direction of which a shape may be pentagon or hexagon. When the active fins 505 are spaced apart from each other in the second direction by a short distance, neighboring ones of the source/drain layers 600 in the second direction may be merged with each other to form a single layer. FIGS. 47 to 49 show that one source/drain layer 600 merged from a plurality of source/drain layers 600 that have grown on neighboring ones of the active fins 505 is shown.

Figure 50:
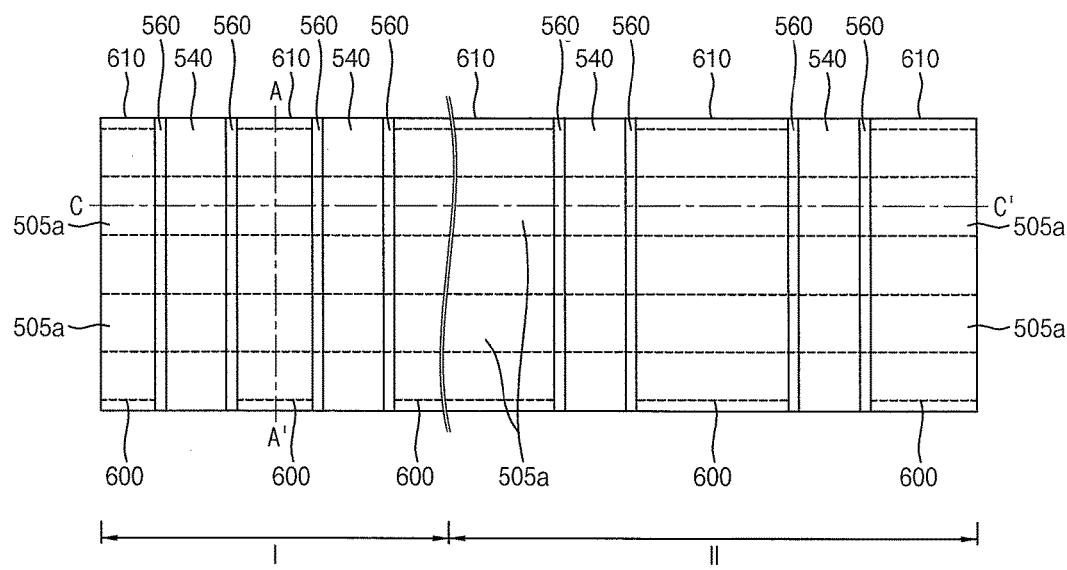
Figure 51:
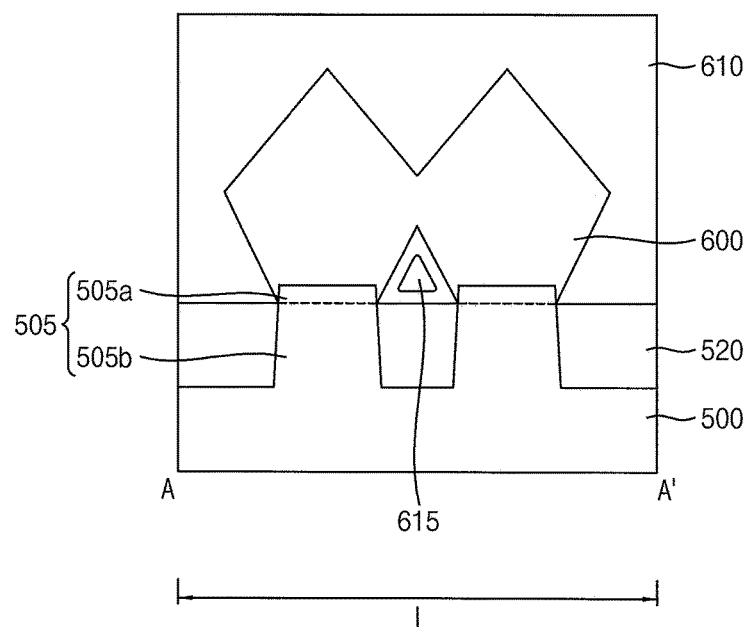
Figure 52:
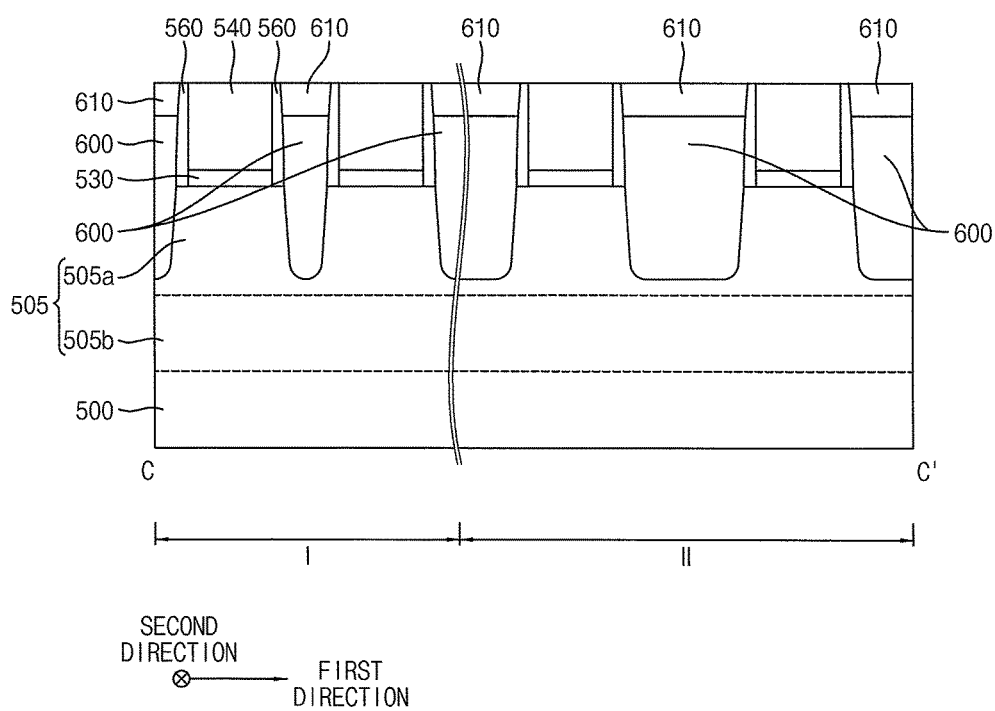

Referring to FIGS. 50 to 52, an insulation layer 610 may be formed on the active fin 505 and the isolation pattern 520 to cover the dummy gate structure, the gate spacer 560 and the source/drain layer 600, and the insulation layer 610 may be planarized until a top surface of the dummy gate electrode 540 of the dummy gate structure may be exposed. The dummy gate mask 550 may be also removed, and an upper portion of the gate spacer 560 may be also removed. The insulation layer 610 may not completely fill a space between the merged source/drain layer 600 and the isolation pattern 520, and thus a fourth air gap 615 may be formed in the space.

The insulation layer 610 may be formed of an oxide, e.g., silicon oxide. The planarization process may be performed by a CMP process and/or an etch back process.

Figure 53:
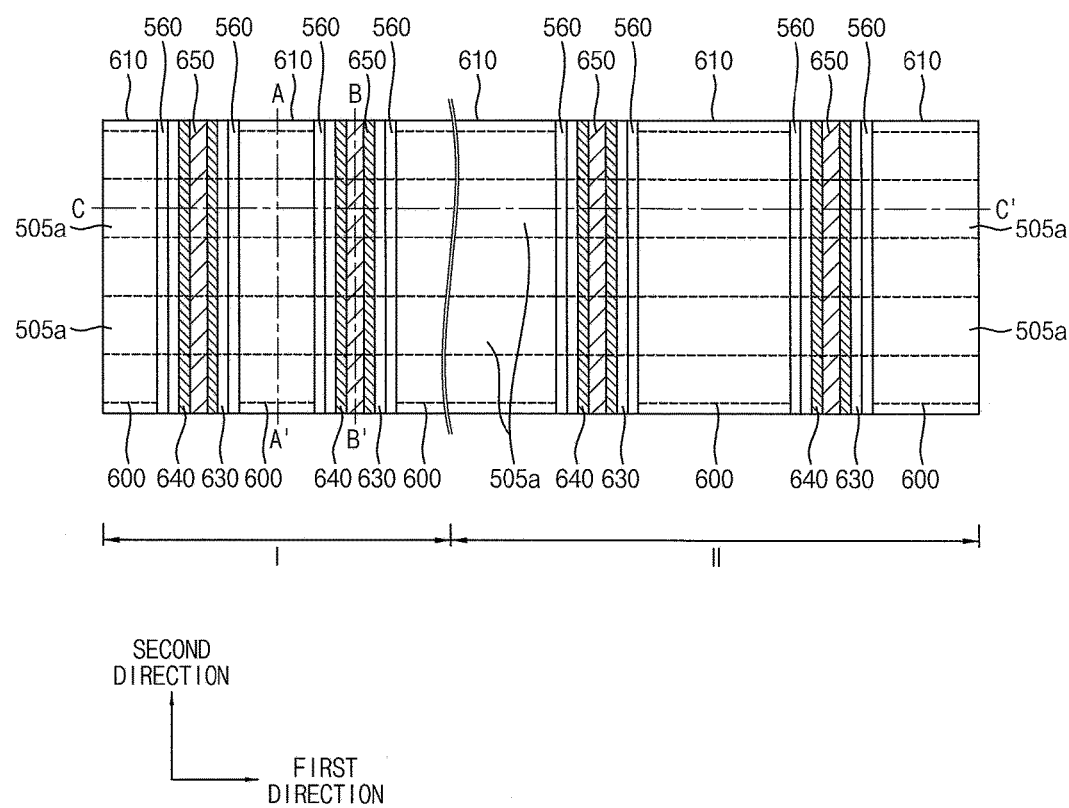
Figure 55:
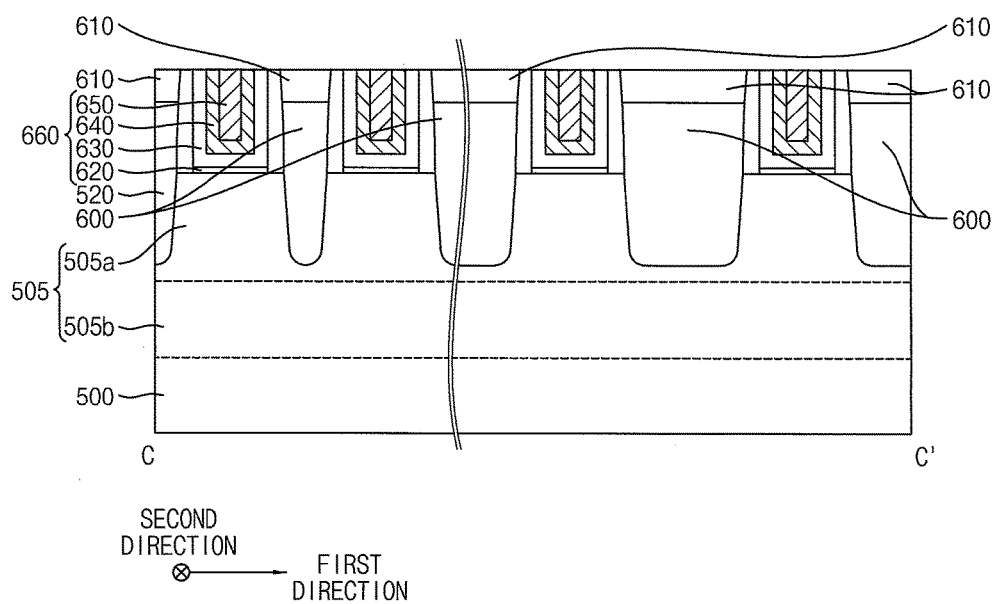

Referring to FIGS. 53 to 55, the exposed dummy gate electrode 540, and the dummy gate insulation pattern 530 thereunder may be removed to form an opening (not shown) exposing a top surface of the active fin 505 and an inner sidewall of the gate spacer 560. A gate structure 660 may be formed to fill the opening.

Particularly, after a thermal oxidation process may be performed on the exposed top surface of the active fin 505 to form an interface pattern 620, a gate insulation layer and a work function control layer may be sequentially formed on the interface pattern 620, the isolation pattern 520, the gate spacer 560 and the insulation layer 610, and a gate electrode layer may be formed on the work function control layer to fill a remaining portion of the opening.

The gate insulation layer may be formed of a metal oxide having a high dielectric constant, e.g., hafnium oxide, tantalum oxide, zirconium oxide, or the like, by a CVD process, a PVD process, an ALD process, or the like. The work function control layer may be formed of a metal nitride or a metal alloy, e.g., titanium nitride, titanium aluminum, titanium aluminum nitride, tantalum nitride, tantalum aluminum nitride, etc., and the gate electrode layer may be formed of a material having a low resistance, e.g., a metal such as aluminum, copper, tantalum, etc., or a metal nitride thereof. The work function control layer and the gate electrode layer may be formed by a CVD process, a PVD process, an ALD process, or the like. In an example embodiment, a heat treatment process, e.g., a rapid thermal annealing (RTA) process, a spike rapid thermal annealing (spike RTA) process, a flash rapid thermal annealing (flash RTA) process or a laser annealing process may be further performed on the gate electrode layer.

The interface pattern 620 may be formed by a CVD process, a PVD process, an ALD process instead of the thermal oxidation process, and in this case, the interface pattern 620 may be formed not only on the top surface of the active fin 505 but also on the top surface of the isolation layer pattern 520 and the inner sidewall of the gate spacer 560.

The gate electrode layer, the work function control layer and the gate insulation layer may be planarized until the top surface of the insulation layer 610 may be exposed to form a gate insulation pattern 630 and a work function control pattern 640 sequentially stacked on the top surfaces of the interface pattern 630 and the isolation pattern 520 and the inner sidewall of the gate spacer 560, and a gate electrode 650 filling a remaining portion of the opening on the work function control pattern 640. Thus, a bottom and a sidewall of the gate electrode 650 may be covered by the work function control pattern 640. In some example embodiments, the planarization process may be performed by a CMP process and/or an etch back process.

The interface pattern 620, the gate insulation pattern 630, the work function control pattern 640 and the gate electrode 650 sequentially stacked may form the gate structure 660, and the gate structure 660 and the source/drain layer 600 may form an NMOS transistor or a PMOS transistor.

Figure 57:
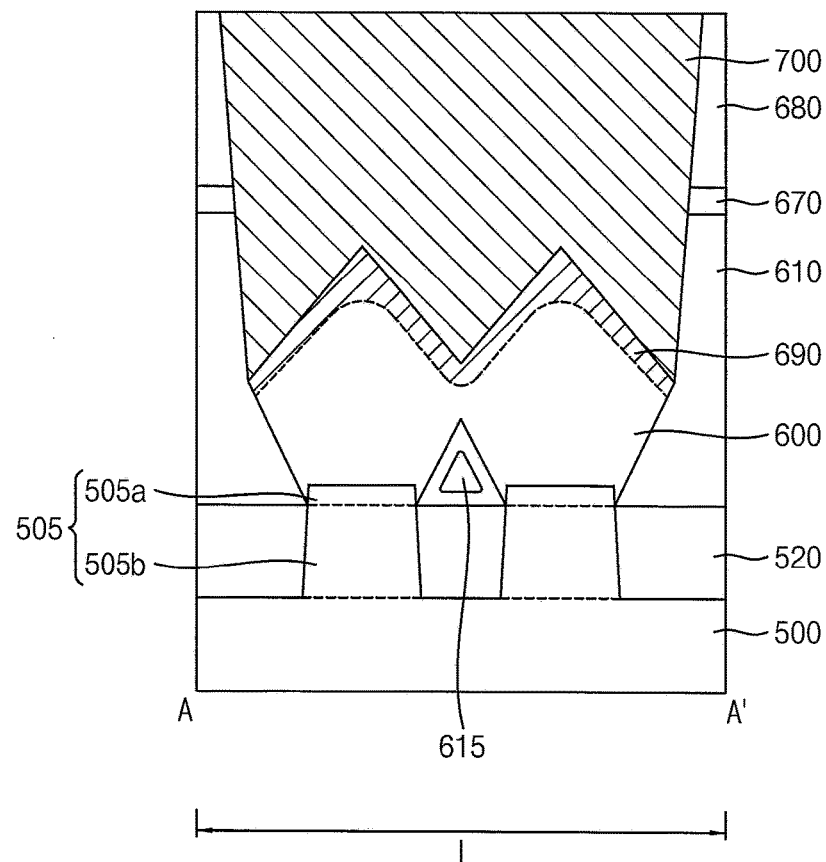
Figure 58:
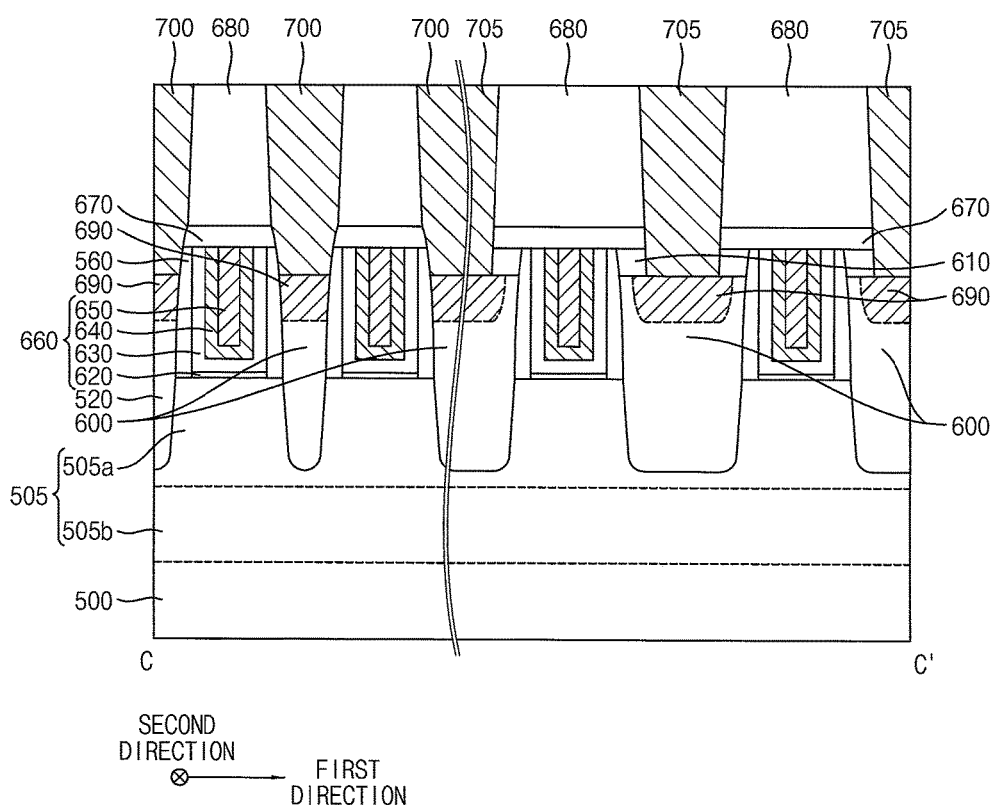

Referring to FIGS. 56 to 58, a lower capping layer 670 and a first insulating interlayer 680 may be sequentially formed on the insulation layer 610, the gate structure 660, and the gate spacer 560, and first and second contact plugs 700 and 705 may be formed through the insulation layer 610 and the first insulating interlayer 680 to contact top surfaces of the source/drain layers 600.

The first insulating interlayer 680 may be formed of a material substantially the same as or different from that of the insulation layer 610. For example, the first insulating interlayer 680 may be formed of an oxide, e.g., silicon oxide.

The first and second contact plugs 700 and 705 may be formed by forming first and second contact holes (not shown) through the insulation layer 610 and the first insulating interlayer 680 to expose the top surfaces of the source/drain layers 600, and forming a conductive layer to fill the first and second contact holes. The conductive layer may be formed of, e.g., a metal, a metal nitride, or doped polysilicon.

The first and second contact holes may be formed in the first and second regions I and II, respectively, and the first and second contact plugs 700 and 705 filling the first and second contact holes, respectively, may be also formed in the first and second regions I and II, respectively.

In some example embodiments, each of the first contact plugs 700 may be self-aligned with the gate spacer 560 on the sidewall of the gate structure 660, while each of the second contact plugs 705 may not be self-aligned with the gate spacer 560. However, the inventive concepts may not be limited thereto. The first contact plugs 700 may be disposed in the first region I at a distance from each other smaller than a distance between the second contact plugs 705 disposed in the second region II.

Metal silicide patterns 690 may be further formed on the source/drain layers 600 by forming a metal layer on the top surfaces of the source/drain layers 600 exposed by the first and second contact holes, performing a heat treatment on the metal layer, and removing an unreacted portion thereof. The metal layer may be formed of, e.g., cobalt, nickel, titanium, etc.

Figure 59:
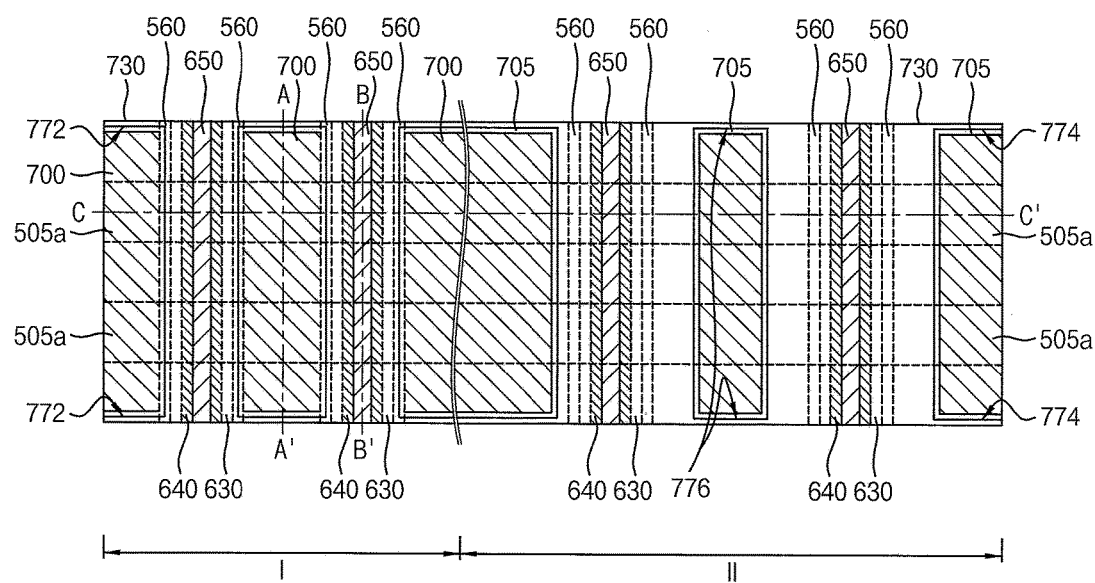
Figure 60:
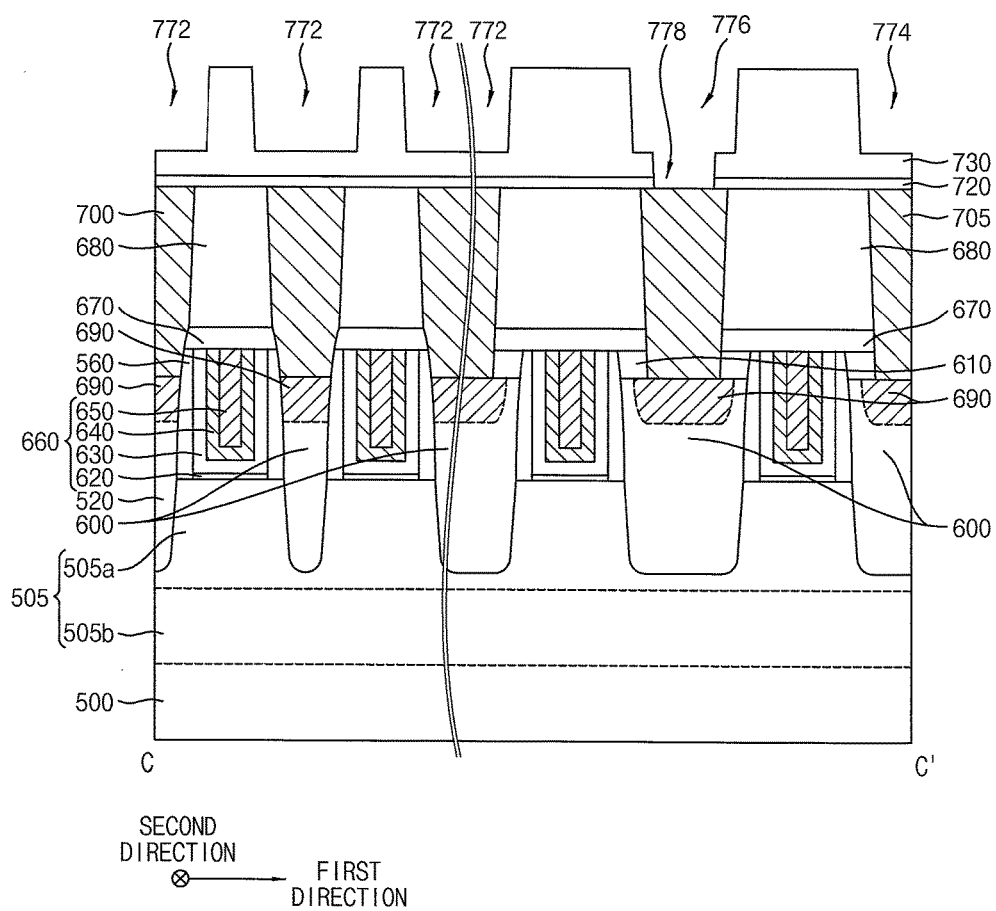

Referring to FIGS. 59 to 60, processes substantially the same as or similar to those of FIGS. 4 to 9 may be performed.

Thus, an etch stop layer 720 and the second insulating interlayer 730 may be sequentially formed on the first insulating interlayer 680 and the first and second contact plugs 700 and 705, and first to third trenches 772, 774 and 776 and a first via hole 778 may be formed on the second insulating interlayer 730.

The first via hole 778 may be in communication with the third trench 776, and may be formed through a lower portion of the second insulating interlayer 730 and the etch stop layer 720 to expose a top surface of the second contact plug 705.

Additional via holes (not shown) in communication with the first and second trenches 772 and 774, respectively, may be further formed to expose top surfaces of the first and second contact plugs 700 and 705, respectively.

Referring to FIGS. 32 to 35 again, processes substantially the same as or similar to those illustrated with reference to FIGS. 10 to 23 and FIGS. 1 to 3 may be performed to complete the semiconductor device.

The above semiconductor device and the method of manufacturing the same may be applied to various types of memory devices including wirings and methods of manufacturing the same. For example, the semiconductor device may be applied to wiring structures of logic devices such as central processing units (CPUs), main processing units (MPUs), or application processors (APs), or the like. Additionally, the semiconductor device may be applied to wirings in peripheral regions or cell regions of volatile memory devices such as dynamic random access memory (DRAM) devices or static random access memory (SRAM) devices, or wiring structures of non-volatile memory devices such as flash memory devices, phase change RAM (PRAM) devices, magnetic RAM (MRAM) devices, resistive RAM (RRAM) devices, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   a plurality of wiring structures spaced apart from each other;
   a protection pattern on each of the wiring structures, the protection pattern including a metal nitride;
   a spacer contacting a sidewall of the protection pattern, wherein a top surface of the spacer is higher than a bottom surface of the protection pattern; and
   an insulating interlayer structure containing the wiring structures, the insulating interlayer structure having an air gap between the wiring structures.

2. The semiconductor device of claim 1, wherein the protection pattern includes aluminum nitride or nitride of a noble metal.

3. The semiconductor device of claim 1, wherein the spacer includes silicon nitride.

4. The semiconductor device of claim 1, further comprising:
   an insulating barrier layer covering upper surfaces of the protection pattern and the spacer and surrounding sidewalls of the wiring structures.

5. The semiconductor device of claim 4, wherein the insulating barrier layer defines a bottom and a sidewall of the air gap.

6. The semiconductor device of claim 4, wherein the insulating interlayer structure includes first and second insulating interlayers sequentially stacked, and the insulating barrier layer is formed between the first and second insulating interlayers.

7. The semiconductor device of claim 6, wherein the first insulating interlayer covers at least a sidewall of each of the wiring structures.

8. The semiconductor device of claim 1, further comprising:
   a capping pattern on an upper surface of each of the wiring structures, the capping pattern preventing electromigration of a metal in each of the wiring structures, wherein the protection pattern covers an upper surface and a sidewall of the capping pattern.

9. The semiconductor device of claim 8, wherein the capping pattern comprises any one of cobalt (Co), ruthenium (Ru), tungsten (W) and cobalt tungsten phosphorus (CoWP).

10. The semiconductor device of claim 8, wherein each of the wiring structures includes:
 a metal pattern; and
 a conductive barrier pattern covering a bottom and a sidewall of the metal pattern,
 wherein the capping pattern is formed on an upper surface of the metal pattern.

11. The semiconductor device of claim 10, wherein the upper surface of the metal pattern and a top surface of the conductive barrier pattern is substantially coplanar with each other,
 and wherein the protection pattern covers the top surface of the conductive barrier pattern.

12. The semiconductor device of claim 10, wherein a bottom surface of the spacer is substantially coplanar with the bottom surface of the protection pattern.

13. A semiconductor device, comprising:
 a plurality of wiring structures spaced apart from each other;
 a protection pattern on each of the wiring structures, the protection pattern including a metal nitride;
 a spacer on a sidewall of the protection pattern, wherein a top surface of the spacer is higher than a bottom surface of the protection pattern; and
 a first insulating interlayer covering a lower surface and a sidewall of each of the wiring structures,
 wherein the spacer directly contacts a top surface of the first insulating interlayer.

14. The semiconductor device of claim 13, wherein each of the wiring structures extends in a first direction, and the wiring structures are spaced apart from each other in a second direction substantially perpendicular to the first direction,
 and wherein the protection pattern is disposed on only one of opposite top edge surfaces of each of the wiring structures in the second direction.

15. The semiconductor device of claim 13, further comprising a second insulating interlayer on the first insulating interlayer,
 wherein the first and second insulating interlayers form an insulating interlayer structure containing the wiring structures, the insulating interlayer structure having an air gap between the wiring structures.

16. The semiconductor device of claim 13, wherein the spacer covers the sidewall of the protection pattern.

17. A semiconductor device, comprising:
 a plurality of lower wiring structures on a substrate;
 a lower insulating interlayer structure containing the lower wiring structures, the lower insulating interlayer structure having an air gap between the lower wiring structures;
 a protection pattern on each of the lower wiring structures, the protection pattern including a metal nitride;
 a spacer contacting a sidewall of the protection pattern, wherein a top surface of the spacer is higher than a bottom surface of the protection pattern; and
 a landing via through a portion of the lower insulating interlayer structure, the landing via being electrically connected to a first lower wiring structure of the plurality of lower wiring structures,
 wherein the landing via penetrates through the protection pattern on the first lower wiring structure, and contacts an upper surface of the first lower wiring structure.

18. The semiconductor device of claim 17, further comprising:
 a capping pattern on an upper surface of each of the lower wiring structures, the capping pattern preventing electromigration of a metal in each of the lower wiring structures,
 wherein the protection pattern covers an upper surface and a sidewall of the capping pattern,
 and wherein the landing via penetrates through the capping pattern on the first lower wiring structure.

19. The semiconductor device of claim 17, further comprising:
 an upper insulating layer on the lower insulating interlayer structure; and
 an upper wiring in the upper insulating layer,
 wherein the landing via contacts a bottom of the upper wiring.

20. The semiconductor device of claim 17, wherein the landing via contacts the spacer adjacent the first lower wiring structure.

* * * * *